(12) United States Patent
Kondo

(10) Patent No.: US 10,468,853 B2
(45) Date of Patent: Nov. 5, 2019

(54) LIGHT EMITTING COMPONENT, PRINT HEAD, IMAGE FORMING APPARATUS AND SEMICONDUCTOR LAYER LAMINATE SUBSTRATE

(71) Applicant: FUJI XEROX CO., LTD., Tokyo (JP)

(72) Inventor: Takashi Kondo, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/079,342

(22) PCT Filed: Apr. 24, 2017

(86) PCT No.: PCT/JP2017/016234
§ 371 (c)(1),
(2) Date: Aug. 23, 2018

(87) PCT Pub. No.: WO2018/003259
PCT Pub. Date: Jan. 4, 2018

(65) Prior Publication Data
US 2019/0052061 A1    Feb. 14, 2019

(30) Foreign Application Priority Data

Jun. 30, 2016  (JP) .................. 2016-129757

(51) Int. Cl.
*G03G 15/04* (2006.01)
*H01S 5/22* (2006.01)
(Continued)

(52) U.S. Cl.
CPC ............. *H01S 5/2206* (2013.01); *B41J 2/447* (2013.01); *G03G 15/04054* (2013.01);
(Continued)

(58) Field of Classification Search
CPC ........ G03G 15/04054; G03G 15/04072; H01L 33/04; H01L 25/073; H01S 5/025; H01S 5/2206; H01S 5/42
See application file for complete search history.

(56) References Cited

U.S. PATENT DOCUMENTS

| | | | |
|---|---|---|---|
| 5,451,977 A | 9/1995 | Kusuda et al. | |
| 5,814,841 A | 9/1998 | Kusuda et al. | |

(Continued)

FOREIGN PATENT DOCUMENTS

| | | | |
|---|---|---|---|
| JP | H01-238962 A | 9/1989 | |
| JP | H07-106689 A | 4/1995 | |

(Continued)

OTHER PUBLICATIONS

Machine translation of JP-07106689A (Year: 1995).*

(Continued)

*Primary Examiner* — David J Bolduc
(74) *Attorney, Agent, or Firm* — Oliff PLC

(57) ABSTRACT

A light emitting chip including: a substrate that is provided with a first semiconductor laminate part, a tunnel junction layer or a metallic electrically conductive group III-V compound layer, and a second semiconductor layer. The first semiconductor laminate part includes light emitting elements. The tunnel junction layer or the metallic electrically conductive group III-V compound layer is provided on the first semiconductor laminate part. The second semiconductor layer is provided on the tunnel junction layer or the group III-V compound layer, and includes a driving portion. The driving portion includes setting thyristors and drives the light emitting elements to make the light emitting elements be able to shift to an ON state sequentially.

10 Claims, 33 Drawing Sheets

(51) Int. Cl.
  *B41J 2/447* (2006.01)
  *H01L 33/04* (2010.01)
  *H01L 33/08* (2010.01)
  *H01L 33/14* (2010.01)
  *H01S 5/026* (2006.01)
  *H01S 5/42* (2006.01)
  *H01L 25/075* (2006.01)
  *H01S 5/183* (2006.01)
  *B41J 2/455* (2006.01)

(52) U.S. Cl.
  CPC ... *G03G 15/04072* (2013.01); *H01L 25/0753* (2013.01); *H01L 33/04* (2013.01); *H01L 33/08* (2013.01); *H01L 33/14* (2013.01); *H01S 5/026* (2013.01); *H01S 5/0261* (2013.01); *H01S 5/183* (2013.01); *H01S 5/42* (2013.01); *B41J 2/455* (2013.01)

(56) References Cited

U.S. PATENT DOCUMENTS

| | | | |
|---|---|---|---|
| 2009/0297223 A1 | 12/2009 | Suzuki | |
| 2011/0164103 A1* | 7/2011 | Kii | B41J 2/45 347/118 |
| 2012/0249712 A1* | 10/2012 | Ohno | B41J 2/45 347/118 |
| 2013/0240832 A1* | 9/2013 | Hersee | H01L 27/15 257/13 |
| 2015/0077497 A1* | 3/2015 | Fukunaga | H01L 33/507 347/130 |
| 2015/0099317 A1* | 4/2015 | Hayakawa | H01S 5/02476 438/27 |
| 2017/0219952 A1* | 8/2017 | Furuta | G03G 15/04036 |
| 2017/0277065 A1* | 9/2017 | Kondo | G03G 15/04054 |
| 2018/0006432 A1* | 1/2018 | Kondo | H01S 5/042 |
| 2018/0062041 A1* | 3/2018 | Nakanishi | G03G 15/04045 |
| 2018/0234584 A1* | 8/2018 | Kondo | H01L 27/15 |

FOREIGN PATENT DOCUMENTS

| | | |
|---|---|---|
| JP | 2001-308385 A | 11/2001 |
| JP | 2009-286048 A | 12/2009 |
| JP | 2014-086558 A | 5/2014 |
| JP | 2016-051815 A | 4/2016 |

OTHER PUBLICATIONS

Jul. 18, 2017 International Search Report issued in International Patent Application No. PCT/JP2017/016234.

Jul. 18, 2017 Written Opinion of the International Searching Authority issued in International Patent Application No. PCT/JP2017/016234.

Jul. 29, 2019 Search Report issued in European Patent Application No. 17819626.7.

Ohno, Seiji et al., "Integrated Self-Scanning Light-Emitting Device (SLED)," IEEE Transactions on Electronic Devices, vol. 40, No. 12, pp. 2216-2221, Dec. 1, 1993.

Adachi, H. et al., "A Surface Emitting Laser with a Common-Anode Configuration for Application to the Photonic Parallel Memory," Japan Society of Applied Physics, pp. 1029-1031, Aug. 29, 1993.

* cited by examiner

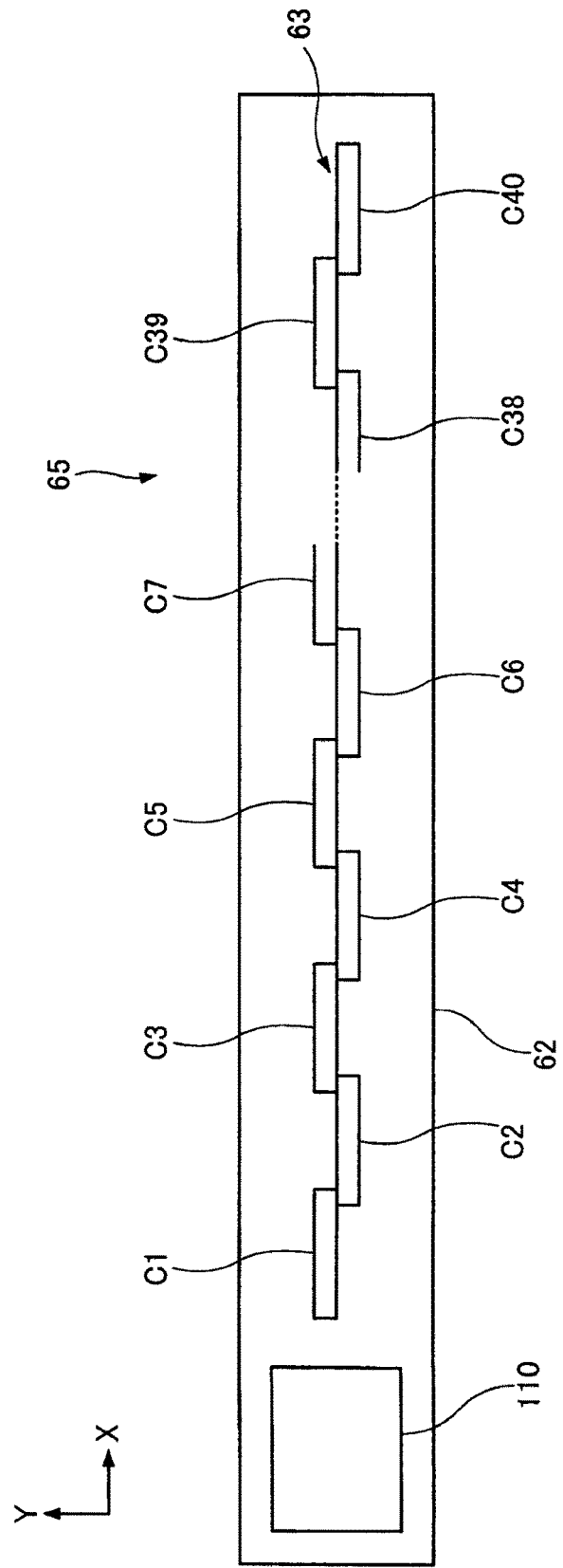

LIGHT EMITTING COMPONENT, PRINT HEAD, IMAGE FORMING APPARATUS AND SEMICONDUCTOR LAYER LAMINATE SUBSTRATE

TECHNICAL FIELD

The present invention relates to a light emitting component, a print head, an image forming apparatus and a semiconductor layer laminate substrate.

BACKGROUND ART

The following light emitting array has been described in Patent Document 1. That is, in the light emitting array, a large number of light emitting elements in each of which a threshold voltage or a threshold current can be controlled from the outside are arranged one-dimensionally, two-dimensionally or three-dimensionally, adjacent ones of electrodes controlling the threshold voltages or the threshold currents of the light emitting elements respectively are connected to each other by an electric unit, and a clock line through which a voltage or a current is applied from the outside is connected to each of the light emitting elements.

The following self-scanning light source head has been described in Patent Document 2. That is, the self-scanning light source head is provided with a substrate, surface emitting type semiconductor lasers and thyristors. The surface emitting type semiconductor lasers are arranged in an array on the substrate. The thyristors serve as switching elements that are arranged on the substrate to selectively turn ON/OFF light emission of the surface emitting type semiconductor lasers.

The following self-scanning light emitting device has been described in Patent Document 3. That is, in the self-scanning light emitting device, light emitting elements each having a pnpnpn six-layer semiconductor structure are configured. Electrodes are provided on a p-type first layer and an n-type sixth layer on opposite sides of each of the light emitting elements, and on a p-type third layer and an n-type fourth layer in the center of the light emitting element. The pn layers are made to carry out a light emitting diode function, and the pnpn four layers are made to carry out a thyristor function.

CITATION LIST

Patent Literature

Patent Document 1: JP-A-1-238962
Patent Document 2: JP-A-2009-286048
Patent Document 3: JP-A-2001-308385

SUMMARY OF INVENTION

Problem to be Solved by the Invention

For example, when light emitting elements of a light emitting portion in a self-scanning light emitting device provided with the light emitting portion and a driving portion are formed from the same semiconductor multilayer film as that of elements used for driving of the driving portion, it is difficult to independently set light emission characteristics of the light emitting elements and driving characteristics of the elements used for driving. Therefore, it is conceived that the elements used for driving and the light emitting elements of the light emitting portion are laminated so that the characteristics of the light emitting elements and the characteristics of the elements used for driving can be set independently. When the light emitting elements are laminated on the elements used for driving, there is however a fear that the characteristics of the light emitting elements are degraded due to crystal defects etc. generated during growth of a semiconductor layer.

To solve this problem, an object of at least one exemplary embodiment of the present invention is to provide a light emitting component etc. in which degradation in characteristic of a light emitting element or each of light emitting elements is suppressed in comparison with a case where used is a substrate in which a semiconductor laminate part constituting a light emitting element or light emitting elements is grown on a semiconductor laminate part constituting an element or elements used for driving.

Means for Solving the Problem

[1] At least one exemplary embodiment of the present invention is
  a light emitting component comprising:
  a first semiconductor laminate part that includes light emitting elements;
  a tunnel junction layer or a metallic electrically conductive group III-V compound layer that is provided on the first semiconductor laminate part; and
  a second semiconductor laminate part that is provided on the tunnel junction layer or the group III-V compound layer, and that includes a driving portion including thyristors and driving the light emitting elements to make the light emitting elements be able to shift to an ON state sequentially.

[2] Other exemplary embodiment of the present invention is
  a light emitting component comprising:
  a first substrate including a first semiconductor laminate part, a tunnel junction layer or a metallic electrically conductive group III-V compound layer, and a second semiconductor laminate part, the first semiconductor laminate part including light emitting elements, the tunnel junction layer or the metallic electrically conductive group III-V compound layer being provided below the first semiconductor laminate part, the second semiconductor laminate part being provided below the tunnel junction layer or the group III-V compound layer and including a driving portion, the driving portion including thyristors and driving the light emitting elements to make the light emitting elements be able to shift to an ON state sequentially; and
  a transfer substrate that is provided below the second semiconductor laminate part.

[3] In the light emitting component described in [1] or [2], the second semiconductor laminate part may include a voltage reducing layer whose band gap energy is smaller than band gap energy of a semiconductor layer constituting the first semiconductor laminate part.

[4] In the light emitting component of any one of [1] to [3], each of current paths of the light emitting elements may be narrowed.

[5] Other exemplary embodiment of the present invention is
  a print head comprising:
  a light emitting portion comprising a substrate that comprises a first semiconductor laminate part, a tunnel junction layer or a metallic electrically conductive group III-V compound layer, and a second semiconductor laminate part, the first semiconductor laminate part including light emitting elements, the tunnel junction layer or the metallic electrically conductive group III-V compound layer being provided on the first semiconductor laminate part, the second semiconductor laminate part being provided on the tunnel junction layer or the group III-V compound layer and including a driving portion, the driving portion including thyristors and driving the light emitting elements to make the light emitting elements be able to shift to an ON state sequentially; and an optical portion that forms an image of light emitted from the light emitting portion.

[6] Other exemplary embodiment of the present invention is an image forming apparatus comprising:

an image carrier;

a charging portion that charges the image carrier with electricity;

a light emitting portion including a first semiconductor laminate part, a tunnel junction layer or a metallic electrically conductive group III-V compound layer, and a second semiconductor laminate part, the first semiconductor laminate part including light emitting elements, the tunnel junction layer or the metallic electrically conductive group III-V compound layer being provided on the first semiconductor laminate part, the second semiconductor laminate part being provided on the tunnel junction layer or the group III-V compound layer and including a driving portion, the driving portion including thyristors and driving the light emitting elements to make the light emitting elements be able to shift to an ON state sequentially;

an optical portion that forms an image of light emitted from the light emitting portion;

a light exposing portion that exposes the image carrier to light through the optical portion;

a developing portion that develops an electrostatic latent image formed on the image carrier exposed to the light by the light exposing portion; and a transfer portion that transfers the image developed on the image carrier onto a subject to be transferred.

[7] Other exemplary embodiment of the present invention is a light emitting component comprising:

a first semiconductor laminate part that includes a light emitting element;

a tunnel junction layer or a metallic electrically conductive group III-V compound layer that is provided on the first semiconductor laminate part; and a second semiconductor laminate part that is provided on the tunnel junction layer or the group III-V compound layer and that includes a thyristor.

[8] Other exemplary embodiment of the present invention is a light emitting component comprising:

a first substrate that includes a first semiconductor laminate part, a tunnel junction layer or a metallic electrically conductive group III-V compound layer, and a second semiconductor laminate part, the first semiconductor laminate part including a light emitting element, the tunnel junction layer or the metallic electrically conductive group III-V compound layer being provided below the first semiconductor laminate part, the second semiconductor laminate part being provided below the tunnel junction layer or the group III-V compound layer and including a thyristor; and a transfer substrate that is provided below the second semiconductor laminate part.

[9] In the light emitting component described in [7] or [8], the second semiconductor laminate part may include a voltage reducing layer whose band gap energy is smaller than band gap energy of a semiconductor layer constituting the first semiconductor laminate part.

[10] In the light emitting components described in [7] to [9] a current path of the light emitting element may be narrowed.

[11] Other exemplary embodiment of the present invention is a semiconductor laminate substrate comprising:

a substrate;

a first semiconductor laminate part that is provided on the substrate and is to be processed into a light emitting element;

a tunnel junction layer or a metallic electrically conductive group III-V compound layer that is provided on the first semiconductor laminate part; and a second semiconductor laminate part that is provided on the tunnel junction layer or the metallic electrically conductive group III-V compound layer and is to be processed into a driving portion, the driving portion including a thyristor and driving the light emitting portion.

[12] In the semiconductor laminate substrate described in [11], the second semiconductor laminate part includes a voltage reducing layer whose band gap energy is smaller than band gap energy of a semiconductor layer constituting the first semiconductor laminate part.

[13] Other exemplary embodiment of the present invention is a manufacturing method of a light emitting component, comprising:

forming a first semiconductor laminate part that includes light emitting elements;

forming a tunnel junction layer or a metallic electrically conductive group III-V compound layer on the first semiconductor laminate part; and growing a second semiconductor laminate part on the tunnel junction layer or the group III-V compound layer, the second semiconductor laminate part including a driving portion that includes a thyristor and that drives the light emitting elements to make the light emitting elements be able to shift to an ON state sequentially.

[14] Other exemplary embodiment of the present invention is a manufacturing method of a light emitting component, comprising:

forming a first semiconductor laminate part that includes light emitting elements, forming a tunnel junction layer or a metallic electrically conductive group III-V compound layer on the first semiconductor laminate part, and forming a second semiconductor laminate part on the tunnel junction layer or the group III-V compound layer, to consequently form a first substrate, the second semiconductor laminate part including a driving portion that includes a thyristor and that drives the light emitting elements to make the light emitting elements be able to shift to an ON state sequentially; and transferring the first substrate onto a transfer substrate so that the second semiconductor laminate part, the tunnel junction layer or the group III-V compound layer, and the first semiconductor laminate part are laminated in this order on the transfer substrate.

Effect of the Invention

According to the light emitting component described in [1] or [2], degradation in characteristic of each of the light emitting elements can be suppressed, in comparison with a case where used is a substrate in which a semiconductor laminate part constituting light emitting elements is grown on a tunnel junction layer or a metallic electrically conductive group III-V compound layer.

According to the light emitting component described in [3], an absolute value of a driving voltage can be reduced, in comparison with a case where the voltage reducing layer is not provided.

According to the light emitting component described in [4], power consumption can be reduced, in comparison with a case where each of the current paths is not narrowed.

According to the print head described in [5], performance of the print head is improved, in comparison with a case where used is a substrate in which a semiconductor laminate part constituting light emitting elements is grown on a semiconductor laminate part constituting elements used for driving.

According to the image forming apparatus described in [6], performance of the image forming apparatus is improved, in comparison with a case where used is a substrate in which a semiconductor laminate part constituting light emitting elements is grown on a semiconductor laminate part constituting elements used for driving.

According to the light emitting component described in [7] or [8], degradation in characteristic of the light emitting element can be suppressed, in comparison with a case where used is a substrate in which a semiconductor laminate part constituting a light emitting element is grown on a tunnel junction layer or a metallic electrically conductive group III-V compound layer.

According to the light emitting component described in [9], an absolute value of a driving voltage can be reduced, in comparison with a case where the voltage reducing layer is not provided.

According to the light emitting component described in [10], power consumption can be reduced, in comparison with a case where the current path is not narrowed.

According to the semiconductor laminate substrate described in [11], generation of defects in the first semiconductor laminate part can be suppressed, in comparison with a case where a first semiconductor laminate part is grown on a tunnel junction layer or a metallic electrically conductive group III-V compound layer.

According to the semiconductor laminate substrate described in [12], an absolute value of a driving voltage of the processed thyristor can be reduced, in comparison with a case where the voltage reducing layer is not provided.

According to the manufacturing method of the light emitting component described in [13] or [14], degradation in characteristic of each of the light emitting elements can suppressed, in comparison with a case where used is a substrate in which a semiconductor laminate part constituting light emitting elements is grown on a tunnel junction layer or a metallic electrically conductive group III-V compound layer.

BRIEF DESCRIPTION OF DRAWINGS

FIG. 3 A top view of an example of a light emitting device.

DESCRIPTION OF EXEMPLARY EMBODIMENTS

Exemplary embodiments of the present invention will be described below in detail with reference to the accompanying drawings.

Incidentally, symbols such as Al for aluminum will be used to denote elements below.

First Exemplary Embodiment

Here, description will be made on the assumption that a light emitting chip C as an example of a light emitting component is applied to an image forming apparatus 1 by way of example.

(Image Forming Apparatus 1)

Figure 1:
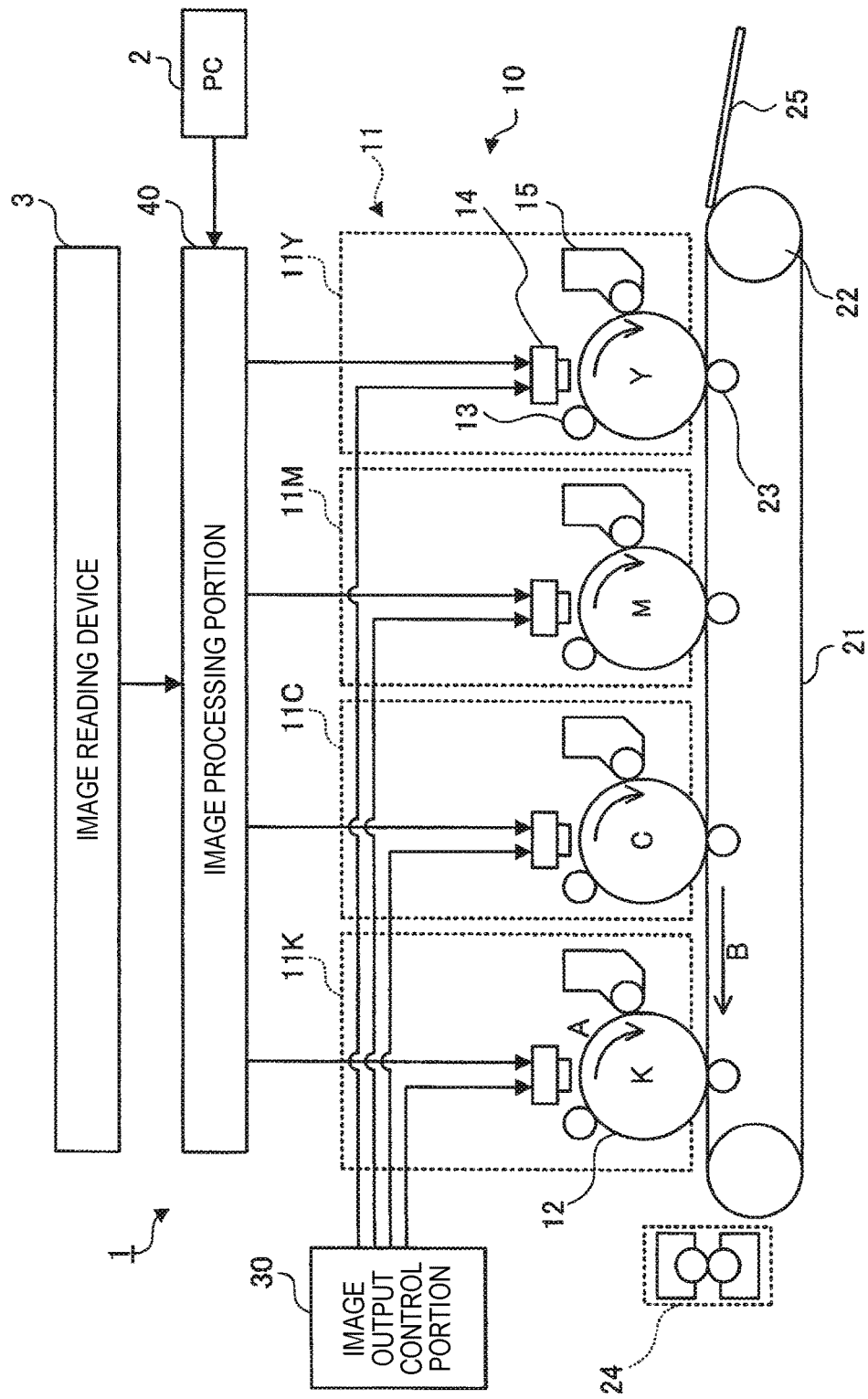
FIG. 1 A view showing an example of an overall configuration of an image forming apparatus to which a first exemplary embodiment is applied.

FIG. 1 is a view showing an example of an overall configuration of the image forming apparatus 1 to which the first exemplary embodiment is applied. The image forming apparatus 1 shown in FIG. 1 is a generally called tandem type image forming apparatus. The image forming apparatus 1 is provided with an image forming process portion 10, an image output control portion 30, and an image processing portion 40. The image forming process portion 10 forms images correspondingly to image data of respective colors. The image output control portion 30 controls the image forming process portion 10. The image processing portion 40 is connected, for example, to a personal computer (PC) 2 and an image reading device 3 to perform predetermined image processing on image data which have been received from any of the personal computer (PC) 2 and the image reading device 3.

The image forming process portion 10 is provided with image forming units 11Y, 11M, 11C and 11K (that will be denoted as image forming units 11 simply when they are not discriminated from one another) that are disposed in parallel at predetermined intervals. Each of the image forming units 11 is provided with a photosensitive drum 12, a charging device 13, a print head 14, and a developing device 15. The photosensitive drum 12 serves as an example of an image carrier that forms an electrostatic latent image to carry a toner image. The charging device 13 serves as an example of a charging portion which charges a front surface of the photosensitive drum 12 with a predetermined potential. The print head 14 exposes the photosensitive drum 12 that has been charged with electricity by the charging device 13, to light. The developing device 15 serves as an example of a developing portion that develops the electrostatic latent image obtained by the print head 14. The image forming units 11Y, 11M, 11C and 11K form yellow (Y), magenta (M), cyan (C) and black (K) toner images respectively.

In addition, the image forming process portion 10 is provided with a paper feeding belt 21, a driving roll 22, transfer rolls 23 and a fixing device 24. The paper feeding belt 21 feeds a recording paper sheet 25 that serves as an example of a subject to be transferred. The driving roll 22 drives the paper feeding belt 21. The transfer rolls 23 serve as an example of transfer portions that transfer the toner images of the photosensitive drums 12 onto the recording paper sheet 25. The fixing device 24 fixes the toner images on the recording paper sheet 25. Thus, the respective color toner images that have been formed on the photosensitive drums 12 of the image forming units 11Y, 11M, 11C and 11K can be multiply transferred onto the recording paper sheet 25.

In the image forming apparatus 1, the image forming process portion 10 performs an image forming operation based on various control signals supplied from the image output control portion 30. Under the control of the image output control portion 30, the image data that have been received from the personal computer (PC) 2 or the image reading device 3 are processed into images by the image processing portion 40 and the processed images are supplied to the image forming units 11. For example, in the black (K) color image forming unit 11K, the photosensitive drum 12 is charged with the predetermined potential by the charging device 13 while rotating in a direction of an arrow A. Then, the photosensitive drum 12 is exposed to light by the print head 14 that emits light based on the image data supplied from the image processing portion 40. Thus, an electrostatic latent image about a black (K) color image is formed on the photosensitive drum 12. The electrostatic latent image formed on the photosensitive drum 12 is developed by the developing device 15 so that a black (K) color toner image is formed on the photosensitive drum 12. Also in the image forming units 11Y, 11M and 11C, yellow (Y), magenta (M) and cyan (C) color toner images are formed respectively.

The color toner images formed on the photosensitive drums 12 by the image forming units 11 respectively are sequentially electrostatically transferred onto the recording paper sheet 25 by transfer electric fields applied to the transfer rolls 23. The recording sheet 25 is supplied due to movement of the paper feeding belt 21 moving in a direction of an arrow B. As a result, a composite toner image in which the respective color toners are superimposed on one another is formed on the recording paper sheet 25.

Then, the recording paper sheet 25 onto which the composite toner image has been electrostatically transferred is fed to the fixing device 24. The composite toner image on the recording paper sheet 25 that has been fed to the fixing device 24 is subjected to fixation processing by heat and pressure and fixed on the recording paper sheet 25 by the fixing device 24, and then discharged from the image forming apparatus 1.

(Print Head 14)

Figure 2:
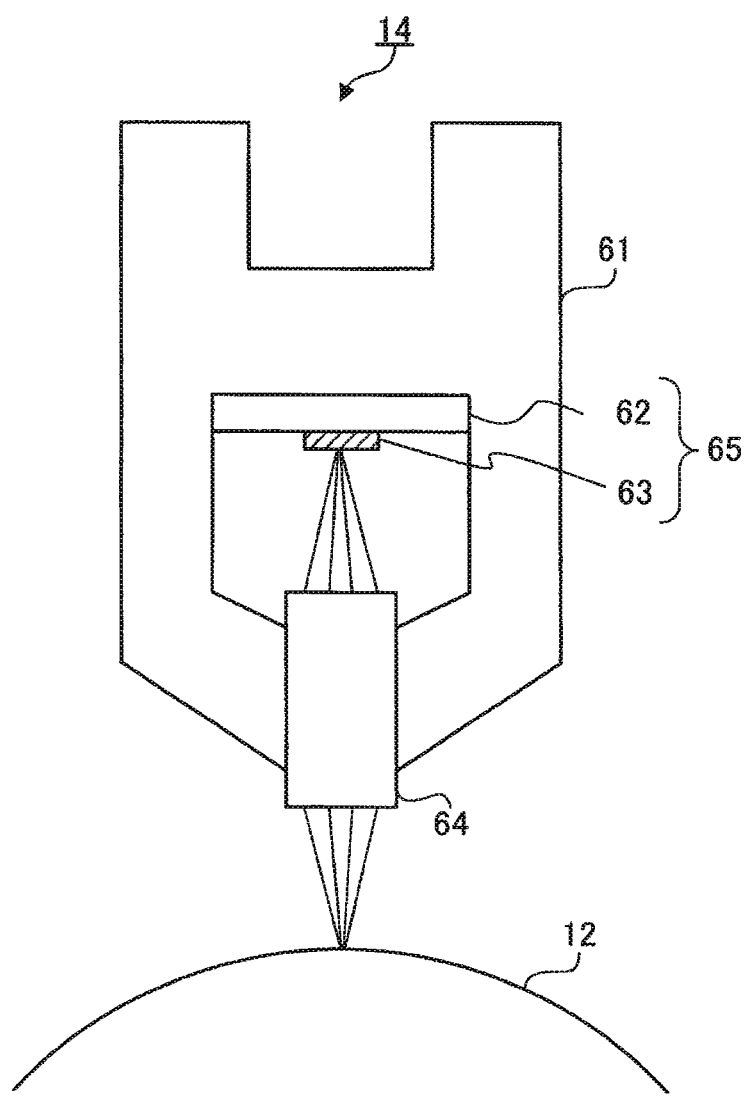
FIG. 2 A sectional view showing an example of a configuration of a print head.

FIG. 2 is a sectional view showing an example of the configuration of the print head 14. The print head 14 serving as an example of a light exposing portion is provided with a housing 61, a light emitting device 65 and a rod lens array 64. The light emitting device 65 serves as an example of a light emitting portion that is provided with a light source portion 63 including light emitting elements (the light emitting elements are light emitting diodes LED in the first exemplary embodiment) exposing the photosensitive drum 12 to light. The rod lens array 64 serves as an example of an optical portion that forms an image of light emitted from the light source portion 63 onto the front surface of the photosensitive drum 12.

The light emitting device 65 is provided with the aforementioned light source portion 63, and a circuit substrate 62. The circuit substrate 62 is mounted with a signal generating circuit 110 (see FIG. 3 that will be described below) that drives the light source portion 63.

The housing 61 is formed, for example, out of metal. The housing 61 supports the circuit substrate 62 and the rod lens array 64 so that light emission surfaces of the light emitting elements of the light source portion 63 are set on a focal plane of the rod lens array 64. In addition, the rod lens array 64 is disposed along an axial direction (that is a main scanning direction and an X direction in FIG. 3 and FIG. 4B that will be described below) of the photosensitive drum 12.

(Light Emitting Device 65)

FIG. 3 is a top view of an example of the light emitting device 65.

In the light emitting device 65 shown as an example in FIG. 3, the light source portion 63 has a configuration in which light emitting chips C1 to C40 (that will be denoted as light emitting chips C simply when they are not discriminated from one another) serving as an example of forty light emitting components are disposed zigzag in two rows in the X direction that is the main scanning direction on the circuit substrate 62. The light emitting chips C1 to C40 may have the same configuration as one another.

In the description of the present invention, the word "to" indicates, of a plurality of constituent members discriminated from one another by number, constituent members corresponding to numbers before and after "to" and constituent members corresponding to numbers between the numbers before and after "to" are included. For example, the light emitting chips C1 to C40 include light emitting chips sequentially numbered from C1 to C40.

Incidentally, in the first exemplary embodiment, forty as the total number of light emitting chips C is used. However, the invention is not limited thereto.

The light emitting device 65 is mounted with the signal generating circuit 110 that drives the light source portion 63.

The signal generating circuit 110 is constituted, for example, by an integrated circuit (IC) etc. Incidentally, the light emitting device 65 may not be mounted with the signal generating circuit 110. On this occasion, the signal generating circuit 110 is provided outside the light emitting device 65, and supplies a control signal etc. for controlling the light emitting chips C through a cable etc. Description will be made here on the assumption that the light emitting device 65 is provided with the signal generating circuit 110.

Details about the arrangement of the light emitting chips C will be described later.

Figure 4A:
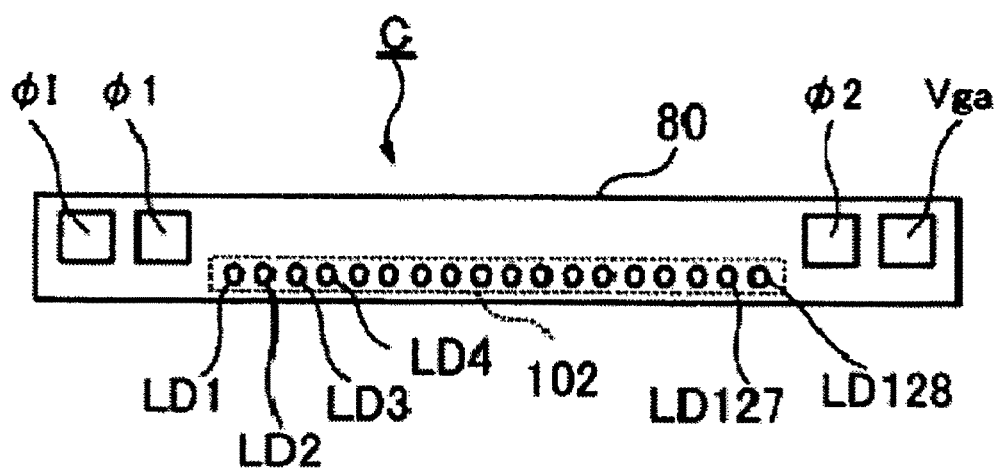
FIG. 4A A view showing a configuration of a light emitting chip.
Figure 4B:
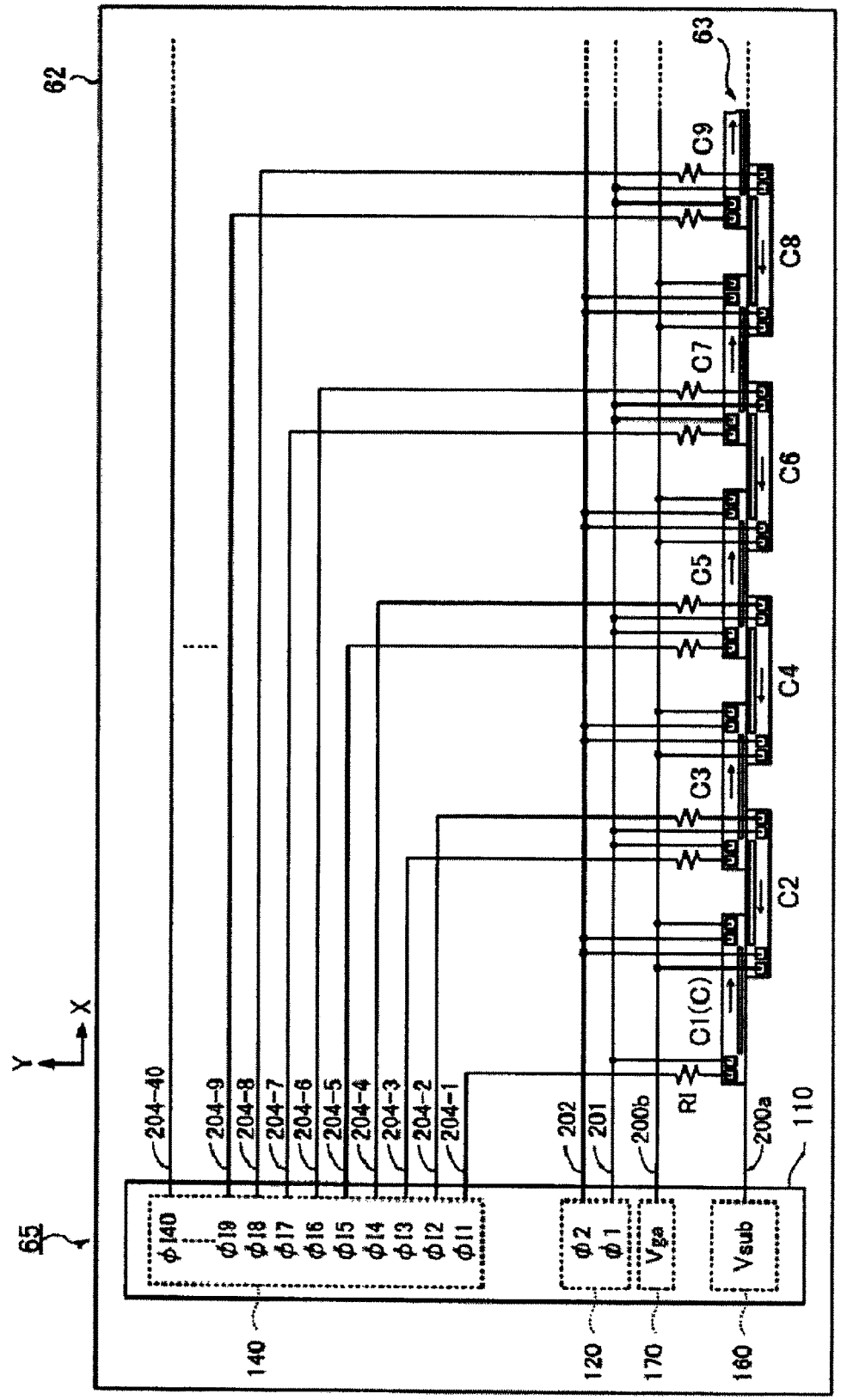
FIG. 4B A diagram showing an example of a configuration of a signal generating circuit of the light emitting device and a configuration of wirings (lines) on a circuit substrate.

FIG. 4A shows the configuration of each of the light emitting chips C. FIG. 4B shows an example of the configuration of the signal generating portion 110 of the light emitting device 65 and the configuration of wirings (lines) on the circuit substrate 62. Incidentally, of the light emitting chips C1 to C40, the light emitting chips C1 to C9 are shown in FIG. 4B.

First, the configuration of the light emitting chip C shown in FIG. 4A will be described.

The light emitting chip C includes a light emitting portion 102 provided on a front surface of a substrate 80. The front surface of the substrate is shaped like a rectangle. The light emitting portion 102 is configured to include light emitting elements (that correspond to laser diodes LD1 to LD128 in the first exemplary embodiment) (that will be denoted as laser diodes LD simply when they are not discriminated from one another) provided more closely to one of long sides of the rectangle and like a row extending along the long side. Further, the light emitting chip C includes terminals (a φ1 terminal, a φ2 terminal, a Vga terminal, a φI terminal) provided on longitudinally opposite end portions of the front surface of the substrate 80. The terminals are bonding pads for importing the various control signals etc. Incidentally, the terminals are provided so that the φI terminal and the φ1 terminal are arranged in order from one of the opposite ends portions of the substrate 80 and the Vga terminal and the φ2 terminal are arranged in order from the other end portion of the substrate 80. The light emitting portion 102 is provided between the φ1 terminal and the φ2 terminal. Further, a back electrode 91 (see FIG. 6B that will be described later) is provided as a Vsub terminal on a back surface of the substrate 80.

Here, the laser diodes LD are an example of light emitting elements (elements used for light emission).

Incidentally, the phrase "like a row" is not limited to a case where the light emitting elements are disposed linearly as shown in FIG. 4A but may include a state in which the light emitting elements are disposed with an amount of displacement from one another in a perpendicular direction to the row direction. For example, the light emitting elements may be disposed with the amount of displacement from one another in the perpendicular direction to the row direction. In addition, the light emitting elements may be disposed zigzag so that adjacent ones of the light emitting elements are displaced from each other or adjacent ones of groups each including a plurality of the light emitting elements are displaced from each other.

Next, the configuration of the signal generating circuit 110 of the light emitting device 65 and the configuration of the wirings (lines) on the circuit substrate 62 will be described with reference to FIG. 4B.

On the circuit substrate 62 of the light emitting device 65, the signal generating circuit 110 and the light emitting chips C1 to C40 are mounted, and the wirings (lines) through which the signal generating circuit 110 is connected with the light emitting chips C1 to C40 are provided, as described above.

First, the configuration of the signal generating circuit 110 will be described.

The image data which have been processed into an image and the various control signals are inputted from the image output control portion 30 and the image processing portion 40 (see FIG. 1) to the signal generating circuit 110. Based on the image data and the various control signals, the signal generating circuit 110 performs rearrangement of the image data, correction of a light quantity etc.

The signal generating circuit 110 includes a transfer signal generating portion 120 that transmits a first transfer signal $\phi 1$ and a second transfer signal $\phi 2$ to the light emitting chips C1 to C40 based on the various control signals.

In addition, the signal generating circuit 110 includes a lighting signal generating portion 140 that transmits lighting signals $\phi I1$ to $\phi I40$ (that will be denoted as lighting signals $\phi I$ simply when they are not discriminated from one another) to the light emitting chips C1 to C40 respectively based on the various control signals.

Further, the signal generating circuit 110 is provided with a reference potential supplying portion 160 and a power supply potential supplying portion 170. The reference potential supplying portion 160 supplies a reference potential Vsub as a reference of a potential to the light emitting chips C1 to C40. The power supply potential supplying portion 170 supplies a power supply potential Vga for driving the light emitting chips C1 to C40.

Next, the arrangement of the light emitting chips C1 to C40 will be described.

The odd-numbered light emitting chips C1, C3, C5, . . . are arranged in one row at intervals in the longitudinal direction of the substrate 80. The even-numbered light emitting chips C2, C4, C6, . . . are also arranged in another row at intervals in the longitudinal direction of the substrate 80 in the same manner. The odd-numbered light emitting chips C1, C3, C5, . . . and the even-numbered light emitting chips C2, C4, C6, . . . are arranged zigzag in a state in which the odd-numbered light emitting chips C1, C3, C5, . . . and the even-numbered light emitting chips C2, C4, C6, . . . are rotated 180° from each other respectively so that the long sides closer to the light emitting portions 102 provided in the light emitting chips C face one another. The light emitting chips C are positioned so that light emitting elements between adjacent ones of the light emitting chips C are also arranged at predetermined intervals in the main scanning direction (X direction). Incidentally, the direction of the arrangement of the light emitting elements (in numerical order of the laser diodes LD1 to LD128 in the first exemplary embodiment) of the light emitting portion 102 shown in FIG. 4A is indicated by an arrow in each of the light emitting chips C1 to C40 in FIG. 4B.

The wirings (lines) through which the signal generating circuit 110 is connected with the light emitting chips C1 to C40 will be described.

A power supply line 200a that is connected to the back electrodes 91 (see FIG. 6B that will be described later) so as to supply the reference potential Vsub to the back electrodes 91 is provided on the circuit substrate 62. The back electrodes 91 serve as the Vsub terminals provided on the back surfaces of the substrates 80 of the light emitting chips C.

A power supply line 200b that is connected to the Vga terminals so as to supply the power supply potential Vga for driving to the Vga terminals is provided on the circuit substrate 62. The Vga terminals are provided on the light emitting chips C.

A first transfer signal line 201 for transmitting the first transfer signal $\phi 1$ from the transfer signal generating portion 120 of the signal generating circuit 110 to the $\phi 1$ terminals of the light emitting chips C1 to C40, and a second transfer signal line 202 for transmitting the second transfer signal $\phi 2$ from the transfer signal generating portion 120 of the signal generating circuit 110 to the $\phi 2$ terminals of the light emitting chips C1 to C40 are provided on the circuit substrate 62. The first transfer signal $\phi 1$ and the second transfer signal $\phi 2$ are commonly (in parallel) transmitted to the light emitting chips C1 to C40.

In addition, lighting signal lines 204-1 to 204-40 (that will be denoted as lighting signal lines 204 simply when they are not discriminated from one another) that transmit the lighting signals $\phi I1$ to $\phi I40$ from the lighting generating portion 140 of the signal generating circuit 110 to the $\phi I$ terminals of the light emitting chips C1 to C40 through current limiting resistors RI respectively are provided on the circuit substrate 62.

As described above, the reference potential Vsub and the power supply potential Vga are commonly supplied to all of the light emitting chips C1 to C40 on the circuit substrate 62. The first transfer signal $\phi 1$ and the second transfer signal $\phi 2$ are also commonly (in parallel) transmitted to the light emitting chips C1 to C40. On the other hand, the lighting signals $\phi I1$ to $\phi I40$ are transmitted to the light emitting chips C1 to C40 respectively and individually.

(Light Emitting Chip C)

Figure 5:
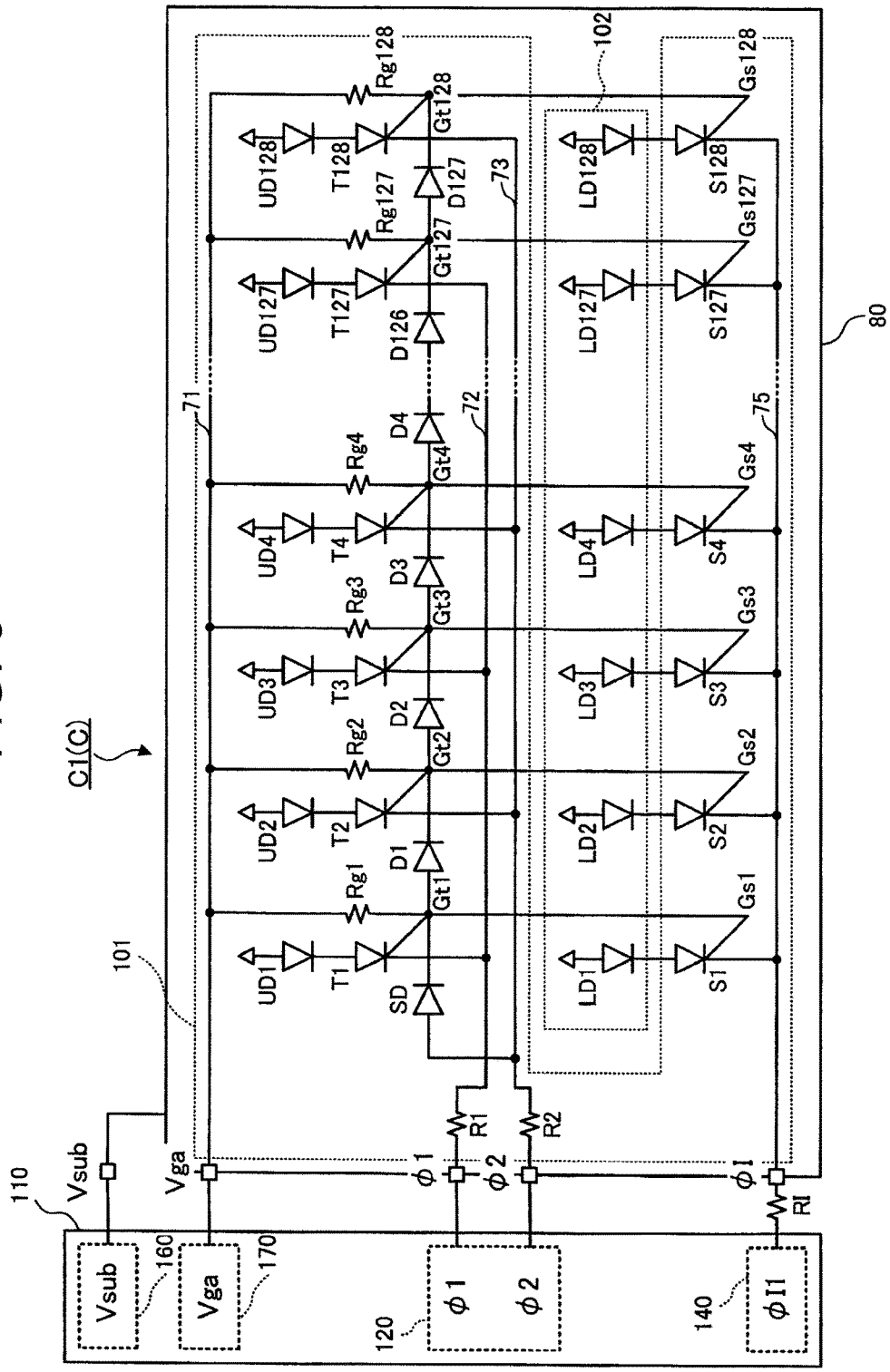
FIG. 5 An equivalent circuit diagram for explaining a circuit configuration of the light emitting chip on which a self-scanning light emitting device (SLED) according to the first exemplary embodiment is mounted.

FIG. 5 is an equivalent circuit diagram for explaining the circuit configuration of each of the light emitting chips C on which a self-scanning light emitting device (SLED) according to the first exemplary embodiment is mounted. Respective elements that will be described below are disposed based on a layout (see FIG. 6A that will be described later) on the light emitting chip C except the terminals (the $\phi 1$ terminal, the $\phi 2$ terminal, the Vga terminal, the $\phi I$ terminal). Incidentally, the terminals (the $\phi 1$ terminal, the $\phi 2$ terminal, the Vga terminal, the $\phi I$ terminal) are different in position from those in FIG. 4A but are shown at a left end of FIG. 5 in order to explain their connection relationships with the signal generating circuit 110. The Vsub terminal provided on the back surface of the substrate 80 is shown to be led outside the substrate 80.

Here, the relationship between the light emitting chip C and the signal generating circuit 110 will be described using the light emitting chip C1 as an example. Therefore, in FIG. 5, the light emitting chip C will be denoted as light emitting chip C1 (C). The configuration of any of the other light emitting chips C2 to C40 is the same as that of the light emitting chip C1.

The light emitting chip C1 (C) includes the light emitting portion 102 (see FIG. 4A) constituted by the laser diodes LD1 to LD128.

The light emitting chip C1 (C) is provided with setting thyristors S1 to S128 (that will be denoted as setting thyristors S simply when they are not discriminated from one another). As to the laser diodes LD1 to LD128 and the setting thyristors S1 to S128, each laser diode LD and each setting thyristor S suffixed with the same number are connected in series.

Figure 6A:
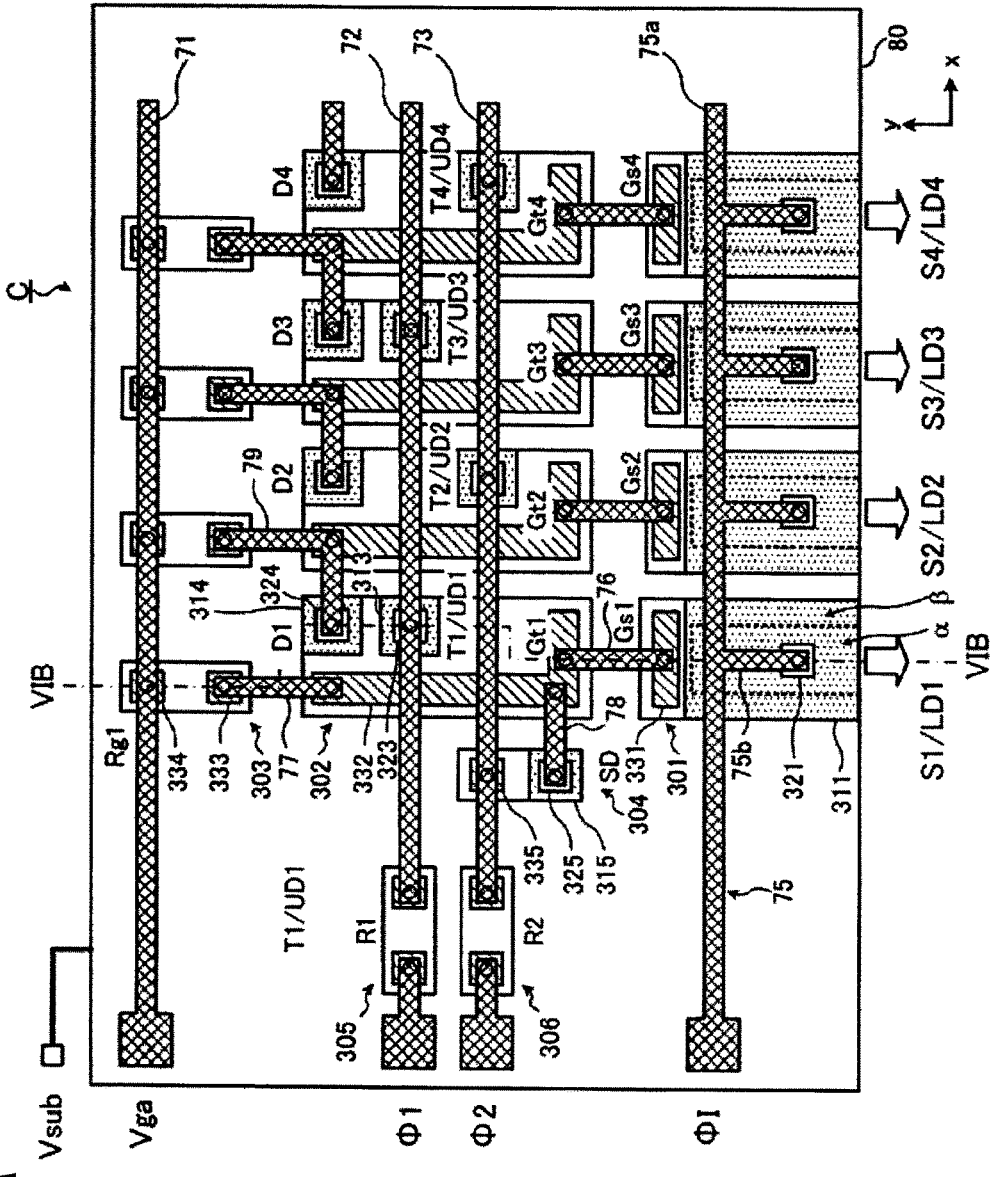
FIG. 6A A planar layout diagram of the light emitting chip according to the first exemplary embodiment.
Figure 6B:
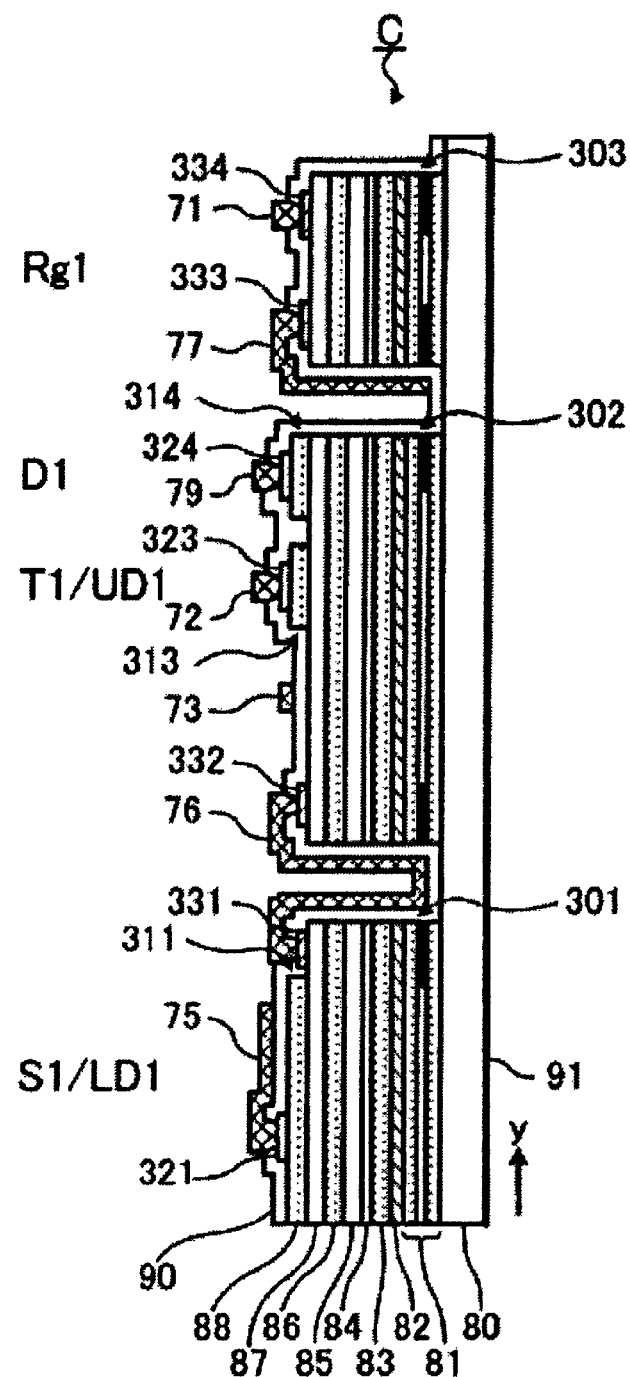
FIG. 6B A sectional view taken along a line VIB-VIB of FIG. 6A.

Incidentally, as shown in FIG. 6B that will be described later, the setting thyristors S are laminated on the laser diodes LD arranged like a row on the substrate 80. Accordingly, the setting thyristors S1 to S128 are also arranged like a row. The setting thyristors S are an example of elements used for driving.

Further, the light emitting chip C1 (C) is provided with transfer thyristors T1 to T128 (that will be denoted as transfer thyristors T simply when they are not discriminated from one another) arranged like a row in the same manner as the laser diodes LD1 to LD128 and the setting thyristors S1 to S128.

The light emitting chip C1 (C) is provided with lower diodes UD1 to UD128 (that will be denoted as lower diodes UD simply when they are not discriminated from one another) the same in structure as the laser diodes LD1 to LD128. Of the lower diodes UD1 to UD128 and the transfer thyristors T1 to T128, each lower diode UD and each transfer thyristor T having the same number are connected in series.

Incidentally, as shown in FIG. 6B that will be described later, the transfer thyristors T are laminated on the lower diodes UD arranged like a row on the substrate 80. Accordingly, the lower diodes UD1 to UD128 are also arranged like a row.

Incidentally, description will be made here using the transfer thyristors T as an example of transfer elements. Any other circuit elements may be used as long as the elements can get into an ON state sequentially. For example, shift resistors or circuit elements in which a plurality of transistors are combined may be used.

In addition, the light emitting chip C1 (C) is provided with junction diodes D1 to D127 (that will be denoted as junction diodes D simply when they are not discriminated from one another) each of which is provided between two of the transfer thyristors T1 to T128 paired in numerical order.

Further, the light emitting element C1 (C) is provided with power supply line resistors Rg1 to Rg128 (that will be denoted as power supply line resistors Rg simply when they are not discriminated from one another).

In addition, the light emitting chip C1 (C) is provided with one start diode SD. The light emitting chip C1 (C) is provided with current limiting resistors R1 and R2 that are provided in order to prevent an overcurrent from flowing into a first transfer signal line 72 and a second transfer signal line 73 that will be described later. The first transfer signal $\phi 1$ is transmitted through the first transfer signal line 72. The second transfer signal $\phi 2$ is transmitted through the second transfer signal line 73.

Here, a driving portion 101 is constituted by the setting thyristors S1 to S128, the transfer thyristors T1 to T128, the lower diodes UD1 to UD128, the power supply line resistors Rg1 to Rg128, the junction diodes D1 to D127, the start diode SD, and the current limiting resistors R1 and R2.

The laser diodes LD1 to LD128 of the light emitting portion 102 and the setting thyristors S1 to S128, the transfer thyristors T1 to T128 and the lower diodes UD1 to UD128 of the driving portion 101 are arranged in numerical order from the left side in FIG. 5. Further, the junction diodes D1 to D127 and the power supply line resistors Rg1 to Rg128 are also arranged in numerical order from the left side in FIG. 5.

In the first exemplary embodiment, the number of the laser diodes LD in the light emitting portion 102, and the number of the setting thyristors S, the number of the transfer thyristors T, the number of the lower diodes UD, and the number of the power supply line resistors Rg in the driving portion 101 are all 128. Incidentally, the number of the junction diodes D is 127, that is one less than the number of the transfer thyristors T.

The number of the laser diodes LD etc. is not limited to the aforementioned one but may be any predetermined number. The number of the transfer thyristors T may be larger than the number of the laser diodes LD.

Each of the aforementioned diodes (the laser diodes LD, the lower diodes UD, the junction diodes D, the start diode SD) is a 2-terminal semiconductor element provided with an anode terminal (anode) and a cathode terminal (cathode), and each of the thyristors (the setting thyristors S, the transfer thyristors T) is a 3-terminal semiconductor element provided with an anode terminal (anode), a gate terminal (gate) and a cathode terminal (cathode).

Incidentally, as will be described later, each of the diodes (the laser diodes LD, the lower diodes UD, the junction diodes D, the start diode SD) and the thyristors (the setting thyristors S, the transfer thyristors T) may not be always provided with the anode terminal, the gate terminal and the cathode terminal formed as electrodes. Accordingly, some terminals will be denoted for short in parentheses in the following description.

Next, electric connection of the respective elements in the light emitting chip C1 (C) will be described.

The anodes of the laser diodes LD and the lower diodes UD are connected to the substrate 80 of the light emitting chip C1 (C) (anode common configuration).

The anodes are connected to the power supply line 200a (see FIG. 4B) through the back electrode 91 which serves as the Vsub terminal provided on the back surface of the substrate 80 (see FIG. 6B which will be described later). The reference potential Vsub is supplied from the reference potential supplying portion 160 to the power supply line 200a.

The cathodes of the laser diodes LD are connected to the anodes of the setting thyristors S respectively. In addition, the cathodes of the lower diodes UD are connected to the anodes of the transfer thyristors T respectively.

Incidentally, the connections are configured when the p-type substrate 80 is used. When an n-type substrate is used, the polarities are reverse. When an intrinsic (i) type substrate not doped with any impurity is used, the terminal connected to the power supply line 200a supplying the reference potential Vsub is provided on the side of the substrate where the driving portion 101 and the light emitting portion 102 are provided.

The cathodes of the odd-numbered transfer thyristors T1, T3, . . . are connected to the first transfer signal line 72 along the arrangement of the transfer thyristors T. The first transfer signal line 72 is connected to the $\phi 1$ terminal through the current limiting resistor R1. The first transfer signal line 201 (see FIG. 4B) is connected to the $\phi 1$ terminal so that the first transfer signal $\phi 1$ can be transmitted from the transfer signal generating portion 120 to the $\phi 1$ terminal.

On the other hand, the cathodes of the even-numbered transfer thyristors T2, T4, . . . are connected to the second transfer signal line 73 along the arrangement of the transfer thyristors T. The second transfer signal line 73 is connected to the $\phi 2$ terminal through the current limiting resistor R2. The second transfer signal line 202 (see FIG. 4B) is connected to the $\phi 2$ terminal so that the second transfer signal $\phi 2$ can be transmitted from the transfer signal generating portion 120 to the $\phi 2$ terminal.

The respective cathodes of the setting thyristors S are connected to a lighting signal line 75. The lighting signal line 75 is connected to the $\phi I$ terminal. In the light emitting chip C1, the $\phi I$ terminal is connected to the lighting signal line 204-1 through the current limiting resistor RI provided outside the light emitting chip C1 (C) so that the lighting signal φI1 can be transmitted from the lighting signal generating portion 140 to the φI terminal (see FIG. 4B). The lighting signal φI1 supplies a current for lighting to the laser diodes LD1 to LD128. Incidentally, the lighting signal lines 204-2 to 204-40 are respectively connected to the φI terminals of the other light emitting chips C2 to C40 through the current limiting resistors RI so that the lighting signals φI2 to φI40 can be transmitted from the lighting signal generating portion 140 to the φI terminals of the other light emitting chips C2 to C40 (see FIG. 4B).

Gates Gt1 to Gt128 (that will be denoted as gates Gt simply when they are not discriminated from one another) in the transfer thyristors T1 to T128 are connected to gates Gs1 to Gs128 (that will be denoted as gates Gs simply when they are not discriminated from one another) in the setting thyristors S1 to S128 having the same numbers as the gates Gt1 to Gt128 respectively in one-to-one correspondence. Accordingly, each of the gates Gt1 to Gt128 and each of the gates Gs1 to Gs128 have the same electric potential when they have the same number. Accordingly, for example, the denotation "gate Gt1 (Gs1)" indicates that the gates Gt1 and Gs1 have the same potential.

Each of the junction diodes D1 to D127 is connected between two gates Gt of the gates Gt1 to Gt128 of the transfer thyristors T1 to T128 paired in numerical order. That is, each of the junction diodes D1 to D127 is connected in series so that the junction diode D1 to D127 can be interposed between two of the gates Gt1 to Gt128. The junction diode D1 is connected in a direction in which a current flows from the gate Gt1 toward the gate Gt2. The same thing is also applied to the other junction diodes D2 to D127.

The gates Gt (gates Gs) of the transfer thyristors T are connected to a power supply line 71 through the power supply line resistors Rg provided correspondingly to the transfer thyristors T respectively. The power supply line 71 is connected to the Vga terminal. The power supply line 200b (see FIG. 4B) is connected to the Vga terminal so that the power supply potential Vga can be supplied from the power potential supplying portion 170 to the Vga terminal.

The gate Gt1 of the transfer thyristor T1 is connected to the cathode terminal of the start diode SD. On the other hand, the anode of the start diode SD is connected to the second transfer signal line 73.

FIG. 6A is a planar layout diagram of the light emitting chip C. FIG. 6B is a sectional view taken along a line VIB-VIB of FIG. 6A. Here, the connection relationship between the light emitting chip C and the signal generating circuit 110 is not shown. Therefore, it is unnecessary to take the light emitting chip C1 as an example. Accordingly, the light emitting chip will be denoted as C simply.

FIG. 6A shows a portion in which the laser diodes LD1 to LD4, the setting thyristors S1 to S4, the transfer thyristors T1 to T4 and the lower diodes UD1 to UD4 are provided at the center. Incidentally, the terminals (the φ1 terminal, the φ2 terminal, the Vga terminal, the φI terminal) are different in position from those in FIG. 4A but are shown at a left end portion in FIG. 6A for convenience of explanation. The Vsub terminal (the back electrode 91) provided on the back surface of the substrate 80 is shown to be led outside the substrate 80. When the terminals are provided correspondingly FIG. 4A, the φ2 terminal, the φI terminal and the current limiting resistor R2 are provided at a right end portion of the substrate 80. In addition, the start diode SD may be provided at the right end portion of the substrate 80.

In FIG. 6B which is the sectional view taken along the line VIB-VIB of FIG. 6A, the setting thyristor S1/the laser diode LD1, the transfer thyristor T1/the lower diode UD1, the junction diode D1, and the power supply line resistor Rg1 are shown in this order from the bottom of FIG. 6B. Incidentally, the setting thyristor S1 and the laser diode LD1 are laminated on each other. In the same manner, the transfer thyristor T1 and the lower diode UD1 are laminated on each other.

Main elements or terminals are denoted by name in FIGS. 6A and 6B.

First, the sectional structure of the light emitting chip C will be described with reference to FIG. 6B.

A p-type anode layer 81 (p anode layer 81), a light emitting layer 82 and an n-type cathode layer 83 (n cathode layer 83) constituting the laser diode LD and the lower diode UD are provided on the p-type substrate 80 (substrate 80).

A tunnel junction (tunnel diode) layer 84 (tunnel junction layer 84) is provided on the n cathode layer 83.

Further, a p-type anode layer 85 (p anode layer 85), an n-type gate layer 86 (n gate layer 86), a p-type gate layer 87 (p gate layer 87), and an n-type cathode layer 88 (n cathode layer 88) constituting the setting thyristor S, the transfer thyristor T, the junction diode D1 and the power supply line resistor Rg1 are provided in this order on the tunnel junction layer 84.

Incidentally, denotation in parentheses will be used in the following description. The same thing will be also applied to other cases.

As shown in FIG. 6B, a protective layer 90 that is made of a light-transmissive insulating material and that is provided so as to cover front surfaces and side surfaces of islands is provided in the light emitting chip C.

In FIG. 6A, a light emission direction of the laser diode LD is emitted is designated by an arrow. A light emission surface of the laser diode LD is formed into a cleavage surface by way of example. Therefore, the protective layer 90 is not provided on the light emission surface of the laser diode LD. The reason why the light emission surface of the laser diode LD is formed into the cleavage surface will be described later.

The islands are connected with the wirings such as the power supply line 71, the first transfer signal line 72, the second transfer line 73, the lighting signal line 75, etc. through through balls (designated by circles in FIG. 6A) provided in the protective layer 90. In the following description, description about the protective layer 90 and the through balls will be omitted.

In addition, the back electrode 91 which serves as the Vsub terminal is provided on the back surface of the substrate 80, as shown in FIG. 6B.

Each of the p anode layer 81, the light emitting layer 82, the n cathode layer 83, the tunnel junction layer 84, the p anode layer 85, the n gate layer 86, the p gate layer 87, and the n cathode layer 88 is a semiconductor layer which is laminated monolithically by epitaxial growth.

The semiconductor layers between adjacent ones of the islands (islands) (islands 301, 302, 303, . . . which will be described later) are removed by etching (mesa etching) so that the islands are separated from one another. In addition, the p anode layer 81 may also serve as the substrate 80.

Here, the denotations of the p anode layer 81 and the n cathode layer 83 are made to correspond to functions (functions) when the p anode layer 81 and the n cathode layer 83 constitute the laser diode LD and the lower diode UD. That is, the p anode layer 81 functions as an anode, and the n cathode layer 83 functions as a cathode. Incidentally, each of the p anode layer 81 and the n cathode layer 83 functions as a clad in the laser diode LD. Accordingly, the p anode layer 81 and the n cathode layer 83 may be denoted as p anode (clad) layer 81 and n cathode (clad) layer 83 respectively.

Denotations of the p anode layer 85, the n gate layer 86, the p gate layer 87, and the n cathode layer 88 are made to correspond to functions (functions) when the p anode layer 85, the n gate layer 86, the p gate layer 87, and the n cathode layer 88 constitute the setting thyristor S and the transfer thyristor T. That is, the p anode layer 85 functions as an anode, the n gate layer 86 and the p gate layer 87 function as a gate, and the n cathode layer 88 functions as a cathode.

Incidentally, when the p anode layer 85, the n gate layer 86, the p gate layer 87, and the n cathode layer 88 constitute the junction diode D and the power supply line resistor Rg, the p anode layer 85, the n gate layer 86, the p gate layer 87, and the n cathode layer 88 have different functions as will be described later.

As will be described later, the islands may include islands each of which is not provided with a portion of a layer of the p anode layer 81, the light emitting layer 82, the n cathode layer 83, the tunnel junction layer 84, the p anode layer 85, the n gate layer 86, the p gate layer 87, and the n cathode layer 88. For example, the island 301 is not provided with a portion of the n cathode layer 88.

Next, the planar layout of the light emitting chip C will be described with reference to FIG. 6A.

The laser diode LD1 and the setting thyristor S1 are provided in the island 301. The lower diode UD1, the transfer thyristor T1 and the junction diode D1 are provided in the island 302. The power supply line resistor Rg1 is provided in the island 303. The start diode SD is provided in the island 304. The current limiting resistor R1 is provided in the island 305. The current limiting resistor R2 is provided in the island 306.

The same islands as the island 301, 302, 303 are formed in parallel in the light emitting chip C. The laser diodes LD2, LD3, LD4, . . . , the setting thyristors S2, S3, S4, . . . , the transfer thyristors T2, T3, T4, . . . , the lower diodes UD2, UD3, UD4, . . . , the junction diodes D2, D3, D4, . . . etc. are provided in the islands in the same manner as in the islands 301, 302 and 303.

Here, the islands 301 to 306 will be described in detail here with reference to FIGS. 6A and 6B.

As shown in FIG. 6A, the laser diode LD1 provided in the island 301 is constituted by the p anode layer 81, the light emitting layer 82 and the n cathode layer 83. The setting thyristor S1 is constituted by the p anode layer 85, the n gate layer 86, the p gate layer 87 and the n cathode layer 88 that are laminated through the tunnel junction layer 84 laminated on the n cathode layer 83 of the laser diode LD1. An n-type ohmic electrode 321 (n ohmic electrode 321) provided on the n cathode layer 88 (region 311) is used as a cathode electrode.

A p-type ohmic electrode 331 (p ohmic electrode 331) provided on the p gate layer 87 that has been exposed after removal of the n cathode layer 88 is used as an electrode (that may be denoted as gate terminal Gs1) of the gate Gs1.

Incidentally, a current narrowing layer 81b (see FIG. 7 that will be described later) is included in the p anode layer 81. The current narrowing layer 81b is provided to limit a current flowing into the laser diode LD to a central portion of the laser diode LD. That is, a peripheral portion of the laser diode LD contains lots of defects due to the mesa etching. Therefore, non-radiative recombination is apt to occur. To solve this problem, the current narrowing layer 81b is provided so that the central portion of the laser diode LD serves as a current passing portion a where the current is apt to flow, and the peripheral portion of the laser diode LD serves as a current blocking portion p where the current is difficult to flow. As shown in the laser diode LD1 of FIG. 6A, a portion inside a broken line corresponds to the current passing portion α, and a portion outside the broken line corresponds to the current blocking portion β.

When the current blocking portion β is provided on the light emission side of the laser diode LD, there is a fear that loss may be generated to thereby cause a decrease in light quantity. Therefore, the light emission surface (edge) of the laser diode LD indicated by the arrow is formed as the cleavage surface so as to remove the current blocking portion β. Incidentally, the light emission surface of the laser diode LD may be formed by etching. When the loss is small, it is unnecessary to remove the current blocking portion β. In addition, when the current blocking portion β is not removed, there is a merit that COD (Catastrophic Optical Damage) that becomes an issue during high light output in an edge emission type can be avoided due to a non-radiative portion (window structure) provided in a light emission portion.

When the current narrowing layer 81b is provided, consumption of electric power for non-radiative recombination can be suppressed. Accordingly, power consumption can be reduced and light extraction efficiency can be improved. Incidentally, the light extraction efficiency means the quantity of light that can be extracted per unit electric power.

Incidentally, the current narrowing layer 81b will be described later.

The lower diode UD1 provided in the island 302 is constituted by the p anode layer 81, the light emitting layer 82 and the n cathode layer 83. The transfer thyristor T1 is constituted by the p anode layer 85, the n gate layer 86, the p gate layer 87, and the n cathode layer 88. An n ohmic electrode 323 provided on the n cathode layer 88 (region 313) is used as a cathode terminal. Further, a p ohmic electrode 332 provided on the p gate layer 87 that has been exposed after removal of the n cathode layer 88 is used as a terminal of the gate Gt1 (that may be denoted as gate terminal Gt1).

Likewise, the junction diode D1 provided in the island 302 is constituted by the p gate layer 87 and the n cathode layer 88. An n ohmic electrode 324 provided on the n cathode layer 88 (region 314) is used as a cathode terminal. Further, the p ohmic electrode 332 provided on the p gate layer 87 that has been exposed after removal of the n cathode layer 88 is used as an anode terminal. Here, the anode terminal of the junction diode D1 is the same as the gate Gt1 (gate terminal Gt1).

The power supply line resistor Rg1 provided in the island 303 is constituted by the p gate layer 87. That is, in the power supply line resistor Rg1, the p gate layer 87 between a p ohmic electrode 333 and a p ohmic electrode 334 is provided as a resistor. The p ohmic electrode 333 and the p ohmic electrode 334 are provided on the p gate layer 87 that has been exposed after removal of the n cathode layer 88.

The start diode SD provided in the island 304 is constituted by the p gate layer 87 and the n cathode layer 88. That is, the start diode SD has an n ohmic electrode 325 used as a cathode terminal. The n ohmic electrode 325 is provided on the n cathode layer 88 (region 315). Further, the start diode SD has a p ohmic electrode 335 used as an anode terminal. The p ohmic electrode 335 is provided on the p gate layer 87 that has been exposed after removal of the n cathode layer 88.

The current limiting resistor R1 provided in the island 305 and the current limiting resistor R2 provided in the island 306 are provided in the same manner as the power supply line resistor Rg1 provided in the island 303. In each of the current limiting resistor R1 and the current limiting resistor R2, the p gate layer 87 between two p ohmic electrodes (unreferenced) is used as a resistor.

The connection relationships among the elements will be described in FIG. 6A. The lighting signal line 75 is provided with a trunk portion 75a and branch portions 75b. The trunk portion 75a is provided to extend in the row direction of the setting thyristors S/the laser diodes LD. Each of the branch portions 75b is branched from the trunk portion 75a to be connected to the n ohmic electrode 321. The n ohmic electrode 321 serves as the cathode terminal of the setting thyristor S1 provided in the island 301. The same thing is also applied to cathode terminals of the other setting thyristors S.

The lighting signal line 75 is connected to the φI terminal provided on the setting thyristor S1/the laser diode LD1 side.

The first transfer signal line 72 is connected to the n ohmic electrode 323. The n ohmic electrode 323 serves as the cathode terminal of the transfer thyristor T1 provided in the island 302. Cathode terminals of the other odd-numbered transfer thyristors T that are provided in the same islands as the island 302 are connected to the first transfer signal line 72. The first transfer signal line 72 is connected to the φ1 terminal through the current limiting resistor R1 provided in the island 305.

On the other hand, the second transfer signal line 73 is connected to n ohmic electrodes (unreferenced) which serve as the cathode terminals of the even-numbered transfer thyristors T provided in unreferenced islands. The second transfer signal line 73 is connected to the φ2 terminal through the current limiting resistor R2 provided in the island 306.

The power supply line 71 is connected to the p ohmic electrode 334. The p ohmic electrode 334 serves as one of the terminals of the power supply line resistor Rg1 provided in the island 303. Ones of terminals of the other power supply line resistors Rg are also connected to the power supply line 71. The power supply line 71 is connected to the Vga terminal.

The p ohmic electrode 331 (gate terminal Gs1) of the setting thyristor S1 provided in the island 301 is connected to the p ohmic electrode 332 (gate terminal Gt1) in the island 302 through a connection wiring 76.

The p ohmic electrode 332 (gate germinal Gt1) is connected to the p ohmic electrode 333 (the other terminal of the power supply line resistor Rg1) in the island 303 through a connection wiring 77.

The n ohmic electrode 324 (cathode terminal of the junction diode D1) provided in the island 302 is connected to a p ohmic electrode (unreferenced) through a connection wiring 79. The p ohmic electrode (unreferenced) is a gate terminal Gt2 of an adjacent transfer thyristor T2.

Although description will be omitted here, the same thing is also applied to the other light emitting diodes LED, the other setting thyristors S, the other transfer thyristors T, the other junction diodes D, etc.

The p ohmic electrode 332 (gate terminal Gt1) in the island 302 is connected to the n ohmic electrode 325 (cathode terminal of the start diode SD) provided in the island 304 through a connection wiring 78. The p ohmic electrode 335 (anode terminal of the start diode SD) is connected to the second transfer signal line 73.

Incidentally, the aforementioned connections and configuration are formed when the p-type substrate 80 is used. When an n-type substrate is used, the polarities are reverse.

When an i-type substrate is used, the terminal connected to the power supply line 200a supplying the reference potential Vsub is provided on the side of the substrate where the driving portion 101 and the light emitting portion 102 are provided. Connections and configuration formed when the n-type substrate is used are the same as the connections and configuration formed when the p-type substrate is used.

(Laminate Structure of Laser Diode LD and Setting Thyristor S)

Figure 7:
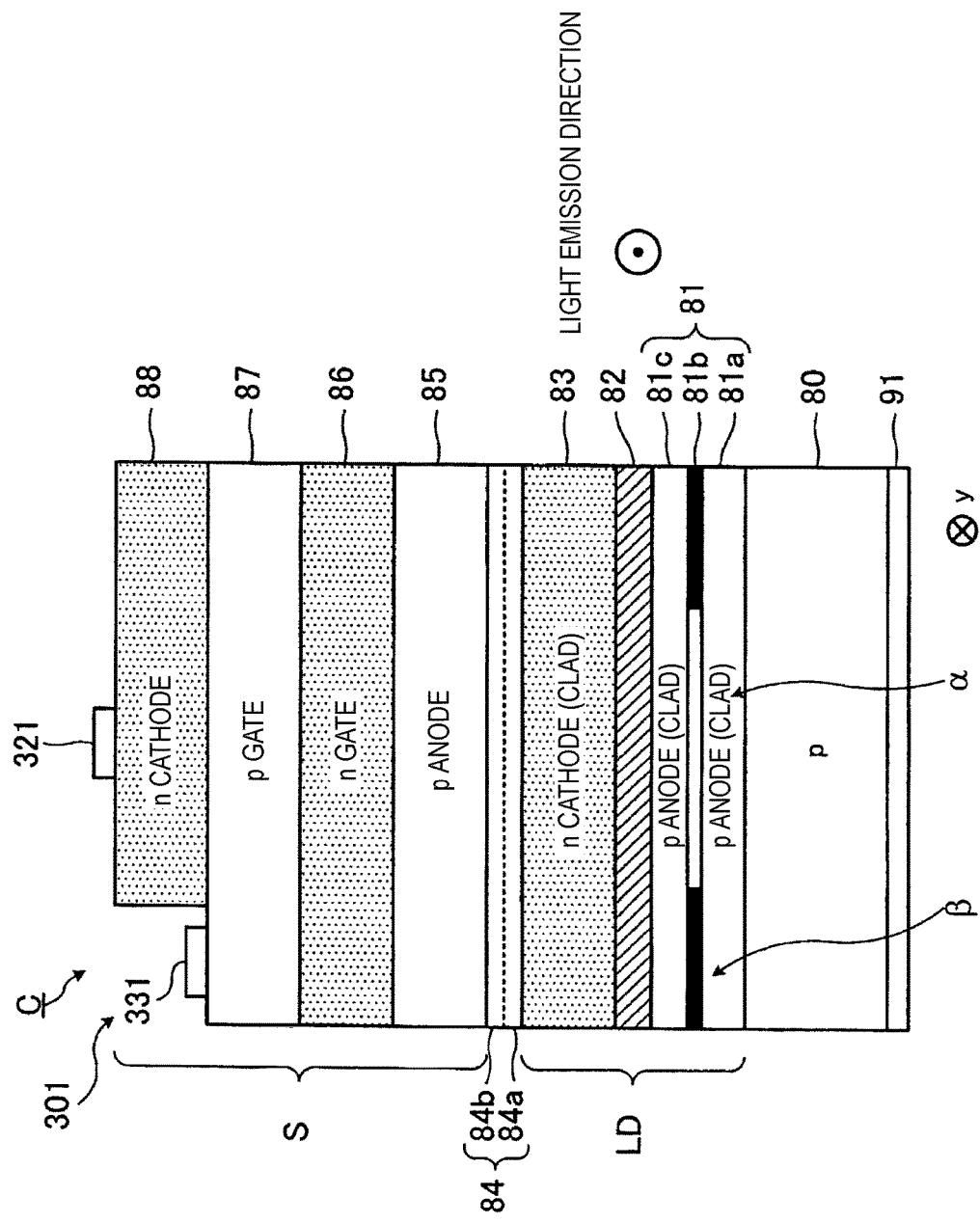
FIG. 7 An enlarged sectional view of an island where a laser diode and a setting thyristor are laminated on each other.

FIG. 7 is an enlarged sectional view of the island 301 in which the laser diode LD and the setting thyristor S are laminated on each other. Incidentally, the protective layer 90 is omitted. FIG. 7 is the sectional view of the island 301 that is shown in FIGS. 6A and 6B but seen from a −y direction of FIG. 6A. In this state, the p ohmic electrode 331 cannot be seen. For this reason, the portion of the p ohmic electrode 331 in FIG. 7 is illustrated as seen from a −x direction of FIG. 6A. The same thing is also applied to the following drawings.

As described above, the setting thyristor S is laminated on the laser diode LD through the tunnel junction layer 84. That is, the laser diode LD and the setting thyristor S are connected in series.

The laser diode LD is constituted by the p anode (clad) layer 81, the light emitting layer 82 and the n cathode (clad) layer 83. Incidentally, the light emitting layer 82 has a quantum well structure in which well (well) layers and barrier (barrier) layers are laminated alternately. Incidentally, the light emitting layer 82 may be an intrinsic (i) layer not doped with any impurity. In addition, the light emitting layer 82 may have any other structure than the quantum well structure. For example, the light emitting layer 82 may be formed as a quantum line (quantum wire) or a quantum box (quantum dot).

The p anode (clad) layer 81 is configured to include the current narrowing layer 81b. That is, the p anode (clad) layer 81 is constituted by a lower p anode (clad) layer 81a, the current narrowing layer 81b, and an upper p anode (clad) layer 81c.

The p anode (clad) layer 81, the n cathode (clad) layer 83 and the light emitting layer 82 are set so that light emitted from the light emitting layer 82 is confined between the p anode (clad) layer 81 and the n cathode (clad) layer 83 and laser light is oscillated between side surfaces (edges) of the light emitting layer 82. In this case, the light is emitted from the side surfaces (edges) of the light emitting layer 82.

The tunnel junction layer 84 is constituted by an $n^{++}$ layer 84a added (doped) with a high concentration of n-type impurities (dopant), and a $p^{++}$ layer 84b doped with a high concentration of p-type impurities.

The setting thyristor S is constituted by the p anode layer 85, the n gate layer 86, the p gate layer 87, and the n cathode layer 88. That is, the setting thyristor S has a pnpn four-layer structure.

<Tunnel Junction Layer 84>

Figure 8A:
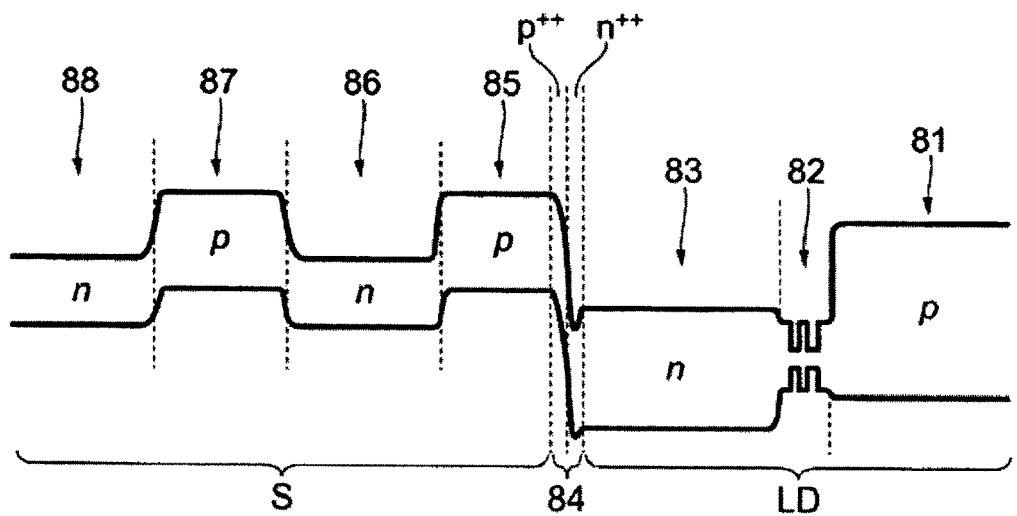
FIG. 8A A schematic energy band diagram in the laminate structure of the laser diode and the setting thyristor.
Figure 8B:
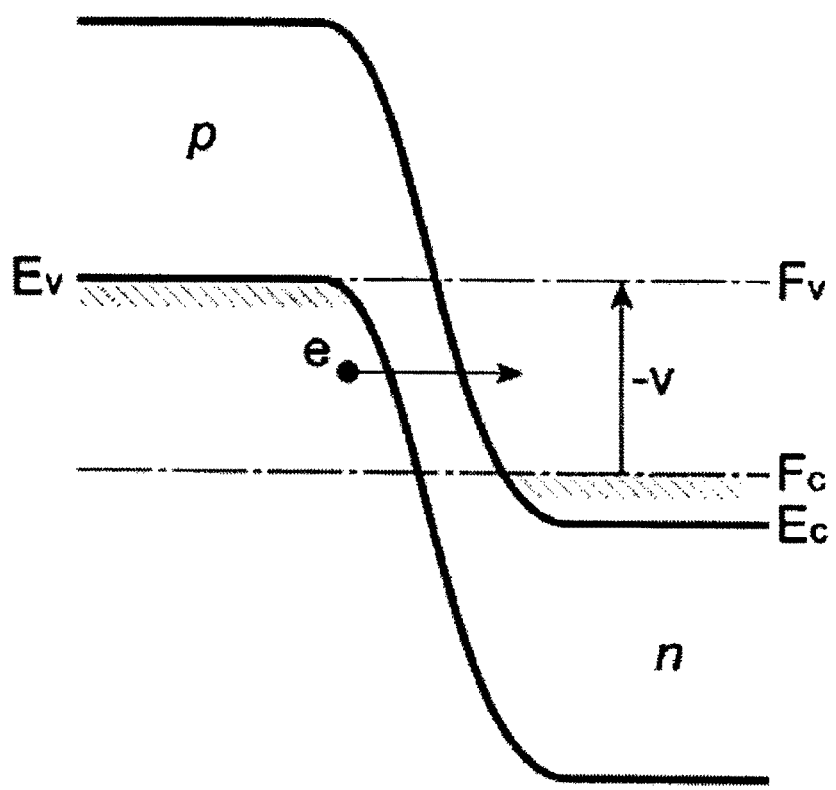
FIG. 8B An energy band diagram of a tunnel junction layer in a reverse bias state.
Figure 8C:
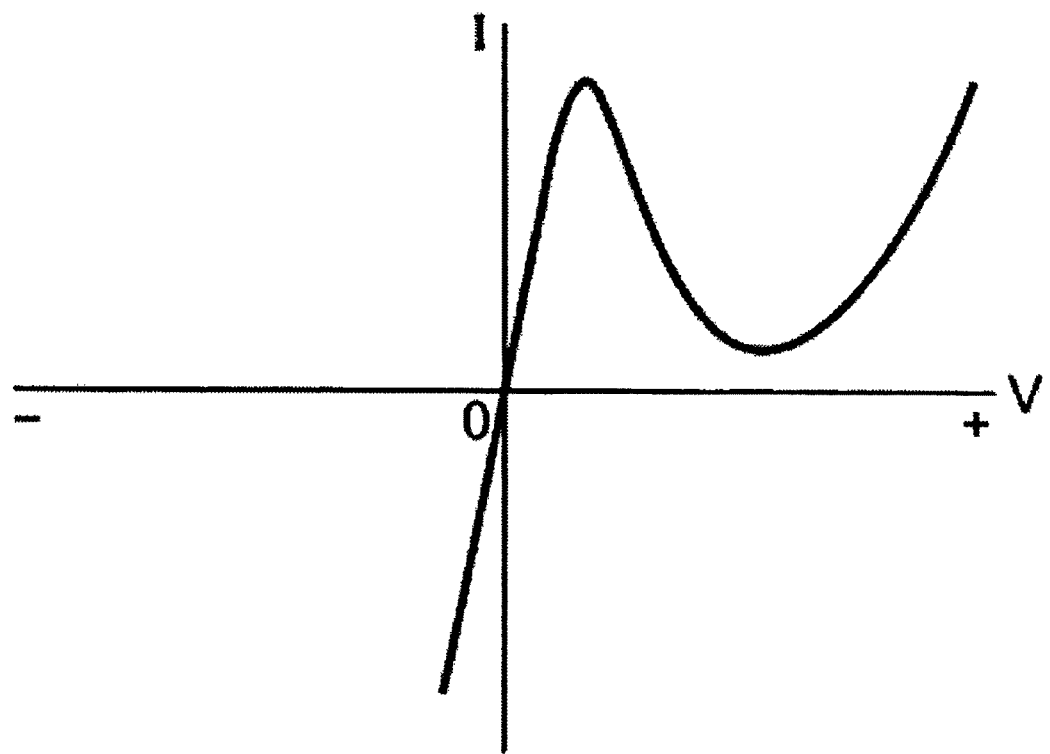
FIG. 8C A diagram showing a current-voltage characteristic of the tunnel junction layer.

FIGS. 8A to 8C are diagrams for further explaining the laminate structure of the laser diode LD and the setting thyristor S. FIG. 8A shows a schematic energy band diagram in the laminate structure of the laser diode LD and the setting thyristor S. FIG. 8B shows an energy band diagram of the tunnel junction layer 84 in a reverse bias state. FIG. 8C shows a current-voltage characteristic of the tunnel junction layer 84.

As shown in the energy band diagram of FIG. 8A, when a voltage is applied between the n ohmic electrode 321 and the back electrode 91 in FIG. 7 so that the laser diode LD and the setting thyristor S are forward biased, a reverse bias is applied between the n$^{++}$ layer 84a and the p$^{++}$ layer 84b of the tunnel junction layer 84.

The tunnel junction layer 84 is a junction between the n$^{++}$ layer 84a doped with the high concentration of the n-type impurities and the p$^{++}$ layer 84b doped with the high concentration of the p-type impurities. Therefore, when the width of a depletion region is narrow and a forward bias is applied thereto, electrons tunnel from a conduction band (conduction band) on the n$^{++}$ layer 84a side to a valence band (valence band) on the p$^{++}$ layer 84b side. On this occasion, a negative resistance characteristic appears.

On the other hand, as shown in FIG. 8B, when the tunnel junction layer 84 (tunnel junction) is reversely biased (−V), a potential Ev of the valence band (valence band) on the p$^{++}$ layer 84b side is higher than a potential Ec of the conduction band (conduction band) of the n$^{++}$ layer 84a. Electrons tunnel from the valence band (valence band) of the p$^{++}$ layer 84b to the conduction band (conduction band) of the n$^{++}$ layer 84a. As the reverse bias voltage (−V) increases, the electrons can tunnel more easily. That is, as shown in FIG. 8C, a current is apt to flow through the tunnel junction layer 84 (tunnel junction) in the reverse bias.

Accordingly, when the setting thyristor S turns ON as shown in FIG. 8A, the current can flow between the laser diode LD and the setting thyristor S even if the tunnel junction layer 84 is reversely biased. Thus, the laser diode LD emits light (is lit).

As will be described later, the setting thyristor S can shift to an ON state when the connected transfer thyristor T turns ON to get into an ON state. When the lighting signal ϕI changes to "L" as will be described later, the setting thyristor S turns ON to get into the ON state and lights the laser diode LD (sets the lighting). Therefore, the setting thyristor S is denoted as "setting thyristor" in the description of the present invention.

Incidentally, the relationship between the lower diode UD and the transfer thyristor T is the same as the relationship between the laser diode LD and the setting thyristor S. However, light emitted from the lower diode UD is not used. Accordingly, when there is a fear that light emitted from the lower diode UD may be leaking light, the size of the lower diode UD may be reduced or the light of the lower diode UD may be blocked by the material etc. forming the wirings.

<Thyristor>

Next, basic operation of the thyristor (transfer thyristor T, setting thyristor S) will be described. The thyristor is a 3-terminal semiconductor element having an anode terminal (anode), a cathode terminal (cathode) and a gate terminal (gate), as described above. For example, the thyristor has a configuration in which p-type semiconductor layers (the p anode layer 85, the p gate layer 87) and n-type semiconductor layers (the n gate layer 86, the n cathode layer 88), which are made, for example, of GaAs, GaAlAs, AlAs, etc. are laminated on the substrate 80. That is, the thyristor forms a pnpn structure. Description will be made here on the assumption that a forward potential (diffusion potential) Vd of a pn junction which is constituted by a p-type semiconductor layer and a n-type semiconductor layer is set at 1.5 V by way of example.

Description will be made below on the assumption that the reference potential Vsub supplied to the back electrode 91 (see FIG. 5, FIG. 6B) serving as the Vsub terminal is set at 0 V as a high level potential (hereinafter denoted as "H"), and the power supply potential Vga supplied to the Vga terminal is set at −5 V as a low level potential (hereinafter denoted as "L") by way of example. Therefore, the high level potential and the low level potential may be denoted as "H" (0 V) and "L" (−5 V) respectively.

First, operation of the single thyristor will be described. Assume here that the potential of the anode of the thyristor is 0 V.

When a potential (negative potential with a larger absolute value) lower than a threshold voltage is applied to the cathode of the thyristor that is in an OFF state in which no current flows between the anode and the cathode, the thyristor shifts to an ON state (turns ON). Here, the threshold voltage of the thyristor takes a value which is obtained by subtracting the forward potential Vd (1.5 V) of the pn junction from a potential of the gate.

When the thyristor gets into the ON state, the potential of the gate of the thyristor changes to be close to the potential of the anode terminal. Since the potential of the anode is 0 V here, the potential of the gate may be regarded as 0 V. In addition, the potential of the cathode of the thyristor in the ON state is close to a potential which is obtained by subtracting the forward potential Vd (1.5 V) of the pn junction from the potential of the anode. Since the potential of the anode is 0 V here, the potential of the cathode of the thyristor in the ON state changes to be close to −1.5 V (negative potential larger in absolute value than 1.5 V). Incidentally, the potential of the cathode is set in relation to a power supply supplying the current to the thyristor in the ON state.

When the potential of the cathode of the thyristor in the ON state changes to a potential (negative potential with a smaller absolute value, 0 V or positive potential) higher than a potential (the aforementioned potential close to −1.5 V) required for maintaining the ON state, the thyristor shifts to an OFF state (turns OFF).

On the other hand, when a potential (negative potential large in absolute value) lower than the potential required for maintaining the ON state is continuously applied to the cathode of the thyristor in the ON state and the current (maintenance current) capable of maintaining the ON state is supplied, the thyristor maintains the ON state.

Next, operation in a state in which the laser diode LD and the setting thyristor S are laminated on each other will be described.

The setting thyristor S is laminated on the laser diode LD to be connected in series therewith. Accordingly, the potential of the lighting signal ϕ1 is divided into voltages to be applied to the laser diode LD and the setting thyristor S. Description will be made here on the assumption that the voltage applied to the laser diode LD is −1.7 V. In this case, when the setting thyristor S is in an OFF state, −3.3 V is applied to the setting thyristor S.

As described above, when the threshold voltage of the setting thyristor S in the OFF state is smaller in absolute value than −3.3 V, the setting thyristor S turns ON. In this case, the current flows into the laser diode LD and the setting thyristor S which are connected in series so that the laser diode LD emits light (is oscillated). On the other hand, when the threshold voltage of the setting thyristor S is smaller in absolute value than −3.3 V, the setting thyristor S does not turn ON but maintains the OFF state. Accordingly, the laser diode LD also maintains a lit-off state (OFF state).

Incidentally, when the setting thyristor turns ON, the voltages applied to the laser diode LD and the thyristor S which are connected in series decrease in absolute value due to the current limiting resistor RI (see FIG. 5). However, when the voltage applied to the setting thyristor S is a voltage for maintaining the ON state of the setting thyristor S, the thyristor S maintains the ON state. Thus, the laser diode LD also continues to emit light.

Incidentally, the aforementioned voltages are merely exemplified, and can be changed in accordance with a wavelength or a light quantity of emitted light of the laser diode LD. On this occasion, the potential ("L") of the lighting signal φI may be adjusted.

Incidentally, the thyristor is made of a semiconductor such as GaAs. Accordingly, the thyristor in the ON state may emit light between the n gate layer 86 and the p gate layer 87. Incidentally, the quantity of the light emitted from the thyristor depends on the area of the cathode and the current flowing between the cathode and the anode. Accordingly, when the light emitted from the thyristor is not put into use, for example, the area of the cathode may be reduced or the light may be blocked by the electrode (the n ohmic electrode 321 in the setting thyristor S1 or the n ohmic electrode 323 in the transfer thyristor T1), the material forming the wirings, etc. Thus, the unnecessary light can be suppressed.

(Operation of Light Emitting Device 65)

Next, operation of the light emitting device 65 will be described.

As described above, the light emitting device 65 is provided with the light emitting chips C1 to C40 (see FIGS. 3 and 4).

The light emitting chips C1 to C40 are driven in parallel. Accordingly, description about operation of the light emitting chip C1 will be sufficient.

<Timing Chart>

Figure 9:
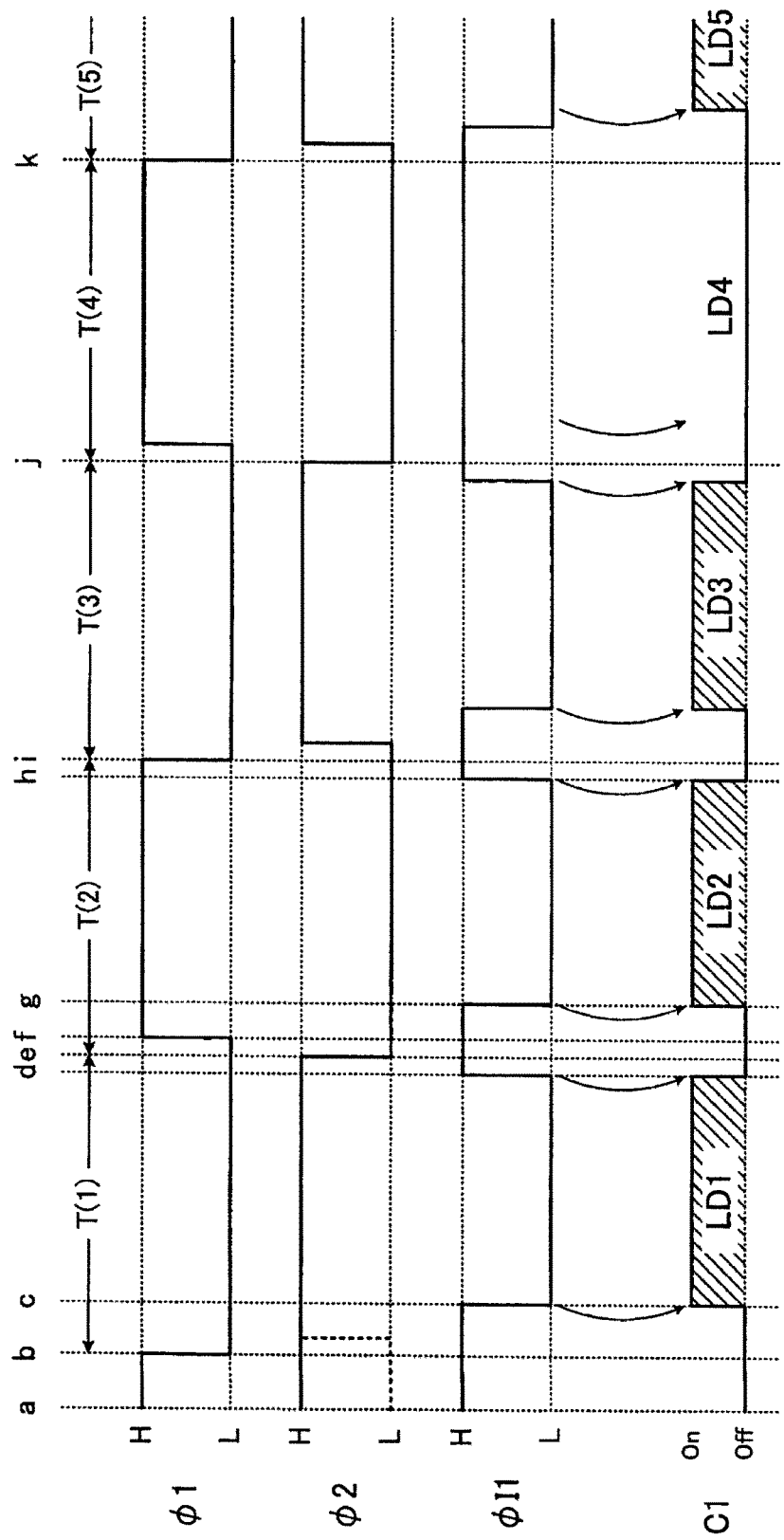
FIG. 9 A timing chart for explaining operations of the light emitting device and the light emitting chip.

FIG. 9 is a timing chart for explaining the operations of the light emitting device 65 and the light emitting chip C.

The timing chart of a portion of the light emitting chip C1 which controls lighting (oscillation) or non-lighting of five laser diodes LD, i.e. the laser diodes LD1 to LD5 is shown in FIG. 9. Incidentally, in the light emitting chip C1, the laser diodes LD1, LD2, LD3 and LD5 are lit on and the laser diode LD4 is lit off (non-lit) in FIG. 9.

In FIG. 9, assume that time elapses in alphabetical order from a time instant a to a time instant k. The laser diode LD1 is controlled to be lit or non-lit (subjected to lighting control) in a time T (1). The laser diode LD2 is controlled to be lit or non-lit (subjected to lighting control) in a time T (2). The laser diode LD3 is controlled to be lit or non-lit (subjected to lighting control) in a time T (3). The laser diode LD4 is controlled to be lit or non-lit (subjected to lighting control) in a time T (4). The laser diodes LD suffixed with numbers not smaller than 5 are subjected to lighting control in the same manner as follows.

Here, the times T(1), T(2), T(3), . . . are regarded as times having the same length and will be referred to as times T simply when they are not discriminated from one another.

The first transfer signal φ1 transmitted to the φ1 terminal (see FIG. 5 and FIG. 6A) and the second transfer signal φ2 transmitted to the φ2 terminal (see FIG. 5 and FIG. 6A) are signals having two potentials of "H" (0 V) and "L" (−5 V). Waveforms of the first transfer signal φ1 and the second transfer signal φ2 are repeated in units of two continuous times T (e.g. the time T(1) and the time T(2)).

"H" (0 V) and "L" (−5 V) may be abbreviated to "H" and "L" in the following description.

The first transfer signal φ1 shifts from "H" (0 V) to "L" (−5 V) at a start time instant b of the time T(1), and shifts from "L" to "H" at a time instant f. The first transfer signal φ1 shifts from "H" to "L" at an end time instant i of the time T(2).

The second transfer signal φ2 is "H" (0 V) at the start time instant b of the time T(1), and shifts from "H" (0 V) to "L" (−5 V) at a time instant e. The second transfer signal φ2 shifts from "L" to "H" at the end time instant i of the time T(2).

When the first transfer signal φ1 and the second transfer signal φ2 are compared with each other, the second transfer signal φ2 is equivalent to the first transfer signal φ1 which has been shifted backward by a time T on a time axis. On the other hand, in the second transfer signal φ2, a waveform indicated by a broken line in the time T(1) and a waveform in the time T(2) are repeated in and after the time T(3). The reason why the waveform of the second transfer signal φ2 in the time T(1) is different from that in and after the time T(3) is that the time T(1) is the time in which the light emitting device 65 starts operation.

Due to propagation of ON states of transfer thyristors T in numerical order, as will be described later, a pair of transfer signals, i.e. the first transfer signal φ1 and the second transfer signal φ2 designate laser diodes LD having the same numbers as the transfer thyristors T in the ON states, as lighting (oscillation) or non-lighting control (lighting control) targets.

Next, the lighting signal φI1 transmitted to the φI terminal of the light emitting chip C1 will be described. Incidentally, the lighting signals φI2 to φI40 are transmitted to the other light emitting chips C2 to C40 respectively. The lighting signal φI1 is a signal having two potentials of "H" (0 V) and "L" (−5 V).

Here, the lighting signal φI1 in the time T(1) for the lighting control on the laser diode LD1 of the light emitting chip C1 will be described. The lighting signal φI1 is "H" (0 V) at the start time instant b of the time T(1), and shifts from "H" (0 V) to "L" (−5 V) at a time instant c. The lighting signal φI1 shifts from "L" to "H" at a time instant d, and maintains "H" at the time instant e.

The operations of the light emitting device 65 and the light emitting chip C1 will be described with reference to FIG. 4A, FIG. 4B and FIG. 5 and in accordance with the timing chart shown in FIG. 9. Incidentally, the times T(1) and T(2) for lighting control on the laser diodes LD1 and LD2 will be described below.

(1) Time Instant a <Light Emitting Device 65>

At the time instant a, the reference potential supplying portion 160 of the signal generating circuit 110 of the light emitting device 65 sets the reference potential Vsub at "H" (0 V). The power supply potential supplying portion 170 sets the power supply potential Vga at "L" (−5 V). In response to this, the power supply line 200a on the circuit substrate 62 of the light emitting device 65 changes to "H" (0 V) as the reference potential Vsub, and the respective Vsub terminals of the light emitting chips C1 to C40 change to "H". Likewise, the power supply line 200b changes to "L" (−5 V) as the power supply potential Vga, and the respective Vga terminals of the light emitting chips C1 to C40 change to "L" (see FIG. 4B). Thus, the respective power supply lines 71 of the light emitting chips C1 to C40 change to "L" (see FIG. 5).

The transfer signal generating portion 120 of the signal generating circuit 110 sets each of the first transfer signal φ1 and the second transfer signal φ2 at "H" (0 V). In response to this, the first transfer signal line 201 and the second transfer signal line 202 change to "H" (see FIG. 4B). Thus, the respective φ1 terminals and the respective φ2 terminals of the light emitting chips C1 to C40 change to "H". The potentials of the first transfer signal lines 72 connected to the φ1 terminals through the current limiting resistors R1 also change to "H", and the potentials of the second transfer signal lines 73 connected to the φ1 terminals through the current limiting resistors R2 also change to "H" (see FIG. 5).

Further, the lighting signal generating portion 140 of the signal generating circuit 110 sets each of the lighting signals φI1 to φI40 at "H" (0 V). In response to this, the lighting signal lines 204-1 to 204-40 change to "H" (see FIG. 4B). Thus, the respective φI terminals of the light emitting chips C1 to C40 change to "H" through the current limiting resistors RI, and the potentials of the lighting signal lines 75 connected to the φ1 terminals also change to "H" (0 V) (see FIG. 5).

<Light Emitting Chip C1>

The anodes (p anode layer 85) of the setting thyristors S are connected to the cathodes (n cathode (clad) layer 83) of the laser diodes LD through the tunnel junction layer 84. The anodes (n anode (clad) layer 81) of the laser diodes LD are connected to the Vsub terminal set at "H".

The anodes (p anode layer 85) of the transfer thyristors T are connected to the cathodes (n cathode (clad) layer 83) of the lower diodes UD through the tunnel junction layer 84. The anodes (n anode (clad) layer 81) of the lower diodes UD are connected to the Vsub terminal set at "H".

The respective cathodes of the odd-numbered transfer thyristors T1, T3, T5, . . . are connected to the first transfer signal line 72 and set at "H" (0 V). The respective cathodes of the even-numbered transfer thyristors T2, T4, T6, . . . are connected to the second transfer signal line 73 and set at "H". Accordingly, each of the transfer thyristors T is in an OFF state because the anode and the cathode thereof are both "H". In addition, each of the lower diodes UD is also in an OFF state because the anode and the cathode thereof are both "H".

The cathode terminals of the setting thyristors S are connected to the lighting signal line 75 of "H" (0 V). Accordingly, each of the setting thyristors S is in an OFF state because the anode and cathode thereof are both "H". In addition, each of the laser diodes LD is also in an OFF state because the anode and the cathode thereof are both "H".

The gate Gt1 is connected to the cathode of the start diode SD, as described above. The gate Gt1 is connected to the power supply line 71 of the power supply potential Vga ("L" (−5 V)) through the power supply line resistor Rg1. The anode terminal of the start diode SD is connected to the second transfer signal line 73 to be connected to the φ2 terminal of "H" (0 V) through the current limiting resistor R2. Accordingly, the start diode SD is forward biased. The cathode (gate Gt1) of the start diode SD has a value (−1.5 V) obtained by subtracting the forward potential Vd (1.5 V) of the pn junction from the potential ("H" (0 V)) of the anode of the start diode SD. In addition, when the potential of the gate Gt1 is −1.5 V, the junction diode D1 is forward biased because the anode thereof (gate Gt1) is −1.5 V, and the cathode thereof is connected to the power supply line 71 ("L" (−5 V)) through the power supply line resistor Rg2. Thus, the potential of the gate Gt2 is −3 V which is obtained by subtracting the forward potential Vd (1.5 V) of the pn junction from the potential (−1.5 V) of the gate Gt1. Further, the junction diode D2 is forward biased because the anode thereof (gate Gt1) is −3 V, and the cathode thereof is connected to the power supply line 71 ("L" (−5 V)) through the power supply line resistor Rg2. Thus, the potential of the gate Gt3 is −4.5 V which is obtained by subtracting the forward potential Vd (1.5 V) of the pn junction from the potential (−3 V) of the gate Gt2. However, the gates Gt suffixed with numbers not smaller than 4 are not affected by the anode of the start diode SD that is "H" (0 V). The potentials of the gates Gt are "L" (−5 V) that is the potential of the power supply line 71.

Incidentally, the gates Gt are the gates Gs. Accordingly, each of the potentials of the gates Gs is equal to each of the potentials of the gates Gt. Thus, each of threshold voltages of the transfer thyristors T and the setting thyristors S has a value that is obtained by subtracting the forward potential Vd (1.5 V) of the pn junction from the potential of the gate Gt, Gs. That is, the threshold voltage of the transfer thyristor T1 or the setting thyristor S1 is −3 V. The threshold voltage of the transfer thyristor T2 or the setting thyristor S2 is −4.5 V. The threshold voltage of the transfer thyristor T3 or the setting thyristor S3 is −6 V. The threshold voltages of the transfer thyristors T or the setting thyristors S suffixed with the numbers not smaller than 4 are −6.5 V.

(2) Time Instant b

At the time instant b shown in FIG. 9, the first transfer signal φ1 shifts from "H" (0 V) to "L" (−5 V). Thus, the light emitting device 65 starts operation.

When the first transfer signal φ1 shifts from "H" to "L", the potential of the first transfer signal line 72 shifts from "H" (0 V) to "L" (−5 V) through the φ1 terminal and the current limiting resistor R1. Then, since the voltage applied to the transfer thyristor T1 is −3.3 V, the transfer thyristor T1 whose threshold voltage is −3 V turns ON. On this occasion, the current flows into the lower diode UD1 so that the lower diode UD1 shifts from the OFF state to an ON state. When the transfer thyristor T1 turns ON, the potential of the first transfer signal line 72 becomes a potential (negative potential larger in absolute value than 3.2 V) that is close to −3.2 V and obtained by subtracting the forward potential Vd (1.5 V) of the pn junction from the potential of the anode of the transfer thyristor T1 (−1.7 V that is a potential applied to the lower diode UD1).

Incidentally, the threshold voltage of the transfer thyristor T3 is −6 V. Each of the threshold voltages of the odd-numbered transfer thyristors T suffixed with the numbers not smaller than 5 is −6.5 V. The voltage applied to the transfer thyristor T3 and the odd-numbered transfer thyristors T suffixed with the numbers not smaller than 5 is −1.5 V obtained by adding a voltage of 1.7 V applied to the laser diode LD to −3.2 V. Accordingly, the transfer thyristor T3 and the odd-numbered transfer thyristors T suffixed with the numbers not smaller than 5 do not turn ON.

On the other hand, since the second transfer signal φ2 is "H" (0 V) and the second transfer signal line 73 is "H" (0 V), the odd-numbered transfer thyristors T cannot turn ON.

When the transfer thyristor T1 turns ON, the potential of the gate Gt1/Gs1 changes to "H" (0 V) which is the potential of the anode of the transfer thyristor T1. The potential of the gate Gt2 (gate Gs2) changes to −1.5 V. The potential of the gate Gt3 (gate Gs3) changes to −3 V. The potential of the gate Gt4 (gate Gs4) changes to −4.5 V. Each of the potentials of the gates Gt (gates GI) suffixed with the numbers not smaller than 5 changes to "L".

Thus, the threshold voltage of the setting thyristor S1 changes to −1.5 V. The threshold voltage of the transfer thyristor T2 or the setting thyristor S2 changes to −3 V. The threshold voltage of the transfer thyristor T3 or the setting thyristor S3 changes to −4.5 V. The threshold voltage of the transfer thyristor T4 or the setting thyristor S4 changes to −6 V. Each of the threshold voltages of the transfer thyristors T and the setting thyristors S suffixed with the numbers not smaller than 5 changes to −6.5 V.

However, since the first transfer signal line 72 has changed to −1.5 V due to the ON state of the transfer thyristor T1, the odd-numbered transfer thyristors T in the OFF state do not turn ON. Since the second transfer signal line 73 is "H" (0 V), the odd-numbered transfer thyristors T do not turn ON. Since the lighting signal line 75 is "H" (0 V), none of the laser diodes LD is lit.

Immediately after the time instant b (i.e. when the thyristors etc. are in a steady state after a change in the thyristors etc. has been made due to a change in the potential of the signal at the time instant b), the transfer thyristor T1 and the lower diode UD1 are in the ON state, but the other transfer thyristors T, the other lower diodes UD, the setting thyristors S and the light emitting diodes LED are in the OFF state.

(3) Time Instant c

At the time instant c, the lighting signal φI1 shifts from "H" (0 V) to "L" (−5 V).

When the lighting signal φI1 shifts from "H" to "L", the lighting signal line 75 shifts from "H" (0 V) to "L" (−5 V) through the current limiting resistor RI and the φI terminal. Then, −3.3 V which is obtained by adding the voltage of 1.7 V applied to the laser diode LD to −5 V is applied to the setting thyristor S1 so that the setting thyristor S1 whose threshold voltage is −1.5 V turns ON and the light diode LD1 is lit (emits light). Thus, the potential of the lighting signal line 75 changes to a potential close to −3.2 V. Incidentally, although the threshold voltage of the setting thyristor S2 is −3 V, the voltage applied to the setting thyristor S2 is −1.5 V that is obtained by adding the voltage of 1.7 V applied to the light emitting diode LED to −3.2 V. Accordingly, the setting thyristor S2 does not turn ON.

Immediately after the time instant c, the transfer thyristor T1, the lower diode UD1 and the setting thyristor S1 are in the ON state and the laser diode LD1 is lit (emits light).

(4) Time Instant d

At the time instant d, the lighting signal φI1 shifts from "L" (−5 V) to "H" (0 V). When the lighting signal φI1 shifts from "L" to "H", the potential of the lighting signal line 75 shifts from −3.2 V to "H" through the current limiting resistor RI and the φI terminal. In response to this, both the cathode of the setting thyristor S1 and the anode of the laser diode LD1 change to "H". Accordingly, the setting thyristor S1 turns OFF and the laser diode LD1 is lit off (non-lit). The lighting time of the laser diode LD1 corresponds to a time in which the lighting signal φI1 is "L" between the time instant c at which the lighting signal φI1 has shifted from "H" to "L" and the time instant d at which the lighting signal φI1 shifts from "L" to "H".

Immediately after the time instant d, the transfer thyristor T1 is in the ON state.

(5) Time Instant e

At the time instant e, the second transfer signal φ2 shifts from "H" (0 V) to "L" (−5 V). Here, the time T(1) for lighting control on the laser diode LD1 ends, and the time T(2) for lighting control on the laser diode LD2 starts.

When the second transfer signal φ2 shifts from "H" to "L", the potential of the second transfer signal line 73 shifts from "H" to "L" through the φ2 terminal. Since the threshold voltage of the transfer thyristor T2 is −3 V, as described above, the transfer thyristor T2 turns ON. On this occasion, the current also flows into the lower diode UD2 so that the lower diode UD2 shifts from the OFF state to an ON state.

Thus, the potential of the gate terminal Gt2 (gate terminal Gs2) changes to "H" (0 V). The potential of the gate terminal Gt3 (gate terminal Gs3) changes to −1.5 V. The potential of the gate terminal Gt4 (gate terminal Gs4) changes to −3 V. The potential of the gate terminal Gt4 (gate terminal Gs4) changes −4.5 V. Each of the potentials of the gate terminals Gt (gate terminals Gs) suffixed with numbers not smaller than 6 changes to −5 V.

Immediately after the time instant e, the transfer thyristors T1 and T2 and the lower diodes UD1 and UD2 are in the ON state.

(6) Time Instant f

At the time instant f, the first transfer signal φ1 shifts from "L" (−5 V) to "H" (0 V). When the first transfer signal φ1 shifts from "L" to "H", the potential of the first transfer signal line 72 shifts from "L" to "H" through the φ1 terminal. In response to this, the transfer thyristor T1 in the ON state turns OFF because both the anode and the cathode of the transfer thyristor T1 are "H". On this occasion, the lower diode UD1 shifts from the ON state to an OFF state because both the anode and the cathode of the lower diode UD1 are "H".

Then, the potential of the gate Gt1 (gate Gs1) changes toward the power supply potential Vga ("L" (−5 V)) of the power supply line 71 through the power supply line resistor Rg1. Thus, the junction diode D1 gets into a state (reversely biased) in which the potential is applied to a direction in which the current does not flow. Accordingly, the gate Gt1 (gate Gs1) is not affected by the gate Gt2 (gate Gs2) that is "H" (0 V). That is, the threshold voltage of each transfer thyristor T whose gate Gt is connected to a corresponding reversely biased junction diode D changes to −6.5 V. Accordingly, the transfer thyristor T does not turn ON even when the first transfer signal φ1 or the second transfer signal φ2 changes to "L" (−5 V).

Immediately after the time instant f, the transfer thyristor T2 and the lower diode UD2 are in the ON state.

(7) Others

When the lighting signal φI1 shifts from "H" (0 V) to "L" (−5 V) at a time instant g, the setting thyristor S2 turns ON and the laser diode LD2 is lit (emits light) in the same manner as the laser diode LD1 and the setting thyristor S1 at the time instant c.

When the lighting signal φI1 shifts from "L" (−5 V) to "H" (0 V) at a time instant h, the setting thyristor S2 turns OFF and the laser diode LD2 is lit off in the same manner as the laser diode LD1 and the setting thyristor S1 at the time instant d.

When the first transfer signal φ1 shifts from "H" (0 V) to "L" (−5 V) at the time instant i, the transfer thyristor T3 whose threshold voltage is −3 V turns ON in the same manner as the transfer thyristor T1 at the time instant b or the transfer thyristor T2 at the time instant e. At the time instant i, the time T(2) for lighting control on the laser diode DL2 ends, and the time T(3) for lighting control on the laser diode LD3 starts.

Then, the operations which have been described so far are repeated.

Incidentally, when the laser diode LD is not lit (does not emit light) but stays lit off (non-lit), the lighting signal φI may be kept at "H" (0 V) like the lighting signal φI1 indicated from a time instant j to the time instant k in the time T(4) for lighting control on the light emitting diode LED4 in FIG. 9. In this manner, the setting thyristor S4 does not turn ON and the light emitting diode LED4 stays lit off (non-lit) even when the threshold voltage of the setting thyristor S4 is −1.5 V.

As described above, the gate terminals Gt of the transfer thyristors T are connected to each other through the junction diodes D respectively. Accordingly, when the potential of one gate Gt changes, the potential of another gate Gt connected to the gate Gt whose potential has changed through a corresponding forward biased junction diode D changes. A threshold voltage of a transfer thyristor T having the gate whose potential has changed changes. When the threshold voltage of the transfer thyristor T is higher (a negative value smaller in absolute value) than −3.3 V, the transfer thyristor T turns ON at a timing when the first transfer signal ϕ1 or the second transfer signal ϕ2 shifts from "H" (0 V) to "L" (−5 V).

A setting thyristor S whose gate Gs is connected to the gate Gt of the transfer thyristor T which is in the ON state has a threshold voltage of −1.5 V. Accordingly, the setting thyristor S turns ON when the lighting signal ϕI shifts from "H" (0 V) to "Lo" (−5 V), and a laser diode LD connected in series with the setting thyristor S is lit (emits light).

That is, the laser diode LD serving as the lighting control target can be designated when the transfer thyristor T gets into the ON state. The lighting signal ϕI of "L" (−5 V) turns ON the setting thyristor S connected in series with the laser diode LD serving as the lighting control target, and lights the laser diode LD.

Incidentally, the lighting signal ϕI of "H" (0 V) keeps the setting thyristor S at an OFF state and keeps the laser diode LD at a non-lit state. That is, the lighting signal ϕI sets lighting/non-lighting of the laser diode LD.

Thus, the lighting signal ϕI is set in accordance with image data to thereby control lighting or non-lighting of the respective laser diodes LD.

(Manufacturing Method of Light Emitting Chip C)

A manufacturing method of the light emitting chip C will be described.

Figure 10A:
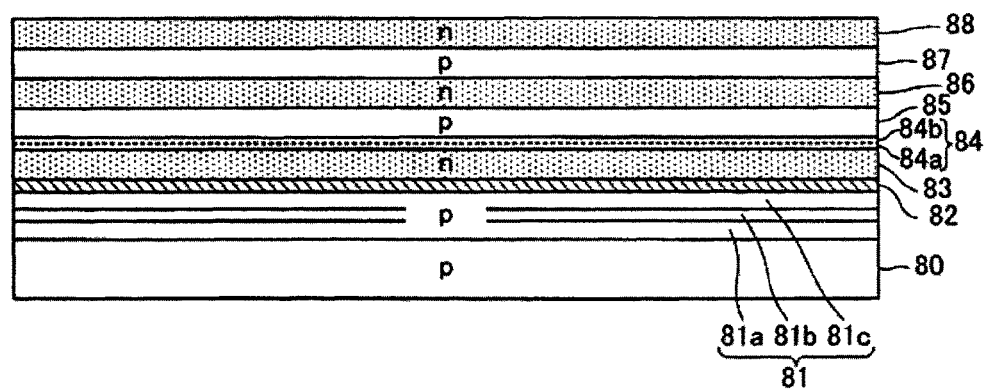
FIG. 10A A view showing a step of forming a semiconductor laminate in a manufacturing method of the light emitting chip.
Figure 10B:
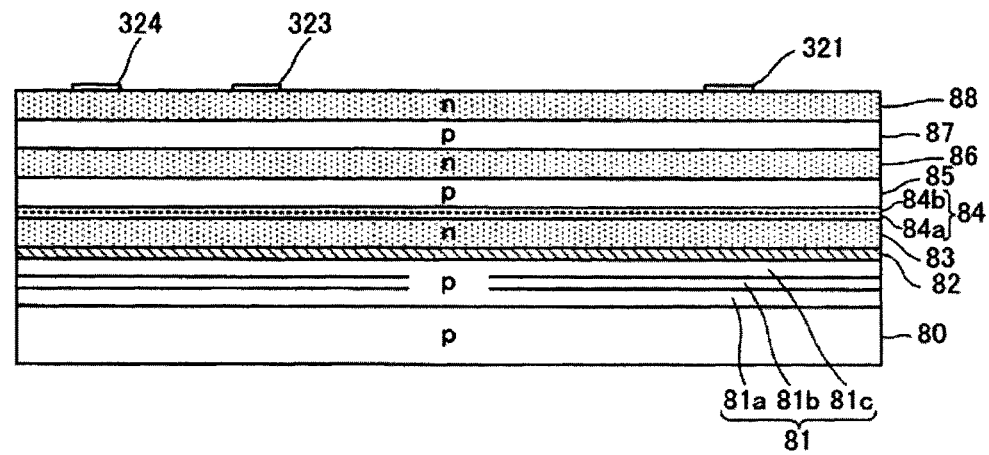
FIG. 10B A view showing a step of forming n ohmic electrodes in the manufacturing method of the light emitting chip.
Figure 10C:
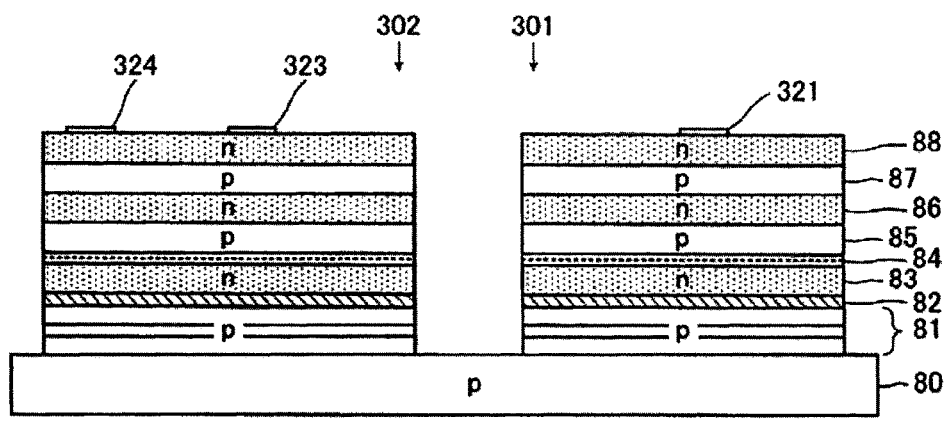
FIG. 10C A view showing a step of separating the semiconductor laminate in the manufacturing method of the light emitting chip.
Figure 11D:
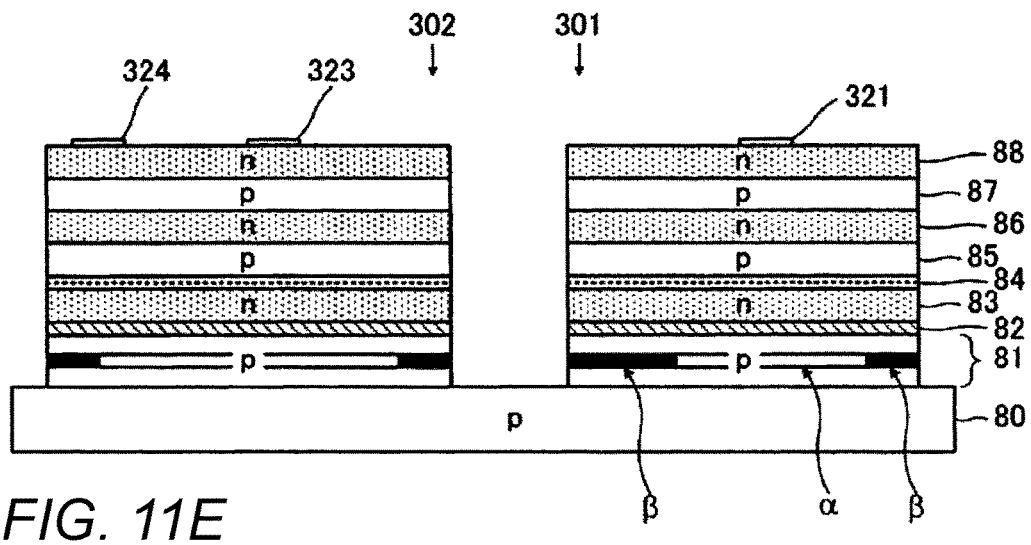
FIG. 11D A view showing a step of forming current blocking portions in the manufacturing method of the light emitting chip.
Figure 11E:
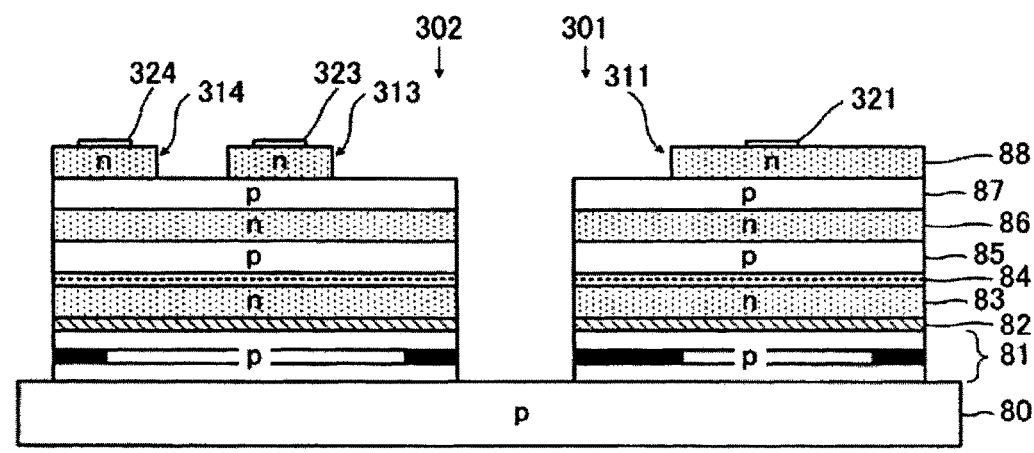
FIG. 11E A view showing an etching step for exposing a p gate layer in the manufacturing method of the light emitting chip.
Figure 11F:
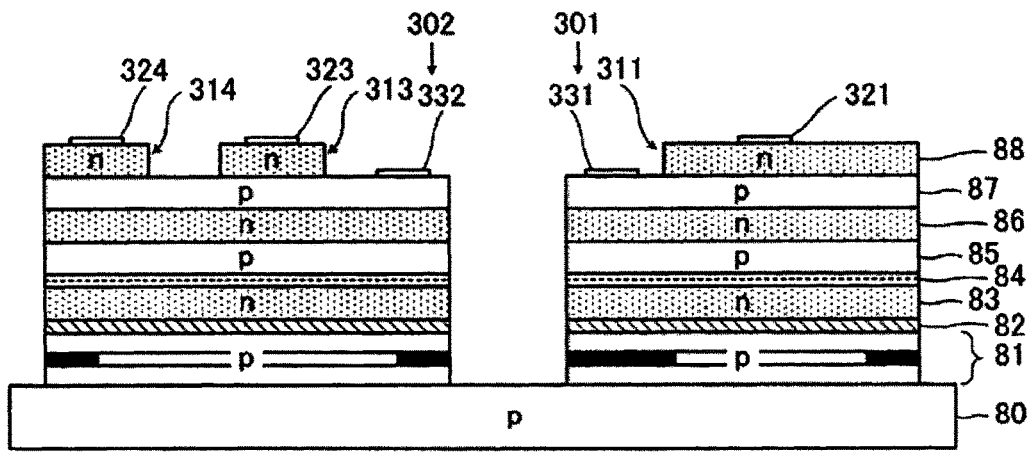
FIG. 11F A view showing a step of forming p ohmic electrodes in the manufacturing method of the light emitting chip.
Figure 12G:
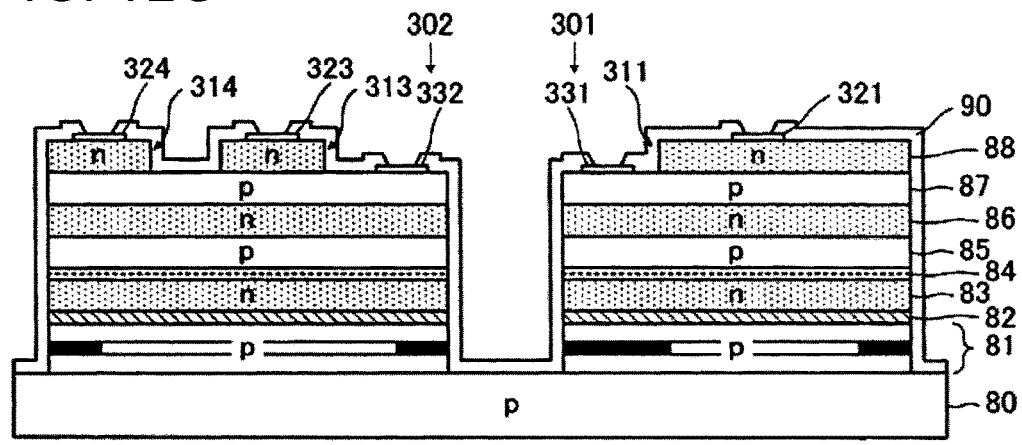
FIG. 12G A view showing a step of forming a protective layer in the manufacturing method of the light emitting chip.
Figure 12H:
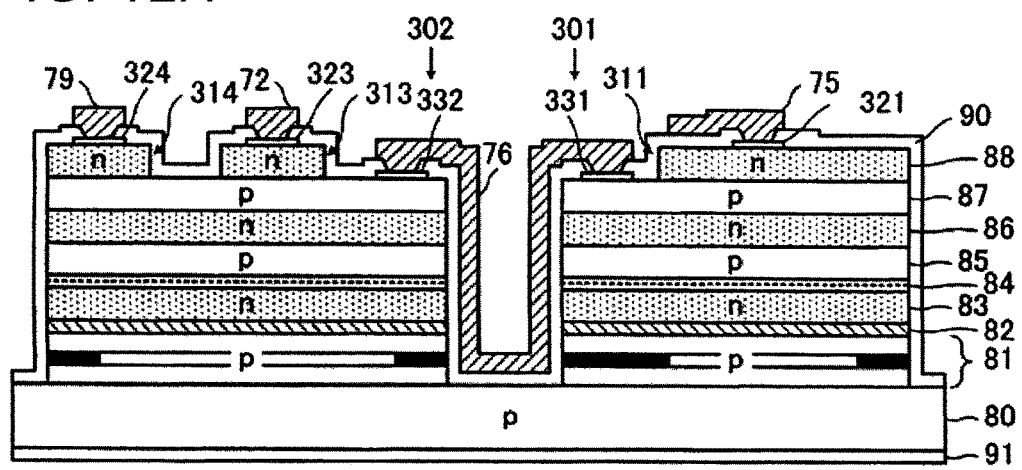
FIG. 12H A view showing a step of forming wirings and a back electrode in the manufacturing method of the light emitting chip.
Figure 12I:
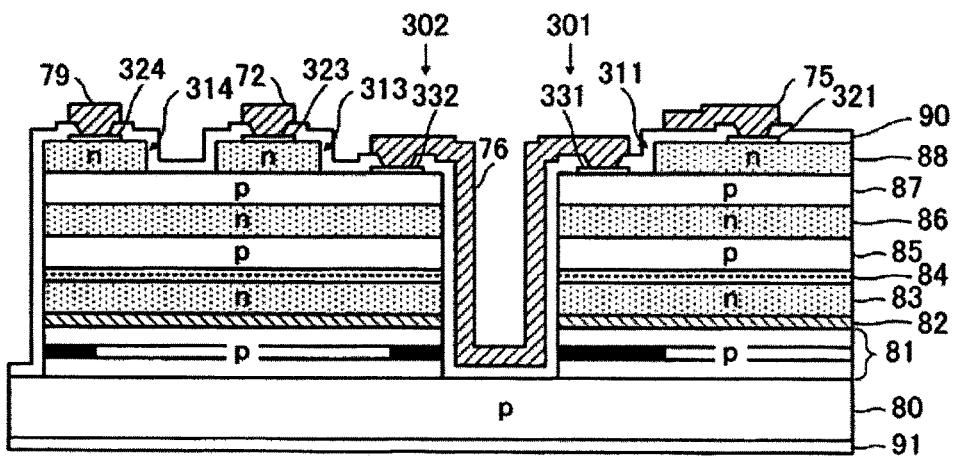
FIG. 12I A view showing a step of forming a light emission surface in the manufacturing method of the light emitting chip.

FIG. 10A to FIG. 12I are views for explaining the manufacturing method of the light emitting chip C. FIG. 10A is a step of forming a semiconductor laminate. FIG. 10B is a step of forming n ohmic electrodes (n ohmic electrodes 321, 323, 324, etc.). FIG. 10C is a step of separating the semiconductor laminate. FIG. 11D is a step of forming current blocking portions β. FIG. 11E is an etching step for exposing a p gate layer 87. FIG. 11F is a step of forming p ohmic electrodes (p ohmic electrodes 331, 332, etc.). FIG. 12G is a step of forming a protective layer 90. FIG. 12H is a step of forming wirings (a power supply line 71, a first transfer signal line 72, a second transfer signal line 73, a lighting signal line 75, etc.) and a back electrode 91. FIG. 12I is a step of forming a light emission surface.

Description will be made here in accordance with the sectional view of the islands 301 and 302 shown in FIG. 7. These islands are shown in the sectional view that is taken along the line VIB-VIB of FIG. 6A but seen from an opposite side to FIG. 6B. Incidentally, the same thing will be also applied to other islands. In addition, electrically conductive types (p, n) of impurities will be denoted.

Description will be made sequentially as follows.

In the step of forming the semiconductor laminate, as shown in FIG. 10A, a p anode (clad) layer 81, a light emitting layer 82, an n cathode (clad) layer 83, a tunnel junction layer 84, a p anode layer 85, an n gate layer 86, the p gate layer 87, and an n cathode layer 88 are epitaxially grown sequentially on a p-type substrate 80 to thereby form the semiconductor laminate. Here, the p anode (clad) layer 81, the light emitting layer 82 and the n cathode (clad) layer 83 are an example of a first semiconductor laminate part forming light emitting elements. In addition, the p anode layer 85, the n gate layer 86, the p gate layer 87, and the n cathode layer 88 provided on the tunnel junction layer 84 are an example of a second semiconductor laminate part forming a driving portion 101 including thyristors (setting thyristors S, transfer thyristors T). Incidentally, the substrate and the semiconductor laminate epitaxially grown on the substrate are an example of a semiconductor laminate substrate.

The substrate 80 will be described here using p-type GaAs as an example. Alternatively, n-type GaAs or intrinsic (i) GaAs not doped with any impurity may be used. Moreover, a semiconductor substrate made of InP, GaN, InAs or any other group III-V or II-VI material, sapphire, Si, Ge, etc. may be used. When the substrate is changed, a material substantially matching (including a strain structure, a strain relaxing layer and metamorphic growth) with a lattice constant of the substrate is used as a material to be laminated monolithically on the substrate. For example, InAs, InAsSb, GaInAsSb, etc. is used on an InAs substrate. InP, InGaAsP, etc. is used on an InP substrate. GaN, AlGaN or InGaN is used on a GaN substrate or a sapphire substrate. Si, SiGe, GaP, etc. is used on an Si substrate. When the semiconductor material is pasted on another support substrate after crystal growth, the semiconductor material does not have to be substantially lattice-matched with the other support substrate.

The p anode (clad) layer 81 has a configuration in which a lower p anode (clad) layer 81a, a current narrowing layer 81b, and an upper p anode (clad) layer 81c are laminated sequentially.

The lower p (clad) layer 81a and the upper p (clad) layer 81c of the p anode (clad) layer 81 are, for example, made of p-type Al$_{0.9}$GaAs doped with an impurity concentration of $5 \times 10^{17}$/cm$^3$. The Al composition may be changed in a range of 0 to 1. Incidentally, GaInP etc. may be used alternatively.

The current narrowing layer 81b is, for example, made of p-type AlGaAs doped with a high impurity concentration of AlAs or Al. Any material may be used as long as the material contains Al that is oxidized to form Al$_2$O$_3$ to thereby increase electric resistance and narrow a current path.

The light emitting layer 82 has a quantum well structure in which well (well) layers and barrier (barrier) layers are laminated alternately. Each of the well layers is, for example, made of GaAs, AlGaAs, InGaAs, GaAsP, AlGaInP, GaInAsP, GaInP, etc. Each of the barrier layers is made of AlGaAs, GaAs, GaInP, GaInAsP, etc. Incidentally, the light emitting layer 82 may be formed as a quantum line (quantum wire) or a quantum box (quantum dot).

The n cathode (clad) layer 83 is, for example, made of n-type Al$_{0.9}$GaAs doped with an impurity concentration of $5 \times 10^{17}$/cm$^3$. The Al composition may be changed in a range of 0 to 1. Incidentally, GaInP etc. may be used alternatively.

The tunnel junction layer 84 is constituted by a junction between an n$^{++}$ layer 84a doped with a high concentration of n-type impurities, and a p$^{++}$ layer 84b doped with a high concentration of n-type impurities (see FIG. 10B). Each of the n$^{++}$ layer 84a and the p$^{++}$ layer 84b has, for example, an impurity concentration as high as $1 \times 10^{20}$/cm$^3$. Incidentally, an impurity concentration of an ordinary junction ranges from the order of $10^{17}$/cm$^3$ to the order of $10^{18}$/cm$^3$. Combinations of the n$^{++}$ layer 84a and the p$^{++}$ layer 84b (hereinafter denoted as n$^{++}$ layer 84a/p$^{++}$ layer 84b) are, for example, made of n$^{++}$GaInP/p$^{++}$GaAs, n$^{++}$GaInP/p$^{++}$AlGaAs, n$^{++}$GaAs/p$^{++}$GaAs, n$^{++}$AlGaAs/p$^{++}$AlGaAs, n$^{++}$InGaAs/p$^{++}$InGaAs, n$^{++}$GaInAsP/p$^{++}$GaInAsP, and n$^{++}$GaAsSb/p$^{++}$GaAsSb. Incidentally, the combinations may be changed from one to another.

The p anode layer 85 is, for example, made of p-type Al$_{0.9}$GaAs doped with an impurity concentration of $1 \times 10^{18}$/cm$^3$. The Al composition may be changed in a range of 0 to 1. Incidentally, GaInP etc. may be used alternatively.

The n gate layer 86 is, for example, made of n-type $Al_{0.9}GaAs$ doped with an impurity concentration of $1\times10^{17}/cm^3$. The Al composition may be changed in a range of 0 to 1. Incidentally, GaInP etc. may be used alternatively.

The p gate layer 87 is, for example, made of p-type $Al_{0.9}GaAs$ doped with an impurity concentration of $1\times10^{17}/cm^3$. The Al composition may be changed in a range of 0 to 1. Incidentally, GaInP etc. may be used alternatively.

The n cathode layer 88 is, for example, made of n-type $Al_{0.9}GaAs$ doped with an impurity concentration of $1\times10^{18}/cm^3$. The Al composition may be changed in a range of 0 to 1. Incidentally, GaInP etc. may be used alternatively.

These semiconductor layers are laminated, for example, by metal organic chemical vapor deposition (MOCVD), molecular beam epitaxy (MBE), etc. so that the semiconductor laminate is formed.

In the step of forming the n ohmic electrodes (n ohmic electrodes 321, 323, 324, etc.), as shown in FIG. 10B, first, the n ohmic electrodes 321, 323, 324, etc. are formed on the n cathode layer 83.

The n ohmic electrodes 321, 323, 324, etc. are made of Au containing Ge (AuGe) etc. which can easily make ohmic contact with an n-type semiconductor layer such as the n cathode layer 88.

The n ohmic electrodes 321, 323, 324, etc. are formed, for example, by a lift-off method etc.

In the step of separating the semiconductor laminate, as shown in FIG. 10C, the n cathode layer 88, the p gate layer 87, the n gate layer 86, the p anode layer 85, the tunnel junction layer 84, the n cathode layer 83, the light emitting layer 82, and the p anode layer 81 are etched sequentially to be separated into islands such as islands 301, 302, etc. The etching may be performed by wet etching using a sulfuric acid-based etching solution (sulfuric acid:hydrogen peroxide water:water=1:10:300 in weight ratio) etc., or may be performed, for example, by anisotropic dry etching (RIE) using boron chloride etc. The etching in the step of separating the semiconductor laminate may be called mesa etching or post etching.

In the next step of forming the current blocking portions β, as shown in FIG. 11D, the current narrowing layer 81b whose side surfaces have been exposed due to the step of separating the semiconductor laminate is oxidized from the side surfaces so that the current blocking portions β blocking a current are formed. The remaining portions which are unoxidized serve as current passing portions α.

The oxidation of the current narrowing layer 81b is performed by oxidizing Al of the current narrowing layer 81b, for example, by steam oxidation at 300 to 400° C. The current narrowing layer 81b is made of AlAs, AlGaAs etc. On this occasion, the oxidation proceeds from the exposed side surfaces so that the current blocking portions β formed out of $Al_2O_3$ which is an oxide of Al are formed around the islands such as the islands 301, 302, etc. The unoxidized portions of the current narrowing layer 81b serve as the current passing portions α. Incidentally, FIGS. 11D to 12I illustrate that the current blocking portions β have different distances from the side surfaces of the islands. This is for convenience of the illustration. Since the oxidation proceeds the same distance from the side surfaces of the islands such as the islands 301, 302, etc., the current blocking portions 13 formed thus have the same distance from the side surfaces of the islands.

Incidentally, the current blocking portions β may be formed by implanting hydrogen ions ($H^+$) into a semiconductor layer of GaAs, AlGaAs, etc. in place of use of the semiconductor layer of AlAs etc. having a large composition ratio of Al ($H^+$ ion implantation). That is, a p anode (clad) layer 81 in which the lower p anode (clad) layer 81a and the upper p anode (clad) layer 81c are not divided but integrated without using the current narrowing layer 81b may be formed, and $H^+$ may be implanted into portions which should be used as the current blocking portions β. In this manner, impurities are made inactive so that the current blocking portions β with high electric resistances can be formed.

In the etching step for exposing the p gate layer 87, as shown in FIG. 11E, the n cathode layer 88 is etched to expose the p gate layer 87.

The etching may be performed by wet etching using a sulfuric acid-based etching solution (sulfuric acid:hydrogen peroxide water:water=1:10:300 in weight ratio), or may be performed, for example, by anisotropic dry etching using boron chloride.

In the step of forming the p ohmic electrodes (the p ohmic electrodes 331, 332, etc.), as shown in FIG. 11F, the p ohmic electrodes 331, 332, etc. are formed on the p gate layer 87.

The p ohmic electrodes 331, 332, etc. are made of Au containing Zn (AuZn) etc. which can easily make ohmic contact with a p-type semiconductor layer such as the p gate layer 87.

The p ohmic electrodes 331, 332, etc. are formed, for example, by a lift-off method etc.

In the step of forming the protective layer 90, as shown in FIG. 12G, the protective layer 90 that is, for example, made of an insulating material such as $SiO_2$, SiON, SiN, etc. is provided to cover front surfaces of the islands 301, 302, etc.

Through holes (openings) are provided in the protective layer 90 on the n ohmic electrodes 321, 323, 324, etc. and the p ohmic electrodes 331, 332, etc.

In the step of forming the wirings (the power supply line 71, the first transfer signal line 72, the second transfer signal line 73, the lighting signal line 75, etc.) and the back electrode 91, as shown in FIG. 12H, the wirings (the power supply line 71, the first transfer signal line 72, the second transfer signal line 73, the lighting signal line 75, etc.) are formed to be connected with the n ohmic electrodes 321, 323, 324, etc. and the p ohmic electrodes 331, 332, etc. through the through holes provided in the protective layer 90.

The wirings are made of Al, Au, etc.

In the step of forming the light emission surface, as shown in FIG. 12I, the substrate 80 and the semiconductor laminate are cleaved in the portion of the island 301 where the laser diode LD has been formed in order to emit light from the laser diode LD.

On this occasion, the cleavage is performed so as to exclude the current blocking portions β in a light emission direction from the laser diode LD.

In the light emitting chip C according to the first exemplary embodiment, as described above, the laser diodes LD and the setting thyristors S are laminated on each other respectively. Thus, the light emitting chip C is of a self-scanning type using the transfer thyristors T and the setting thyristors S to light on the laser diodes LD sequentially. Thus, the number of terminals provided in the light emitting chip C can be reduced, and the size of the light emitting chip C and the size of the light emitting device 65 can be reduced.

The setting thyristors S may be not provided on the laser diodes LD, but the setting thyristors S may be used as laser thyristors (light emitting elements). That is, the p anode (clad) layer 81, the light emitting layer 82 and the n cathode (clad) layer 83 constituting the laser diodes LD and the lower diodes UD are not provided.

In this case, driving characteristics and light emission characteristics cannot be set separately (individually). Therefore, it is difficult to attain an increase in driving speed, light output and efficiency and reduction in power consumption, cost etc.

On the other hand, in the first exemplary embodiment, light emission is performed by the laser diodes LD and transfer is performed by the transfer thyristors T and the setting thyristors S, so that the light emission and the transfer are performed separately from each other. The setting thyristors S do not have to emit light. Accordingly, the light emission characteristics etc. can be improved by the laser diodes LD formed into the quantum well structure, and the driving characteristics etc. performed by the transfer thyristors T and the setting thyristors S can be improved. That is, the laser diodes LD of the light emitting portion 102 and the transfer thyristors T and the setting thyristors S of the driving portion 101 can be set separately (independently). Thus, it is easy to attain increase in driving speed, increase in light output, increase in efficiency, reduction in power consumption, reduction in cost, etc.

In addition, in the first exemplary embodiment, each laser diode LD and each setting thyristor S are laminated through the tunnel junction layer 84. In this case, the laser diode LD is reversely biased in the tunnel junction layer 84. However, the tunnel junction layer 84 has a characteristic in which the current flows through the tunnel layer 84 even in the reversely biased state.

Incidentally, when the tunnel junction layer 84 is not provided, a junction between the laser diode LD and the setting thyristor S is reversely biased. Therefore, a voltage for breaking down the reversely biased junction is applied between the laser diode LD and the setting thyristor S in order to make the current flow therebetween. That is, the driving voltage is higher.

That is, due to the laser diode LD and the setting thyristor S that are laminated through the tunnel junction layer 84, the driving voltage can be suppressed in comparison with the case where the tunnel junction layer 84 is not provided between the laser diode LD and the setting thyristor S.

Further, the tunnel junction layer 84 has a high impurity concentration, as described above. For example, the impurity concentration of the tunnel junction layer 84 is $10^{19}/cm^3$ that is higher than an impurity concentration of $10^{17}$ to $10^{18}/cm^3$ of any other layer. Si used as the impurities varies in lattice constant, bonding strength, the number of peripheral electrons, etc. from GaAs that is an example of a base semiconductor material. Accordingly, when, for example, a semiconductor layer of GaAs etc. is grown on the tunnel junction layer 84, defects are generated easily. The probability of generation of the defects increases as the impurity concentration is higher. The defects are propagated to the semiconductor layer formed thereon.

In addition, like the tunnel junction layer 84, the semiconductor layer has no choice but to be grown at low temperature in order to make the impurity concentration higher than that of any other layer. That is, the growth conditions (temperature, growth speed, ratio) have to be changed. Therefore, the semiconductor layer provided on the tunnel junction layer 84 diverges from most suitable growth conditions.

As a result, the semiconductor layer provided on the tunnel junction layer 84 contains lots of the defects.

Particularly, light emission characteristics of the light emitting elements such as the laser diodes LD are apt to be affected by the defects contained in the semiconductor layer. On the other hand, the thyristors (setting thyristors S, transfer thyristors T) may turn ON to supply a current to the laser diodes LD or the lower diodes. That is, the thyristors (setting thyristors S, transfer thyristors T) are difficult to be affected by the defects.

To solve this problem, in the first exemplary embodiment, the laser diodes LD and the lower diodes UD are provided on the substrate 80, and the setting thyristors S and the transfer thyristors T are provided thereon through the tunnel junction layer 84. Thus, generation of the defects in the laser diodes LD and the lower diodes UD, particularly in the laser diodes LD is suppressed so that the light emission characteristics can be difficult to be affected by the defects. In addition, the setting thyristors S or the transfer thyristors T are epitaxially grown to be laminated monolithically.

<Metallic Electrically Conductive Group III-V Compound layer>

In the aforementioned light emitting chip C, the setting thyristors S and the transfer thyristors T are laminated on the laser diodes LD and the lower diodes UD respectively through the tunnel junction layer 84.

A group III-V compound layer that has metallic electrical conductivity and that is epitaxially grown on a group III-V compound semiconductor layer may be used in place of the tunnel junction layer 84. In this case, the "tunnel junction layer 84" in the aforementioned description may be replaced by any of "metallic electrically conductive group III-V compound layers 84" that will be described below.

Figure 13A:
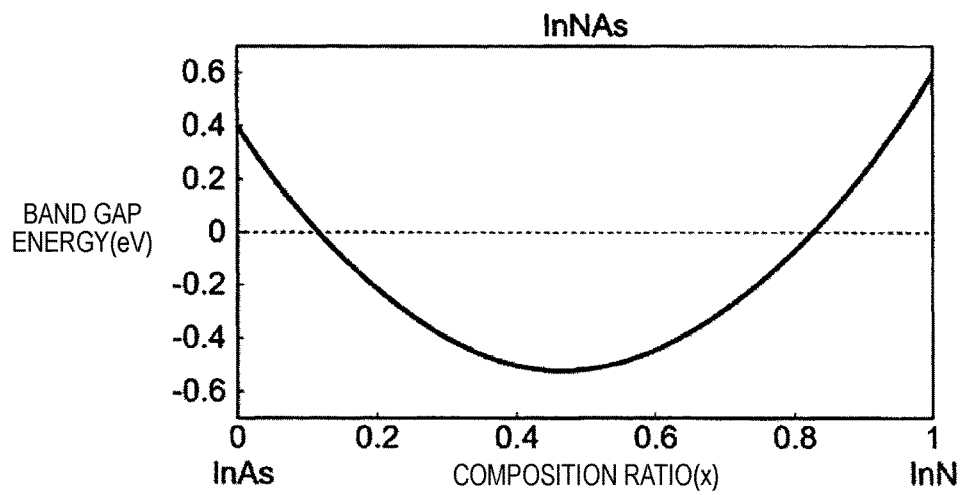
FIG. 13A A graph showing a band gap versus an InN composition ratio x of a material InNAs forming a metallic electrically conductive group III-V compound layer.
Figure 13B:
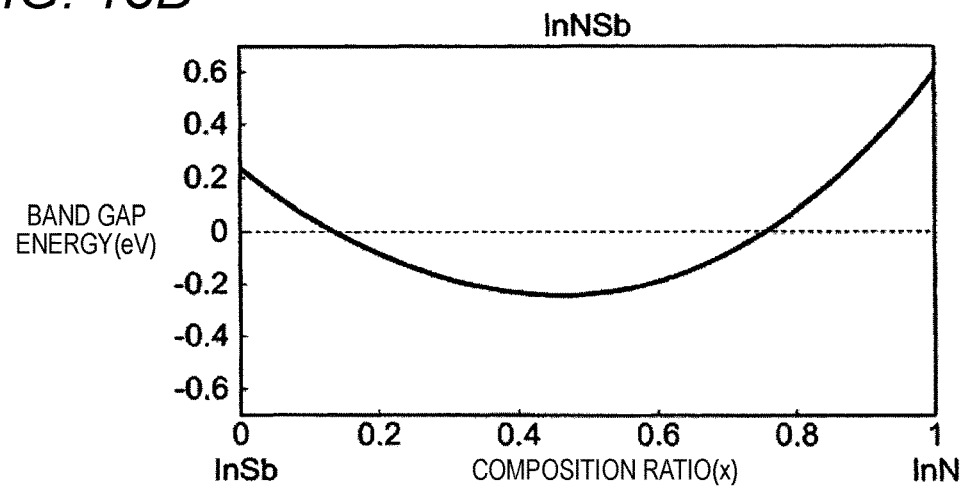
FIG. 13B A graph showing a band gap versus an InN composition ratio x of InNSb.
Figure 13C:
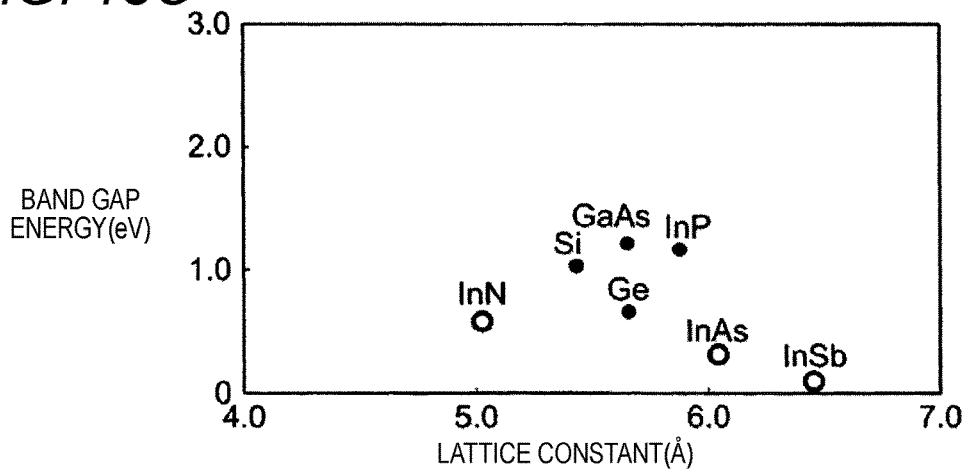
FIG. 13C A graph showing lattice constants versus band gaps of group VI elements and group III-V compounds.

FIGS. 13A to 13C are graphs for explaining materials forming the metallic electrically conductive group III-V compound layers. FIG. 13A is a graph showing a band gap versus an InN composition ratio x of InNAs. FIG. 13B is a graph showing a band gap versus an InN composition ratio x of InNSb. FIG. 13C is a graph showing lattice constants versus band gaps of group VI elements and group III-V compounds.

FIG. 13A shows band gap energy (eV) of InNAs that is a compound made of a composition ratio x (x=0 to 1) of InN and a composition ratio (1−x) of InAs.

FIG. 13B shows band gap energy (eV) of InNSb that is a compound made of a composition ratio x (x=0 to 1) of InN and a composition ratio (1−x) of InSb.

It has been known that each of InNAs and INSb described as examples of the materials of the metallically conductive group III-V compound layers has negative band gap energy in a certain range of the composition ratio x, as shown in FIG. 13A or FIG. 13B. When the band gap energy is negative, it means that InNAs or InNSb does not have any band gap. Accordingly, InNAs or InNSb exhibits the same electrical conduction characteristic (conduction characteristic) as metal. That is, the metallic electrical conduction characteristic (electrical conductivity) means that the current flows when the potential has a gradient in the same manner as metal.

As shown in FIG. 13A, the band gap energy of InNAs is negative in a range in which, for example, the composition ratio x of InN is about 0.1 to about 0.8.

As shown in FIG. 13B, the band gap energy of InNSb is negative in a range in which, for example, the composition ratio x of InN is about 0.2 to about 0.75.

That is, InNAs and InNSb exhibit the metallic electrical conduction characteristic (electrical conductivity) in the aforementioned ranges.

Incidentally, in a region where the band gap energy of InNAs or InNSb is small and out of the aforementioned range corresponding thereto, electrons have energy due to thermal energy so that the electrons can migrate across the band gap. Each InNAs and InNSb has a characteristic that the current is apt to flow therein when the band gap energy is negative or when the potential has a gradient in the same manner as metal.

Even when Al, Ga, Ag, P, etc. is contained in InNAs or InNSb, the band gap energy can be kept in the vicinity of 0 or at a negative level depending on its composition. Thus, the current flows as long as the potential has a gradient.

Further, as shown in FIG. 13C, lattice constants of group III-V compounds (semiconductors) such as GaAs, InP, etc. are in a range of 5.6 Å to 5.9 Å. Each of the lattice constants is close to the lattice constant of Si that is about 5.43 Å, or the lattice constant of Ge that is about 5.66 Å.

On the other hand, in the same manner, the lattice constant of InN that is a group III-V compound is about 5.0 Å in a sphalerite type structure, and the lattice constant of InAs is about 6.06 Å. Accordingly, the lattice constant of InNAs that is a compound of InN and InAs can be a value close to 5.6 Å to 5.9 Å of GaAs etc.

In addition, the lattice constant of InSb that is a group III-V compound is about 6.48 Å. Accordingly, since the lattice constant of InN is about 5.0 Å, the lattice constant of InNSb that is a compound of InSb and InN can be a value close to 5.6 Å to 5.9 Å of GaAs etc.

That is, InNAs and InNSb can be epitaxially grown monolithically on a group III-V compound (semiconductor) layer of GaAs etc. In addition, a group III-V compound (semiconductor) layer of GaAs etc. can be monolithically laminated on the InNAs or InNSb layer by epitaxial growth.

Accordingly, when each of the laser diodes LD and each of the setting thyristors S are laminated on each other through the metallic electrically conductive group III-V compound layer by which the tunnel junction layer 84 is replaced so that the laser diode LD and the setting thyristor S are connected in series, reverse bias between the n cathode (clad) layer 83 of the laser diode LD and the p anode layer 85 of the setting thyristor S can be suppressed.

Incidentally, the band gap of the metallic electrically conductive group III-V compound layer made of InNAs, InNSb, or the like, is theoretically negative. Growth of InNAs, InNSb, or the like is more difficult than that of GaAs, InP, or the like so that the quality of the metallic electrically conductive group III-V compound layer made of InNAs, InNSb, or the like, is inferior. Particularly, when the N composition is made larger, the difficulty of growth increases remarkably. Accordingly, when, for example, a semiconductor layer of GaAs or the like is grown on the metallic electrically conductive group III-V compound layer, defects are apt to be generated.

As described above, the light emission characteristics of the light emitting elements such as the laser diodes LD are apt to be affected by the defects included in the semiconductor layer. On the other hand, the thyristors (setting thyristors S, transfer thyristors T) may turn ON to supply a current to the laser diodes LD or the lower diodes. That is, the thyristors (setting thyristors S, transfer thyristors T) are difficult to be affected by the defects.

To solve this problem, the laser diodes LD and the lower diodes UD may be provided on the substrate 80, and the setting thyristors S and the transfer thyristors T may be provided thereon through the metallic electrically conductive group III-V compound layer like the tunnel junction layer 84. Thus, generation of the defects in the laser diodes LD and the lower diodes UD, particularly in the laser diodes LD can be suppressed so that the light emission characteristics can be difficult to be affected by the defects. In addition, the setting thyristors S or the transfer thyristors T may be laminated monolithically.

<Voltage Reducing Layer 89>

In addition, in the aforementioned light emitting chip C, the setting thyristors S and the transfer thyristors T are laminated on the laser diodes LD and the lower diodes UD respectively through the tunnel junction layer 84. Accordingly, the absolute value of the voltage used for the power supply potential Vga, the first transfer signal φ1, the second transfer signal φ2 and the lighting signal φ1 is larger. As described above, "L" (−5 V) is used.

Therefore, in order to reduce the absolute value of the voltage used for the power supply potential Vga, the first transfer signal φ1, the second transfer signal φ2 and the lighting signal φI, a voltage reducing layer 89 that reduces the voltage to be applied to the thyristors (setting thyristors S, transfer thyristors T) may be used.

Figure 14:
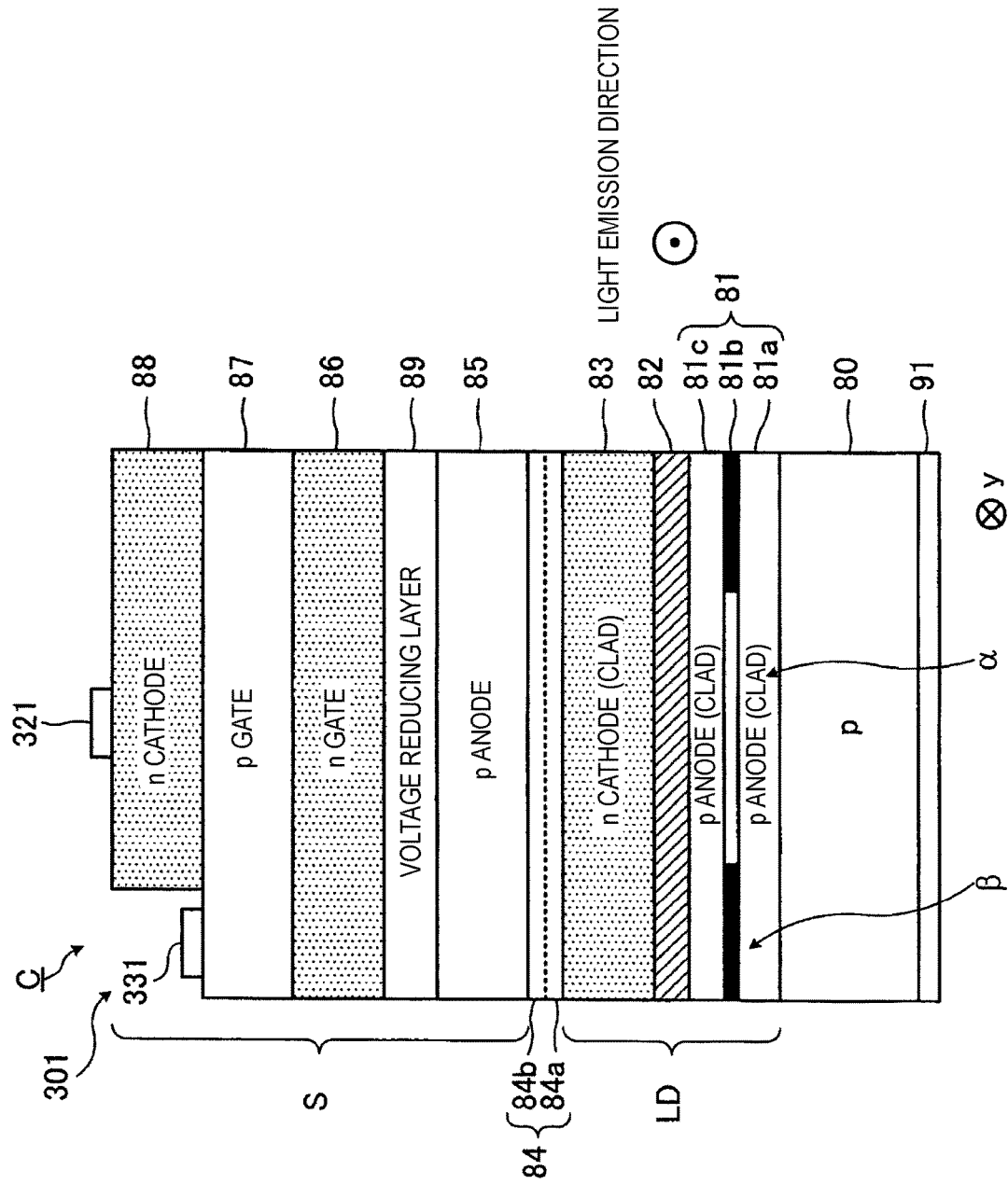
FIG. 14 An enlarged sectional view of an island in which a laser diode and a setting thyristor provided with a voltage reducing layer are laminated on each other.

FIG. 14 is an enlarged sectional view of an island 301 in which a laser diode LD and a setting thyristor S provided with the voltage reducing layer 89 are laminated on each other. FIG. 14 is equivalent to FIG. 7 to which the voltage reducing layer 89 is added. Accordingly, the same portions as those in FIG. 7 will be referred to by the same signs correspondingly and respectively, and description thereof will be omitted. Only the different portion from that in FIG. 7 will be described.

The voltage reducing layer 89 is provided between a p anode layer 85 and an n gate layer 86 of the setting thyristor S. Incidentally, the same thing is also applied to a transfer thyristor T.

The voltage reducing layer 89 may serve as a portion of the p anode layer 85 to be of the p-type with the same impurity concentration as the p anode layer 85, or may serve as a portion of the n gate layer 86 to be of the n-type with the same impurity concentration as the n gate layer 86. In addition, the voltage reducing layer 89 may be of an i-type.

The role of the voltage reducing layer 89 in the setting thyristor S or the transfer thyristor T will be generalized and described as a thyristor.

Figure 15A:
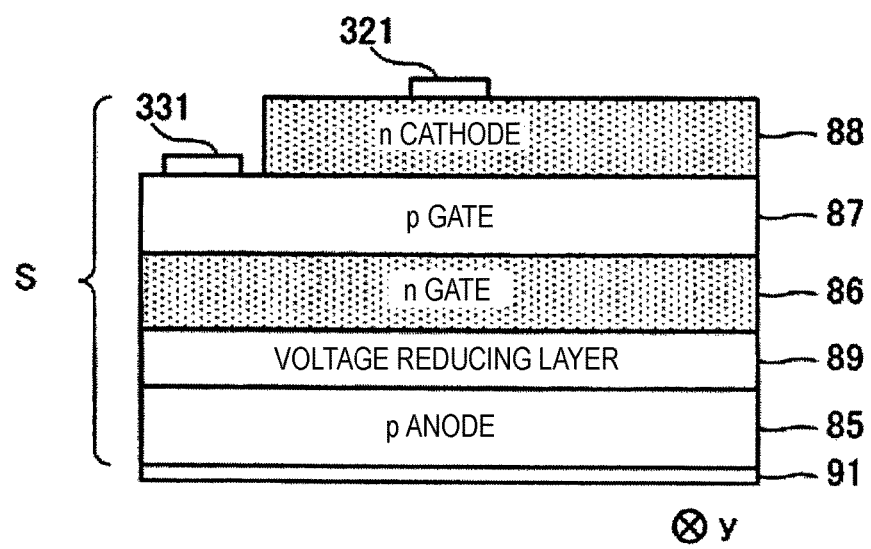
FIG. 15A A sectional view of a thyristor provided with a voltage reducing layer.
Figure 15B:
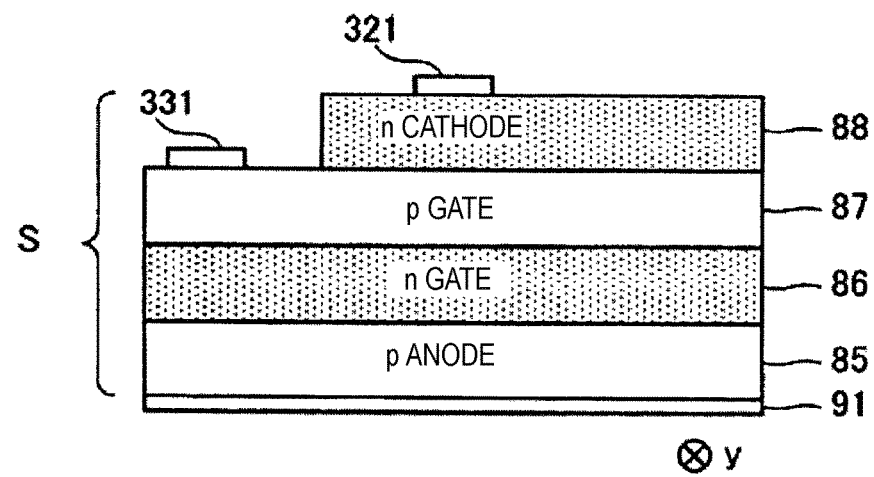
FIG. 15B A sectional view of a thyristor not provided with a voltage reducing layer.
Figure 15C:
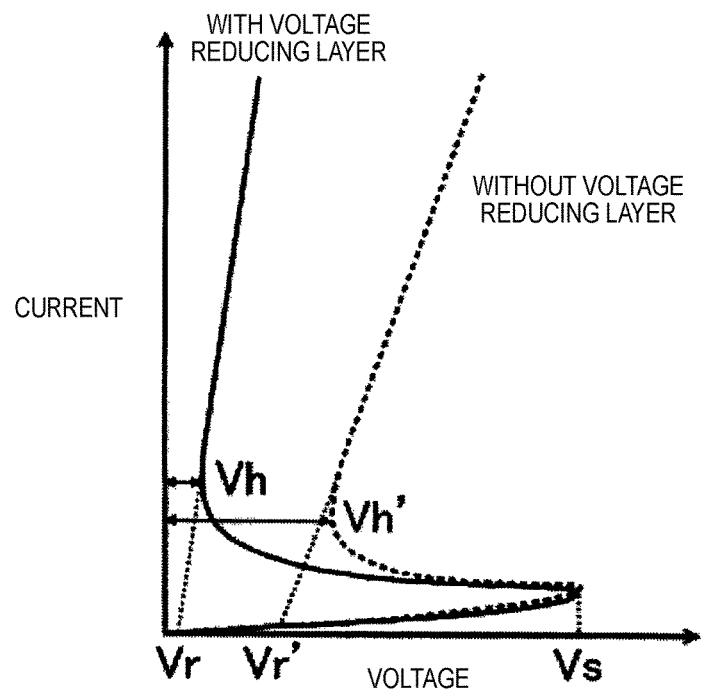
FIG. 15C A graph showing characteristics of the thyristors.

FIGS. 15A to 15C are views for explaining structures of thyristors and characteristics of the thyristors. FIG. 15A is a sectional view of the thyristor provided with the voltage reducing layer 89. FIG. 15B is a sectional view of the thyristor not provided with the voltage reducing layer 89. FIG. 15C is a graph showing the characteristics of the thyristors. Each of FIGS. 15A and 15B is equivalent, for example, to the section of the setting thyristor S that is not laminated on the laser diode LD. Accordingly, the back electrode 91 is provided on a back surface of a p anode layer 85.

As shown in FIG. 15A, the thyristor has the voltage reducing layer 89 provided between the p anode layer 85 and an n gate layer 86. Incidentally, when the voltage reducing layer 89 is of the p-type doped with the same impurity concentration as the p anode layer 85, the voltage reducing layer 89 functions as a portion of the p anode layer 85. When the voltage reducing layer 89 is of the n-type doped with the same impurity concentration as the n gate layer 86, the voltage reducing layer 89 functions as a portion of the n gate layer 86. The voltage reducing layer 89 may be of the i-type.

The thyristor shown in FIG. 15B is not provided with the voltage reducing layer 89.

A rising voltage Vr (see FIG. 15C) in the thyristor depends on energy of the smallest band gap (band gap energy) in the semiconductor layer constituting the thyristor. Incidentally, the rising voltage Vr in the thyristor means a voltage obtained by extrapolating a current in an ON state of the thyristor onto a voltage axis.

As shown in FIG. 15C, the voltage reducing layer 89 that is a layer smaller in band gap energy than any of the p anode layer 85, the n gate layer 86, a p gate layer 87 and an n cathode layer 88 is provided in the thyristor. Accordingly, the rising voltage Vr of the thyristor is lower than a rising voltage Vr' of the thyristor not provided with the voltage reducing layer 89. Further, the voltage reducing layer 89 is a layer, for example, having a band gap smaller than the band gap of the light emitting layer 82.

The thyristor (setting thyristor S, transfer thyristor T) is not used as a light emitting element but persistently functions as a portion of a driving portion 101 that drives a light emitting element such as a laser diode LD. Accordingly, the band gap can be determined regardless of a light emission wavelength of the light emitting element that actually emits light. Therefore, the voltage reducing layer 89 having the band gap smaller than the band gap of the light emitting layer 82 is provided to reduce the rising voltage Vr of the thyristor.

Thus, the voltage to be applied to the thyristor and the light emitting element can be reduced in an ON state of the thyristor and the light emitting element.

Figure 16:
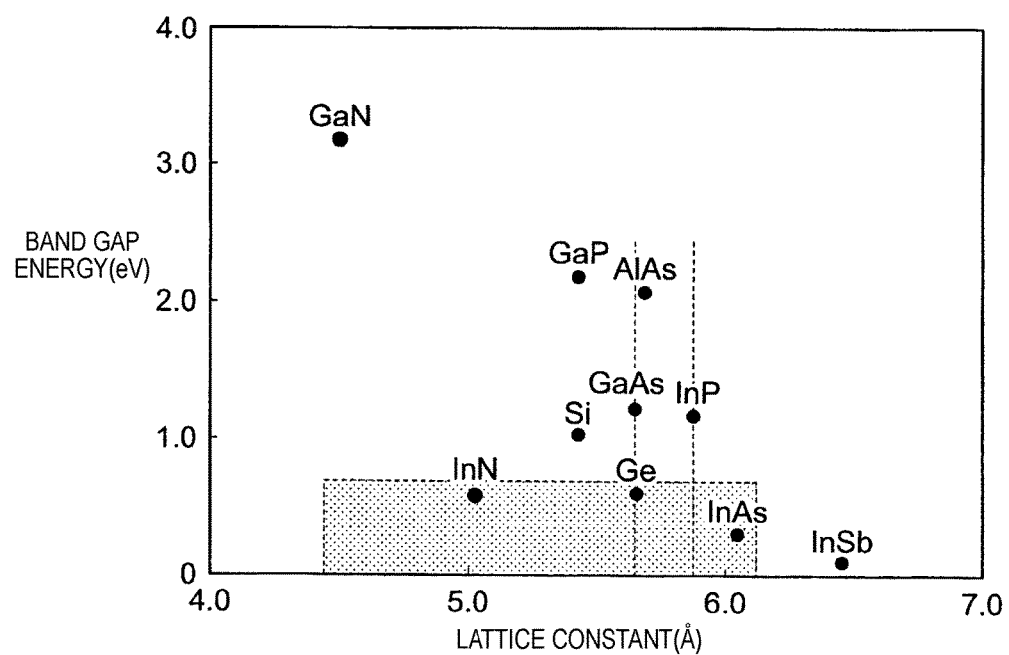
FIG. 16 A graph for explaining band gap energies of materials forming semiconductor layers.

FIG. 16 is a graph for explaining band gap energies of materials forming semiconductor layers.

A lattice constant of GaAs is about 5.65 Å. A lattice constant of AlAs is about 5.66 Å. Accordingly, any material close to each of the lattice constants can be epitaxially grown on a GaAs substrate. For example, AlGaAs that is a compound of GaAs and AlAs or Ge can be epitaxially grown on the GaAs substrate.

In addition, a lattice constant of InP is about 5.87 Å. Any material close to this lattice constant can be epitaxially grown on an InP substrate.

In addition, a lattice constant of GaN varies from one growth face to another. However, the lattice constant of GaN is 3.19 Å at an a-face, and 5.17 Å at a c-face. Any material close to each of the lattice constants can be epitaxially grown on a GaN substrate.

Each material shown in a dot area of FIG. 16 has band gap energy in which the rising voltage of the thyristor can be reduced, in comparison with GaAs, InP and GaN. That is, when any of the materials shown in the dot area is used as a layer constituting the thyristor, the rising voltage Vr of the thyristor corresponds to the band gap energy of the material shown in the dot area.

For example, band gap energy of GaAs is about 1.43 eV. Accordingly, when the voltage reducing layer 89 is not used, the rising voltage Vr of the thyristor is about 1.43 V. However, when any of the materials in the dot area is formed as the layer constituting the thyristor or contained in the layer constituting the thyristor, the rising voltage Vr of the thyristor can be made larger than 0 V and smaller than 1.43 V (0 V<Vr<1.43 V).

Thus, power consumption can be reduced when the thyristor is in an ON state.

The materials shown in the dot area include Ge having band gap energy of about 0.67 eV with respect to GaAs, and InAs having band gap energy of about 0.36 eV with respect to InP. In addition, in a compound of GaAs and InP, a compound of InN and InSb, a compound of InN and InAs, etc., any material having small band gap energy with respect to the GaAs substrate or the InP substrate can be used. Particularly, a mixed compound using GaInNAs as the base is suitable. Al, Ga, As, P, Sb, etc. may be contained in these materials. In addition, GaNP can be used for the voltage reducing layer 89 with respect to GaN. Moreover, (1) an InN layer or an InGaN layer formed by metamorphic growth etc. (2) a quantum dot made of InN, InGaN, InNAs or InNSb (3) an InAsSb layer etc. equivalent to twice as large as the lattice constant (a-face) of GaN may be introduced as the voltage reducing layer 89. Al, Ga, N, As, P, Sb, etc. may be contained in these materials.

Although the rising voltages Vr and Vr' of the thyristors have been described here, the same thing is also applied to holding voltages Vh and Vh' that are smallest voltages at which the thyristors can keep an ON state, or voltages applied to the thyristors that are in the ON state (see FIG. 15C).

On the other hand, a switching voltage Vs (see FIG. 15C) of each of the thyristors depends on a depletion layer of the semiconductor layer that is reversely biased. Thus, the voltage reducing layer 89 has less influence on the switching voltage Vs of the thyristor.

That is, the voltage reducing layer 89 lowers the rising voltage Vr while maintaining the switching voltage Vs of the thyristor. Thus, the voltage to be applied to the thyristor in the ON state can be reduced and power consumption can be reduced. The switching voltage Vs of the thyristor can be set at any value by adjusting the materials, the impurity concentrations etc. for the p anode layer 85, the n gate layer 86, the p gate layer 87 and the n cathode layer 88. Incidentally, the switching voltage Vs changes due to the position where the voltage reducing layer 89 is inserted.

In addition, although one voltage reducing layer 89 is provided by way of example in FIG. 14, voltage reducing layers 89 may be provided. For example, the voltage reducing layers 89 may be provided between the p anode layer 85 and the n gate layer 86 and between the p gate layer 87 and the n cathode layer 88 respectively, or one of the voltage reducing layers 89 is provided inside the n gate layer 86 and the other voltage reducing layer 89 is provided inside the p gate layer 87. In addition, the voltage reducing layer 89 may be provided inside each of two or three layers selected from the p anode layer 85, the n gate layer 86, the p gate layer 87 and the n cathode layer 88. The electrically conductive type of each of the voltage reducing layers may agree with the anode layer, the cathode layer or the gate layer where the voltage reducing layer is provided or may be the i-type.

The material used as the voltage reducing layer 89 is more difficult to be grown than GaAs, InP, etc. so that the quality is inferior. Accordingly, defects are easily generated inside the voltage reducing layer 89 so that the defects can extend, for example, into a semiconductor of GaAs etc. grown on the voltage reducing layer 89.

As described above, the light emission characteristic of the light emitting element such as the laser diode LD is apt to be affected by the defects contained in the semiconductor layer. On the other hand, the thyristor (setting thyristor S, transfer thyristor T) may turn ON to supply a current to the laser diode LD or the lower diode UD. Accordingly, the defects may be contained in the semiconductor layer constituting the thyristor as long as the thyristor including the voltage reducing layer 89 is not used as a light emitting layer but used for voltage reduction.

Therefore, the laser diodes LD and the lower diodes UD may be provided on the substrate 80, and the setting thyristors S and the transfer thyristors T each including the voltage reducing layer 89 may be provided thereon in the same manner as the tunnel junction layer 84 or the metallic electrically conductive group III-V compound layer. Thus, generation of defects in the laser diodes LD and the lower diodes UD, particularly in the laser diodes LD can be suppressed so that the light emission characteristics can be difficult to be affected by the defects. In addition, the setting thyristors S or the transfer thyristors T may be laminated monolithically.

Modifications of the light emitting chip C according to the first exemplary embodiment will be described below. In each of the following modifications, a portion where a laser diode LD and a setting thyristor S are laminated on each other in an island 301 of a light emitting chip C will be described. The same thing will be also applied to a portion where a lower diode UD and a transfer thyristor T are laminated on each other. The remaining configuration is the same as that of the light emitting chip C which has been described so far. Accordingly, description about the same portions will be omitted and the different portion will be described.

(Modification 1-1 of Light Emitting Chip C according to First Exemplary Embodiment)

Figure 17:
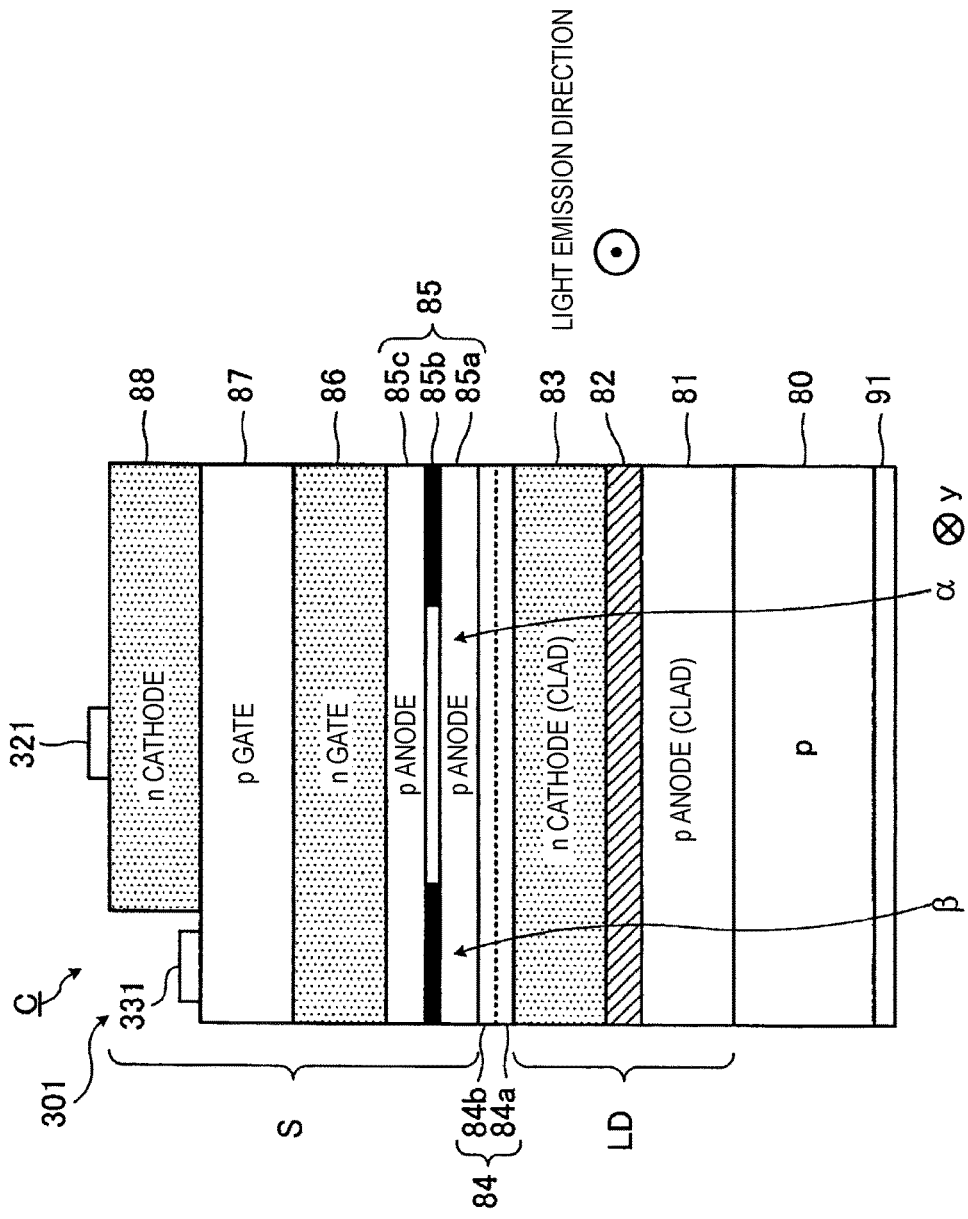
FIG. 17 An enlarged sectional view of an island in which a laser diode and a setting thyristor are laminated on each other, in order to explain a modification 1-1.

FIG. 17 is an enlarged sectional view of an island 301 in which a laser diode LD and a setting thyristor S are laminated on each other, in order to explain a modification 1-1.

In the modification 1-1, a current narrowing layer (current narrowing layer 85*b* in the modification 1-1) is provided not in a p anode (clad) layer 81 but in a p anode layer 85. That is, the p anode layer 85 is constituted by a lower p anode layer 85*a*, the current narrowing layer 85*b* and an upper p anode layer 85*c*. The remaining configuration is the same as that of the light emitting chip C according to the first exemplary embodiment.

Incidentally, the manufacturing method of the light emitting chip C according to the first exemplary embodiment as shown in FIG. 10A to FIG. 12I can be changed to manufacture the modification 1-1. That is, the current narrowing layer 85*b* in the p anode layer 85 constituted by the lower p anode layer 85*a*, the current narrowing layer 85*b* and the upper p anode layer 85*c* may be oxidized from side surfaces. In the case of the structure, it is unnecessary to perform etching up to the laser diode LD. Accordingly, the structure has an advantage that, for example, the process can be easier due to the smaller level difference or heat dissipation can be improved to thereby improve a laser characteristic.

Also in the light emitting chip C of the modification 1-1, the flow of a current is limited to a current passing portion a in a central portion of the light emitting diode LED. Accordingly, consumption of electric power for non-radiative recombination can be suppressed so that reduction in power consumption and an improvement in light extraction efficiency can be attained.

Incidentally, the current narrowing layer may be provided in an n cathode (clad) layer 83 of the laser diode LD or the n cathode layer 88 of the setting thyristor S.

(Modification 1-2 of Light Emitting Chip C according to First Exemplary Embodiment)

Figure 18:
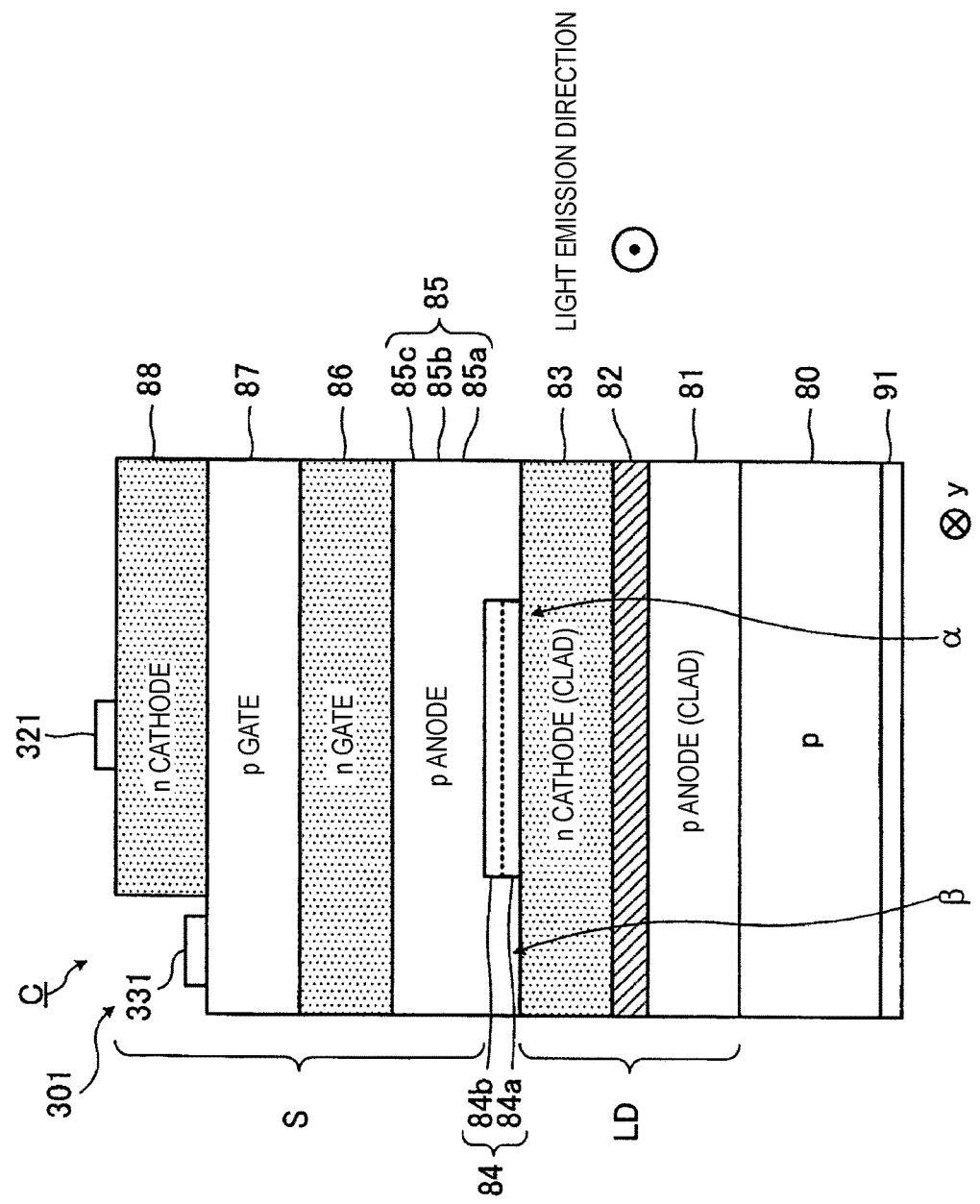
FIG. 18 An enlarged sectional view of an island in which a laser diode and a setting thyristor are laminated on each other, in order to explain a modification 1-2.

FIG. 18 is an enlarged sectional view of an island 301 in which a laser diode LD and a setting thyristor S are laminated on each other, in order to explain a modification 1-2.

In the modification 1-2, a tunnel junction layer 84 is provided in a portion corresponding to a current passing portion a in place of a current narrowing layer 81*b*. The remaining configuration is the same as that of the light emitting chip C according to the first exemplary embodiment.

As described above, a current is apt to flow through the tunnel junction layer 84 in a reverse bias state. However, the current is resistant to flow through a junction between an n cathode (clad) layer 83 and a p anode layer 85, that does not serve as a tunnel junction, in a reverse bias state causing no breakdown.

Accordingly, when the tunnel junction layer 84 is provided in the portion corresponding to the current passing portion a, the current to flow into the laser diode LD is limited to the central portion.

Incidentally, the manufacturing method of the light emitting chip C according to the first exemplary embodiment as shown in FIG. 10A to FIG. 12I is changed to manufacture the light emitting chip C of the modification 1-2. That is, a p anode (clad) layer 81, a light emitting layer 82, the n cathode (clad) layer 83 and the tunnel junction layer 84 in FIG. 10A are sequentially laminated on a substrate 80. Then, a portion of the tunnel junction layer 84 corresponding to a current blocking portion β is removed so that the portion of the tunnel junction layer 84 corresponding to the current passing portion a is left. Then, the p anode layer 85 is laminated to cover the circumference of the left tunnel junction layer 84. An n gate layer 86, a p gate layer 87 and an n cathode layer 88 are sequentially laminated. Incidentally, the circumference of the left tunnel junction layer 84 may be covered not with the p anode layer 85 but with the n cathode (clad) layer 83.

The light emitting chip C of the modification 1-2 may be applied to a case where a semiconductor material to which steam oxidation is difficult to be applied is used.

In addition, a metallic electrically conductive group III-V compound layer may be used in place of the tunnel junction layer 84.

(Modification 1-3 of Light Emitting Chip C according to First Exemplary Embodiment)

Figure 19:
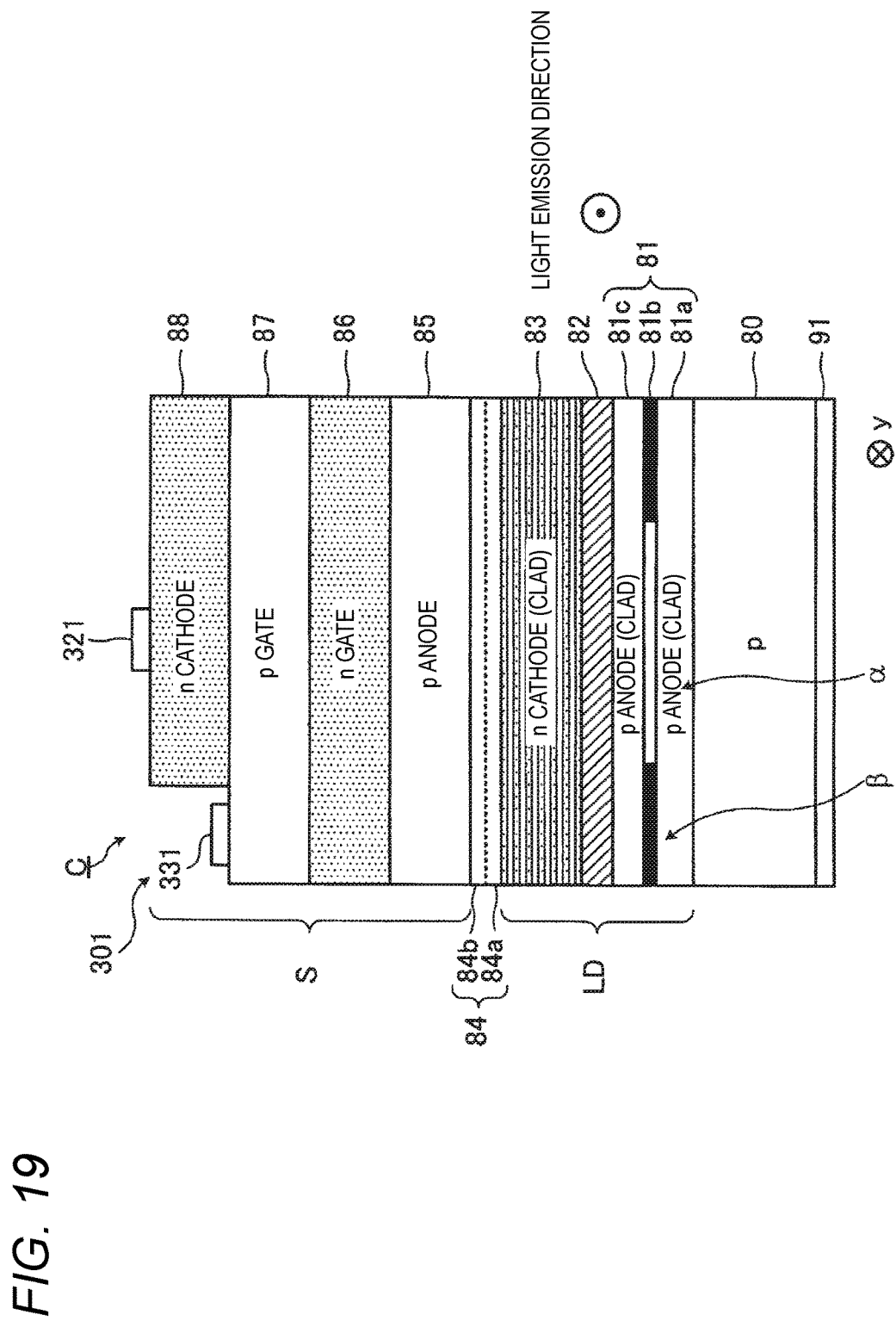
FIG. 19 An enlarged sectional view of an island in which a laser diode and a setting thyristor are laminated on each other, in order to explain a modification 1-3.

FIG. 19 is an enlarged sectional view of an island 301 in which a laser diode LD and a setting thyristor S are laminated on each other, in order to explain a modification 1-3.

In the modification 1-3, an n cathode (clad) layer 83 is used as a distributed Bragg reflector (DBR) layer (hereinafter denoted as DBR layer). The DBR layer is constituted by a laminate of semiconductor layers between adjacent ones of which a refractive index difference is provided. The DBR layer is configured to reflect light emitted from the laser diode LD. The remaining configuration is the same as that of the light emitting chip C according to the first exemplary embodiment.

When a semiconductor material having smaller band gap energy than a light emission wavelength is used for a tunnel junction layer 84, light reaching the tunnel junction layer 84 is absorbed at band edges to become a loss. Therefore, in the modification 1-3, the DBR layer is provided between a light emitting layer 82 and the tunnel junction layer 84, and the tunnel junction layer 84 is provided at a position corresponding to a node of a standing wave generated in the DBR layer. In this manner, the band edge absorption by the semiconductor material used for the tunnel junction layer 84 can be suppressed greatly.

The DBR layer is constituted by a combination of high Al composition low refractive index layers of, for example, $Al_{0.9}Ga_{0.1}As$ and, and low Al composition low refractive index layers of, for example, $Al_{0.2}Ga_{0.8}As$. A film thickness (optical path length) of each of the low refractive index layers and the high refractive index layers is set, for example, at 0.25 (¼) of a center wavelength. Incidentally, an Al composition ratio between the low refractive index layers and the high refractive index layers may be changed in a range of 0 to 1.

Accordingly, when the n cathode (clad) layer 83 is changed to the DBR layer in the manufacturing method of the light emitting chip C according to the first exemplary embodiment shown in FIG. 10A to 12I, the light emitting chip C of the modification 1-3 can be manufactured.

Incidentally, in the light emitting chip C of each of the modifications 1-1 to 1-3, a metallic electrically conductive group III-V compound layer may be used in place of the tunnel junction layer 84, and a voltage reducing layer 89 may be added to the setting thyristor S or a transfer thyristor T.

Second Exemplary Embodiment

In the light emitting chip C according to the first exemplary embodiment, each of the light emitting elements is used as a laser diode LD. In a light emitting chip C according to a second exemplary embodiment, each of light emitting elements is used as a light emitting diode LED.

The configuration of the light emitting chip C is the same as that according to the first exemplary embodiment except that the light emitting diode LED (including a lower diode) and a setting thyristor S (including a transfer thyristor T) are laminated on each other. The configuration of the light emitting chip C may be obtained by replacing the laser diode LD by the light emitting diode LED. Therefore, description about the same portions will be omitted and the different portion will be described.

Figure 20:
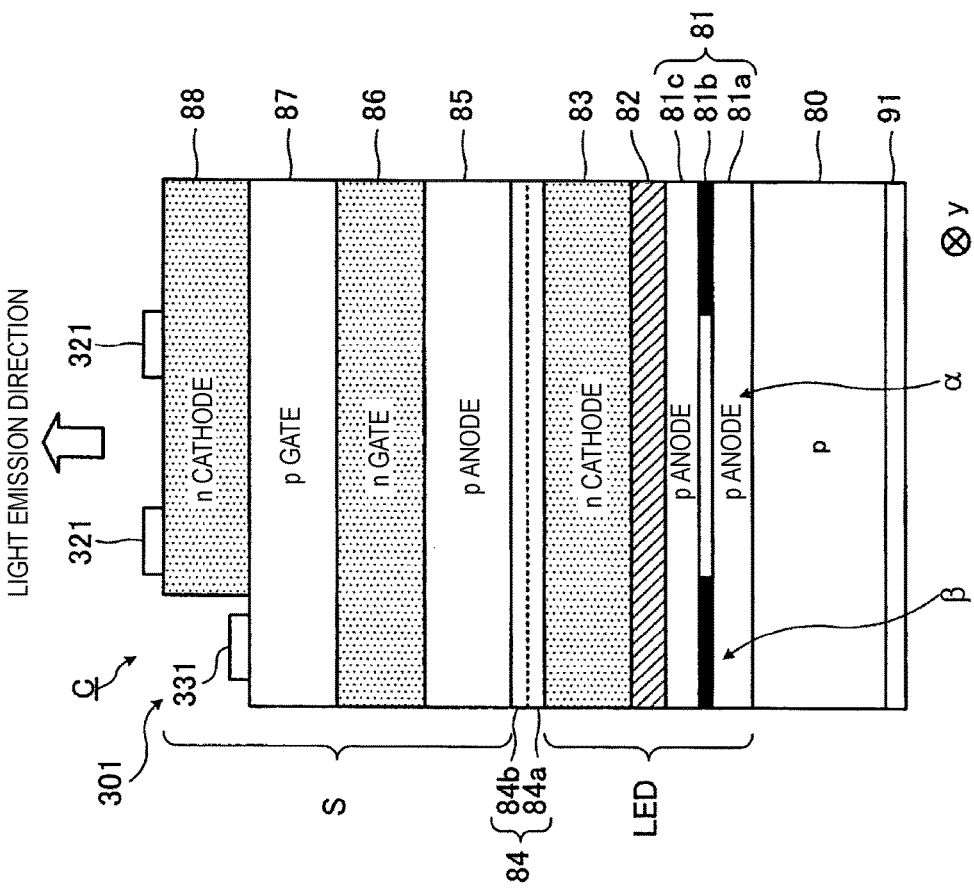
FIG. 20 An enlarged sectional view of an island in which a light emitting diode and a setting thyristor S are laminated on each other, in a light emitting chip according to a second exemplary embodiment.

FIG. 20 is an enlarged sectional view of an island 301 in which the light emitting diode LED and the setting thyristor S are laminated on each other in the light emitting chip C according to the second exemplary embodiment.

In the light emitting chip C according to the second exemplary embodiment, a p anode layer 81, a light emitting layer 82 and an n cathode layer 83 of the light emitting diode LED are laminated on a p-type substrate 80. Further, a tunnel junction layer 84 is provided on the n cathode layer. A p anode layer 85, an n gate layer 86, a p gate layer 87 and an n cathode layer 88 of the setting thyristor S are laminated on the tunnel junction layer 84. These layers are laminated monolithically.

The p anode layer 81 is constituted by a lower p anode layer 81a, a current narrowing layer 81b and an upper p anode layer 81c.

The lower p anode layer 81a and the upper p anode layer 81c are, for example, made of p-type $Al_{0.9}GaAs$ doped with an impurity concentration of $1\times10^{18}/cm^3$. The Al composition may be changed in a range of 0 to 1. Incidentally, GaInP etc. may be used alternatively.

The n cathode layer 83 is, for example, made of n-type $Al_{0.9}GaAs$ doped with an impurity concentration of $1\times10^{18}/cm^3$. The Al composition may be changed in a range of 0 to 1. Incidentally, GaInP etc. may be used alternatively.

Incidentally, the remaining configuration is the same as that according to the first exemplary embodiment.

The light emitting diode LED emits light in a direction perpendicular to the substrate 80, as indicted by an arrow. Accordingly, the light emitting diode LED can be used when the light emitted in the direction perpendicular to the substrate 80 is used. Incidentally, a central portion of an n ohmic electrode 321 is opened.

In this case, the light is emitted through the tunnel junction layer 84. Since the tunnel junction layer 84 contains a high concentration of impurities, there is a fear that the tunnel junction layer 84 may absorb the light. Even in this case, the light emitting chip C can be used in an application in which the light quantity is allowed to be small. For example, the light emitting chip C can be used in an application in where the light quantity is in the order of nW or μW etc. based on radiant energy. The same thing is also applied to the other modifications and the other exemplary embodiments.

Incidentally, a metallic electrically conductive group III-V compound layer may be used in place of the tunnel junction layer 84, as described above in the first exemplary embodiment. In addition, a voltage reducing layer 89 may be added to the setting thyristor S or the transfer thyristor T. There is a fear that the metallic electrically conductive group III-V compound layer and the voltage reducing layer 89 may also absorb the light emitted from the light emitting diode LED in the same manner as the tunnel junction layer 84.

As a method for avoiding the absorption of the light by the tunnel junction layer 84, the metallic electrically conductive group III-V compound layer or the voltage reducing layer 89, the n cathode layer 88, the p gate layer 87, the n gate layer 86 and the p anode layer 85 of the setting thyristor S and the tunnel junction layer 84 at one portion or the whole of the central opening portion of the n ohmic electrode 321 may be partially or entirely removed in a thickness direction by etching. When the metallic electrically conductive group III-V compound layer is used in place of the tunnel junction layer 84, the metallic electrically conductive group III-V compound layer may be partially or entirely removed in the thickness direction by etching. Further, also when the voltage reducing layer 89 is used, the voltage reducing layer 89 may be removed in the same manner.

In addition, the current narrowing layer may be provided in the p anode layer 85 of the setting thyristor S in the same manner as the modification 1-1 in the first exemplary embodiment. In addition, the current narrowing layer may be provided in the n cathode layer 83 of the light emitting diode LED or the n cathode layer 88 of the setting thyristor S.

Further, the tunnel junction layer 84 may be used as a current narrowing layer in place of the current narrowing layer formed by steam oxidation, in the same manner as the modification 1-2 in the first exemplary embodiment.

Incidentally, the light emitting chip C may be manufactured in the following manner. That is, after the step for forming the semiconductor laminate in FIG. 10A in the first exemplary embodiment, the n cathode layer 88 side is pasted to another substrate (that is a substrate for transfer and hereinafter denoted as transfer substrate 100), the substrate 80 is then removed (released), and the steps in and after FIG. 10B are performed. Here, the substrate 80 is a substrate for growth (growth substrate). The semiconductor laminate is turned upside down to be laminated on the transfer substrate 100.

Figure 21:
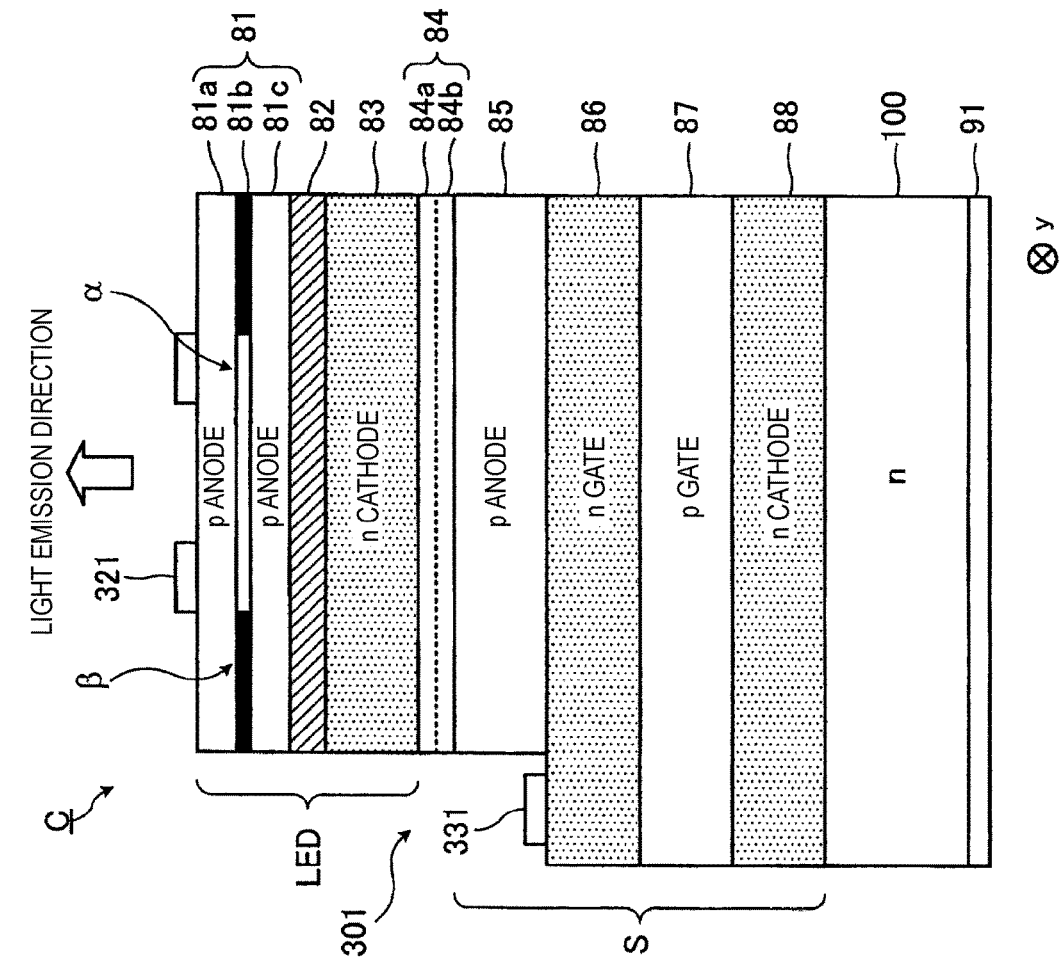
FIG. 21 An enlarged sectional view of the island in which the light emitting diode and the setting thyristor S are laminated on each other, in the light emitting chip formed on a transfer substrate.

FIG. 21 is an enlarged sectional view of the island 301 in which the light emitting diode LED and the setting thyristor S are laminated on each other in the light emitting chip C formed on the transfer substrate 100.

The semiconductor laminate shown in FIG. 20 is turned upside down to be reversely laminated on the transfer substrate 100. Accordingly, when a back electrode 91 is provided on a back surface of the transfer substrate 100, the transfer substrate 100 is of an n-type. That is, the transfer substrate 100 has a cathode common configuration, whose circuit has reversed polarities.

With the configuration made thus, light emitted from the light emitting diode LED can be suppressed from being absorbed by the tunnel junction layer 84. Even when the metallic electrically conductive group III-V compound layer or the voltage reducing layer 89 is used, the light emitted from the light emitting diode LED can be suppressed from being absorbed by the metallic electrically conductive group III-V compound layer or the voltage reducing layer 89.

Incidentally, also in the structure, the position where the current narrowing layer is provided may be changed, the tunnel junction layer 84 or the metallic electrically conductive group III-V compound layer may be used as the current narrowing layer, or the voltage reducing layer 89 may be provided.

Incidentally, the paste structure to the transfer substrate 100 can be also applied to the other exemplary embodiments.

Modifications of the light emitting chip C according to the second exemplary embodiment will be described below.

(Modification 2-1 of Light Emitting Chip C according to Second Exemplary Embodiment)

Figure 22:
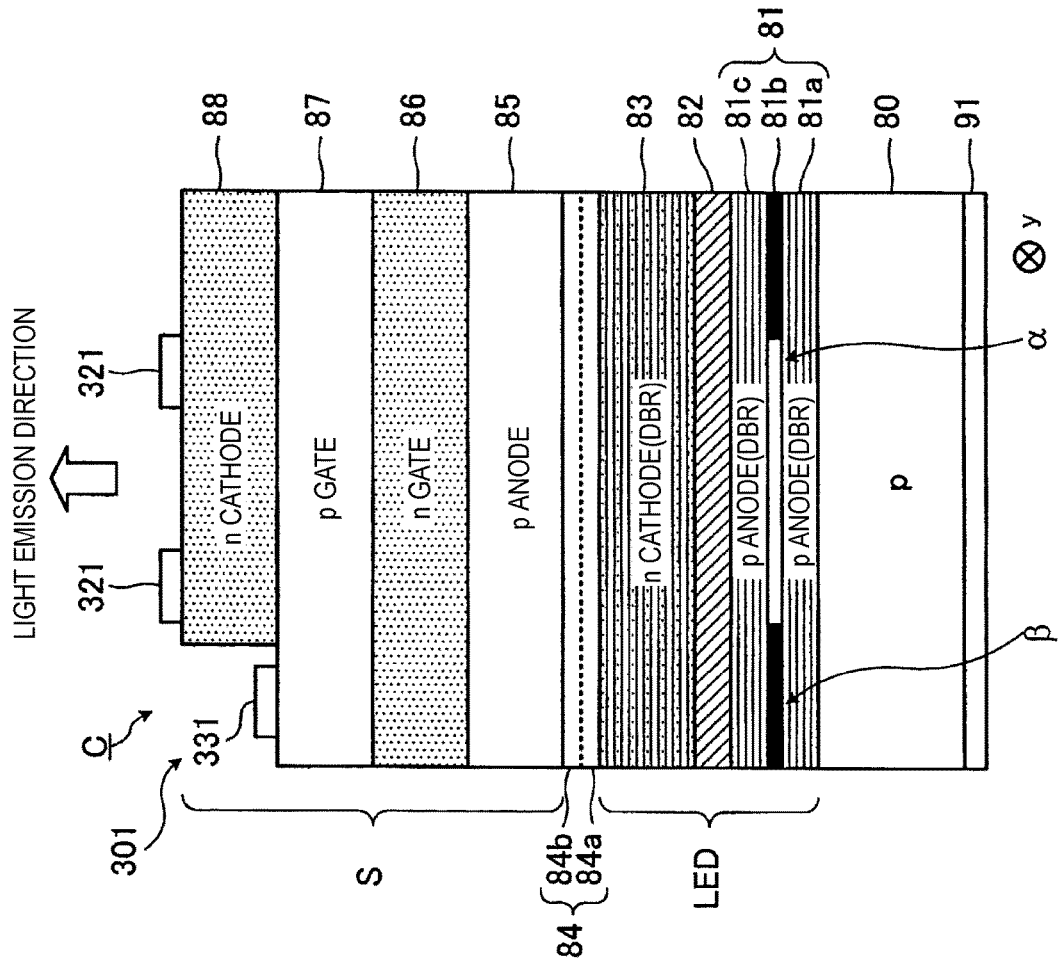
FIG. 22 An enlarged sectional view of an island in which a light emitting diode and a setting thyristor are laminated on each other, in order to explain a modification 2-1.

FIG. 22 is an enlarged sectional view of an island 301 in which a light emitting diode LED and a setting thyristor S are laminated on each other, in order to explain a modification 2-1.

In the modification 2-1, a light emitting layer 82 is interposed between two DBR layers. That is, a p anode layer 81 and an n cathode layer 83 are formed as the DBR layers. The p anode layer 81 includes a current narrowing layer 81b. That is, the p anode layer 81 includes a lower p anode layer 81a, the current narrowing layer 81b and an upper p anode layer 81c that are laminated in this order. The lower p anode layer 81a and the upper p anode layer 81c are formed as DBR layers.

Incidentally, the lower p anode layer 81a, the upper p anode layer 81c and the n cathode layer 83 may be denoted as lower p anode (DBR) layer 81a, upper p anode (DBR) layer 81c and n cathode (DBR) layer 83, respectively.

The configuration of the DBR layers is the same as that in the modification 1-3 in the first exemplary embodiment. Incidentally, a film thickness (optical path length) of the current narrowing layer 81b in the p anode (DBR) layer 81 depends on the structure that is put into use. When light extraction efficiency or process reproducibility is regarded as important, the film thickness of the current narrowing layer 81b may be set at an integer multiple of a film thickness of each of low refractive index layers and high refractive index layers forming the DBR layer. For example, the film thickness of the current narrowing layer 81b is set at 0.75 (¾) of a center wavelength. Incidentally, in the case where the current narrowing layer 81b is set at an odd multiple, the current narrowing layer 81b may be interposed between one of the high refractive index layers and another. In addition, in the case where the current narrowing layer 81b is set at an even multiple, the current narrowing layer 81b may be interposed between one of the high refractive index layers and one of the lower refractive index layers. That is, the current narrowing layer 81b may be provided to suppress disturbance of refractive index cycles caused by the DBR layer. On the contrary, in order to reduce the influence (refractive index or strain) of an oxidized portion, it is preferable that the film thickness of the current narrowing layer 81b is several tens of nm and it is preferable that the current narrowing layer 81b is inserted into a portion corresponding to a node of a standing wave standing inside the DBR layer.

The p anode (DBR) layer 81 and the n cathode (DBR) layer 83 are configured to reflect light emitted by the light emitting layer 82 of the light emitting diode LED. That is, the p anode (DBR) layer 81 and the n cathode (DBR) layer 83 form a resonant cavity (cavity) so that the light emitted by the light emitting layer 82 can be enhanced by resonation and then outputted. That is, in the modification 2-1, the setting thyristor S is laminated on the resonant cavity type light emitting diode LED.

In addition, with provision of the current narrowing layer 81b, consumption of electric power for non-radiative recombination can be suppressed so that reduction in power consumption and an improvement in light extraction efficiency can be attained.

The manufacturing method shown in FIG. 10A to FIG. 12I in the first exemplary embodiment can be partially changed to manufacture the light emitting chip C of the modification 2-1. That is, it will go well as long as the lower p anode layer 81a and the upper p anode layer 81c of the p anode layer 81 and the n cathode layer 83 in the step of forming the semiconductor laminate in FIG. 10A may be formed as DBR layers.

The position where the current narrowing layer is provided may be changed, a tunnel junction layer 84 or a metallic electrically conductive group III-V compound layer may be used as the current narrowing layer, and a voltage reducing layer 89 may be provided.

Incidentally, when light emitted from the light emitting diode LED is absorbed by the tunnel junction layer 84, the metallic electrically conductive group III-V compound layer, the voltage reducing layer 89, etc. to thereby lower the quantity of the emitted light, the light emitting chip C may be manufactured in a state in which a transfer substrate 100 is used and the semiconductor laminate is turned upside down to be reversely laminated on the transfer substrate 100. In addition, as a method for avoiding the absorption of the light by the tunnel junction layer 84, the metallic electrically conductive group III-V compound layer or the voltage reducing layer 89, an n cathode layer 88, a p gate layer 87, an n gate layer 86 and a p anode layer 85 of the setting thyristor S and the tunnel junction layer 84 at one portion or the whole of a central opening portion of an n ohmic electrode 321 may be partially or entirely removed in a thickness direction by etching. When the metallic electrically conductive group III-V compound layer is used in place of the tunnel junction layer 84, the metallic electrically conductive group III-V compound layer may be partially or entirely removed in the thickness direction by etching. Further, also when the voltage reducing layer 89 is used, the voltage reducing layer 89 may be removed in the same manner.

With the configuration made thus, light emitted from the light emitting diode LED can be suppressed from being absorbed by the tunnel junction layer 84. Also when the metallic electrically conductive group III-V compound layer or the voltage reducing layer 89 is used, the light emitted from the light emitting diode LED can be suppressed from being absorbed by the metallic electrically conductive group III-V compound layer or the voltage reducing layer 89.

(Modification 2-2 of Light Emitting Chip C according to Second Exemplary Embodiment)

Figure 23:
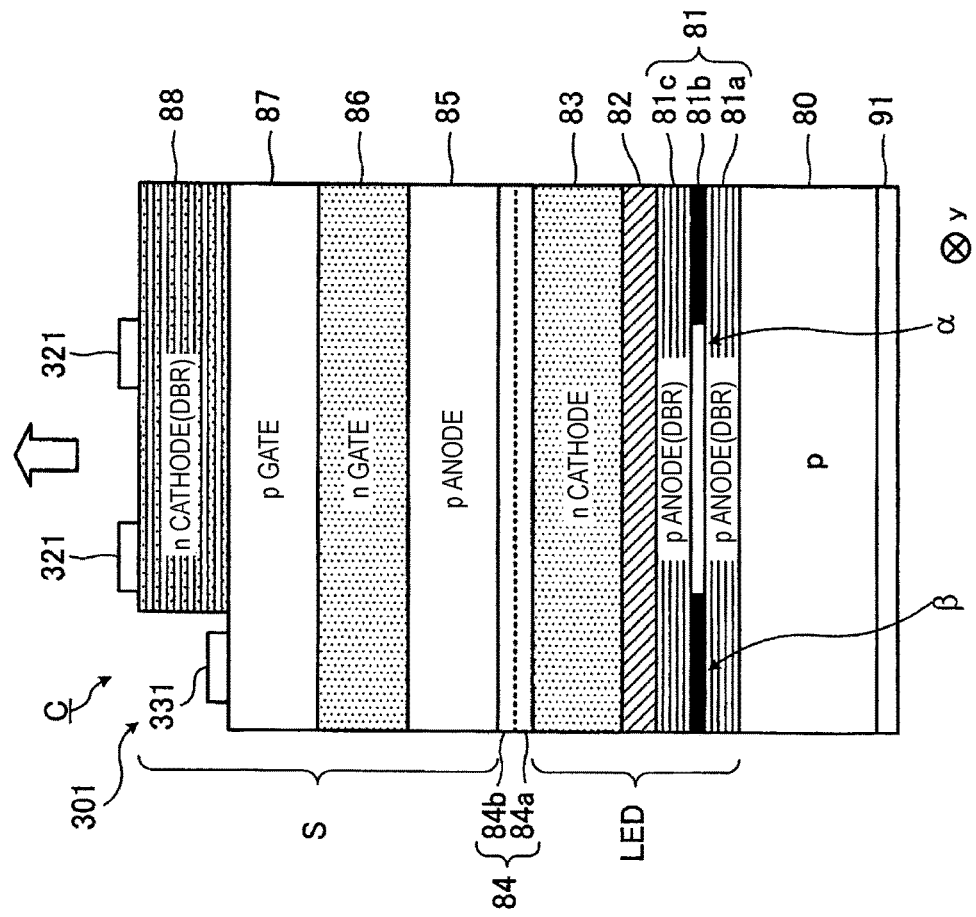
FIG. 23 An enlarged sectional view of an island in which a light emitting diode and a setting thyristor are laminated on each other, in order to explain a modification 2-2.

FIG. 23 is an enlarged sectional view of an island 301 in which a light emitting diode LED and a setting thyristor S are laminated on each other, in order to explain a modification 2-2.

In the modification 2-2, the n cathode (DBR) layer 81 of the light emitting chip C shown in FIG. 22 is changed to an n cathode layer 83 formed as a non-DBR layer, and, instead, an n cathode layer 88 is formed as a DBR layer. Accordingly, the n cathode layer 88 is denoted as n cathode (DBR) layer 88. The remaining configuration is the same as that of the light emitting chip C according to the first exemplary embodiment.

In the modification 2-2, the n cathode (DBR) layer 83 and a p anode (DBR) layer 85 form a resonant cavity (cavity) so that light emitted by a light emitting layer 82 can be enhanced by resonation and then outputted.

The manufacturing method shown in FIGS. 10A to 12I in the first exemplary embodiment can be partially changed to manufacture the light emitting chip C of the modification 2-2. That is, it will go well as long as the p anode (DBR) layer 85 and the n anode (DBR) layer 83 in the step of forming the semiconductor laminate in FIG. 10A may be formed as DBR layers.

In addition, a position where a current narrowing layer is provided may be changed, a tunnel junction layer 84 or a metallic electrically conductive group III-V compound layer may be used as the current narrowing layer, and a voltage reducing layer 89 may be provided.

Incidentally, in some cases, light emitted from the light emitting diode LED may be absorbed by the tunnel junction layer 84, the metallic electrically conductive group III-V compound layer, the voltage reducing layer 89, etc. to thereby lower the quantity of the emitted light. Even in this case, the light emitting chip C can be used in an application in which the light quantity is allowed to be small.
(Modification 2-3 of Light Emitting Chip C according to Second Exemplary Embodiment)

Figure 24:
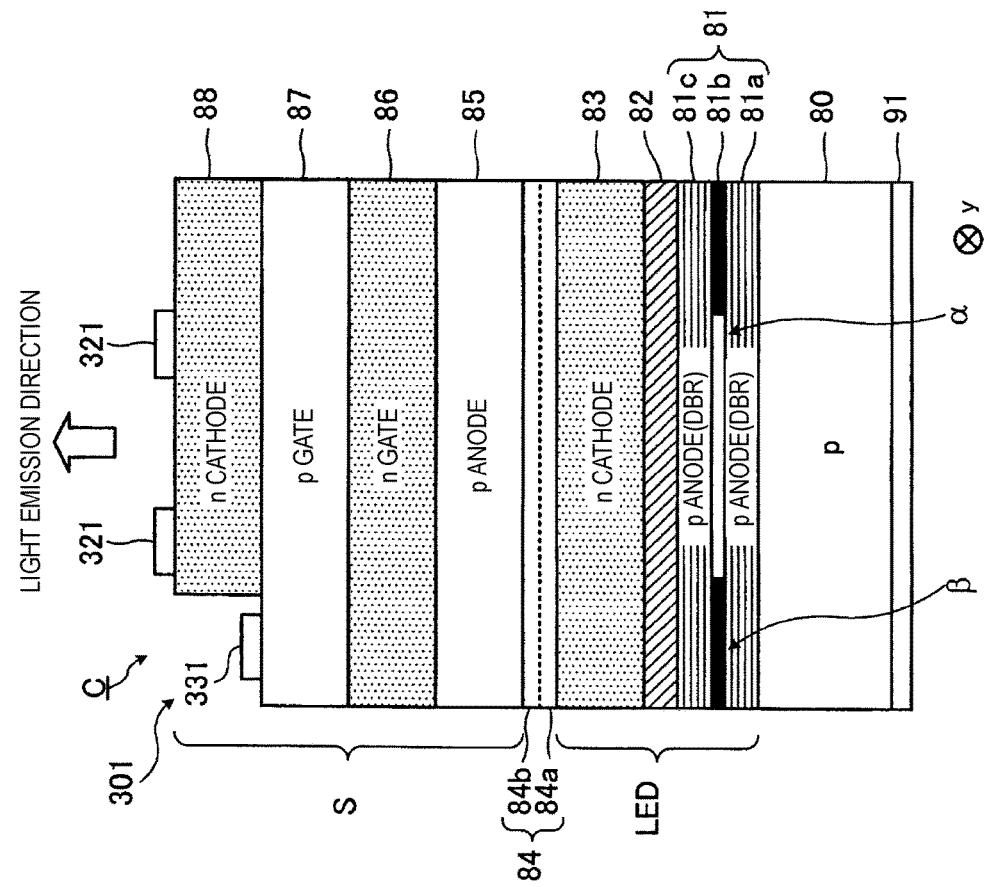
FIG. 24 An enlarged sectional view of an island in which a light emitting diode and a setting thyristor are laminated on each other, in order to explain a modification 2-3.

FIG. 24 is an enlarged sectional view of an island 301 in which a light emitting diode LED and a setting thyristor S are laminated on each other, in order to explain a modification 2-3.

In the modification 2-3, the n cathode (DBR) layer 83 of the light emitting chip C shown in FIG. 22 is changed to an n cathode layer 83 formed as a non-DBR layer. The remaining configuration is the same as that of the light emitting chip C according to the first exemplary embodiment.

In the light emitting chip C of the modification 2-3, a p anode (DBR) layer 81 is provided on a lower (substrate 80) side of a light emitting layer 82. In this case, a reflectance of 30% can be obtained in an interface between an n cathode layer 88 and air. Accordingly, light emitted by the light emitting layer 82 can be enhanced by resonation and then outputted.

In addition, of the light emitted from the light emitting layer 82, a light component travelling toward the substrate 80 side is reflected and travel toward an emission exit side. Accordingly, light utilization efficiency can be improved in comparison with a case where the p anode layer 81 is not a DBR layer.

The manufacturing method shown in FIGS. 10A to 12I in the first exemplary embodiment can be partially changed to manufacture the light emitting chip C of the modification 2-3. That is, it will go well as long as the lower p anode layer 81a and the upper p anode layer 81c of the p anode layer 81 in the step of forming the semiconductor laminate in FIG. 10A may be formed as DBR layers.

A position where a current narrowing layer is provided may be changed. A tunnel junction layer 84 or a metallic electrically conductive group III-V compound layer may be used as the current narrowing layer. A voltage reducing layer 89 may be provided.

Incidentally, in some cases, light emitted from the light emitting diode LED may be absorbed by the tunnel junction layer 84, the metallic electrically conductive group III-V compound layer, the voltage reducing layer 89, etc. to thereby lower the quantity of the emitted light. Accordingly, the light emitting chip C may be used in an application in which the light quantity is allowed to be small.

In addition, when the light emitted from the light emitting diode LED is absorbed by the tunnel junction layer 84, the metallic electrically conductive group III-V compound layer, the voltage reducing layer 89, etc. to thereby lower the quantity of the emitted light, the light emitting chip C may be manufactured in a state in which the n cathode layer 83 is formed as a DBR layer, the p anode layer 81 is formed as a non-DBR layer, a transfer substrate 100 is used and the semiconductor laminate is turned upside down to be reversely laminated on the transfer substrate 100.

Third Exemplary Embodiment

In the light emitting chip C according to the first exemplary embodiment, each of the light emitting elements is used as a laser diode LD. In the light emitting chip C according to the second exemplary embodiment, each of the light emitting elements is used as a light emitting diode LED. In a light emitting chip C according to a third exemplary embodiment, each of light emitting elements is used as a vertical cavity surface emitting laser VCSEL.

The configuration of the light emitting chip C is the same as that according to the first exemplary embodiment except that the vertical cavity surface emitting laser VCSEL (including a lower diode UD) and a setting thyristor S (including a transfer thyristor T) are laminated on each other. The configuration of the light emitting C may be obtained by replacing the laser diode LD by the vertical cavity surface emitting laser VCSEL. Therefore, description about the same portions will be omitted and the different portion will be described.

Figure 25:
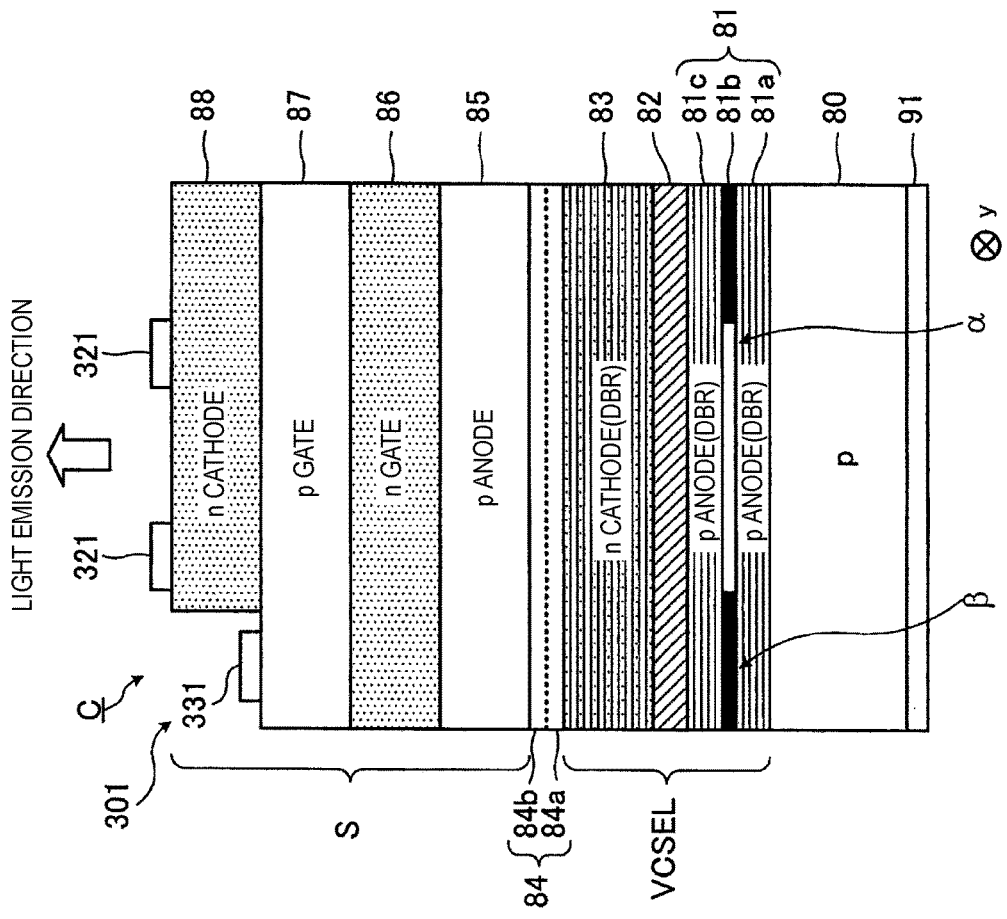
FIG. 25 An enlarged sectional view of an island in which a vertical cavity surface emitting laser and a setting thyristor are laminated on each other, in a light emitting chip according to a third exemplary embodiment.

FIG. 25 is an enlarged sectional view of an island 301 in which the vertical cavity surface emitting laser VCSEL and the setting thyristor S are laminated on each other in the light emitting chip C according to the third exemplary embodiment.

The vertical cavity surface emitting laser VCSEL and the setting thyristor S are laminated on each other.

The basic configuration is the same as that of the light emitting chip C according to the second exemplary embodiment shown in FIG. 22. Accordingly, description about the basic configuration will be omitted.

The vertical cavity surface emitting laser VCSEL resonates light to oscillate laser light in a light emitting layer 82 interposed between two DBR layers (a p anode (DBR) layer 81 and an n cathode (DBR) layer 83). When a reflectance between the two DBR layers (the p anode (DBR) layer 81 and the n cathode (DBR) layer 83) is, for example, not smaller than 99%, the laser light is oscillated.

Incidentally, as described above in the first exemplary embodiment, a metallic electrically conductive group III-V compound layer may be used in place of a tunnel junction layer 84. In addition, a voltage reducing layer 89 may be added to the setting thyristor S or the transfer thyristor T. There is a fear that the metallic electrically conductive group III-V compound layer and the voltage reducing layer 89 may also absorb the light emitted by the light emitting diode LED in the same manner as the tunnel junction layer 84.

In addition, a current narrowing layer may be provided in a p anode layer 85 of the setting thyristor S in the same manner as in the modification 1-1 in the first exemplary embodiment. In addition, the current narrowing layer may be provided in the n cathode layer 83 of the light emitting diode LED or an n cathode layer 88 of the setting thyristor S.

In some cases, light emitted from the vertical cavity surface emitting laser VCSEL may be absorbed by the tunnel junction layer 84, the metallic electrically conductive group III-V compound layer, the voltage reducing layer 89, etc. to thereby lower the quantity of the emitted light. Therefore, the light emitting chip C may be used in an application in which the light quantity is allowed to be small.

In addition, when the light emitted from the vertical cavity surface emitting laser VCSEL is absorbed by the tunnel junction layer 84, the metallic electrically conductive group III-V compound layer, the voltage reducing layer 89, etc. to thereby lower the quantity of the emitted light, the light emitting element C may be manufactured in a state in which a transfer substrate 100 is used and a semiconductor laminate is turned upside down.

In addition, as a method for avoiding the absorption of the light by the tunnel junction layer 84, the metallic electrically conductive group III-V compound layer or the voltage reducing layer 89, the n cathode layer 88, a p gate layer 87, an n gate layer 86 and the p anode layer 85 of the setting thyristor S and the tunnel junction layer 84 at one portion or the whole of a central opening portion of an n ohmic electrode 321 may be partially or entirely removed in a thickness direction by etching. When the metallic electrically conductive group III-V compound layer is used in place of the tunnel junction layer 84, the metallic electrically conductive group III-V compound layer may be partially or entirely removed in the thickness direction by etching. Further, also when the voltage reducing layer 89 is used, the voltage reducing layer 89 may be removed in the same manner.

Modifications of the light emitting chip C according to the third exemplary embodiment will be described below. In each of the following modifications, a portion where a vertical cavity surface emitting laser VCSEL and a setting thyristor S are laminated on each other in an island 301 of a light emitting chip C will be described. The same thing will be also applied to a portion where a lower diode UD and a transfer thyristor T are laminated on each other. The remaining configuration is the same as that of the light emitting chip C which has been described so far. Therefore, the different portion will be described and description about the same portions will be omitted.

(Modification 3-1 of Light Emitting Chip C according to Third Exemplary Embodiment)

Figure 26:
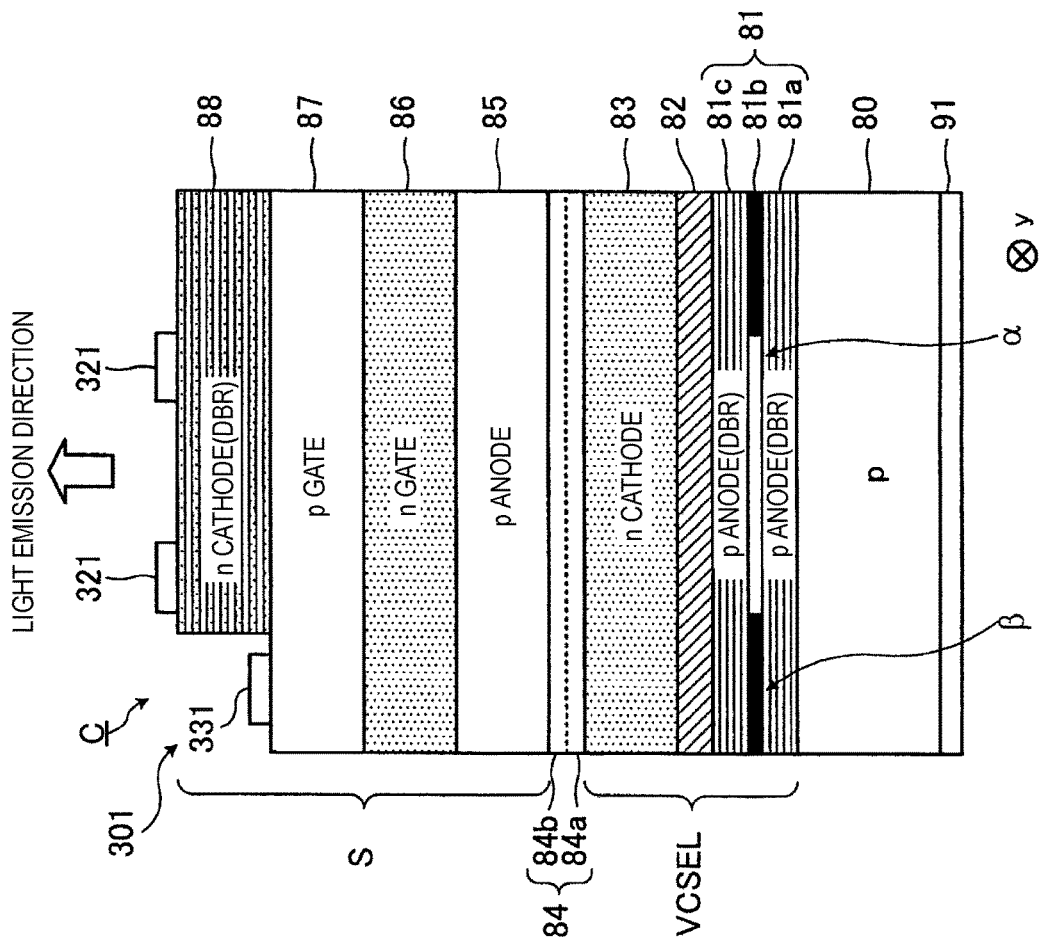
FIG. 26 An enlarged sectional view of an island in which a vertical cavity surface emitting laser and a setting thyristor are laminated on each other, in order to explain a modification 3-1.

FIG. 26 is an enlarged sectional view of an island 301 in which a vertical cavity surface emitting laser VCSEL and a setting thyristor S are laminated on each other, in order to explain a modification 3-1.

A basic configuration of the modification 3-1 is the same as that of the modification 2-2 of the light emitting chip C according to the second exemplary embodiment shown in FIG. 23. Accordingly, description about the basic configuration will be omitted.

The vertical cavity surface emitting laser VCSEL resonates light to oscillate laser light in a light emitting layer 82 interposed between two DBR layers (a p anode (DBR) layer 81 and an n cathode (DBR) layer 88).

A position where a current narrowing layer is provided may be changed. In addition, a metallic electrically conductive group III-V compound layer may be used in place of a tunnel junction layer 84. The tunnel junction layer 84 or the metallic electrically conductive group III-V compound layer may be used as the current narrowing layer. Further, a voltage reducing layer 89 may be provided in the thyristor (the setting thyristor S or a transfer thyristor T).

Incidentally, in some cases, light from the light emitting diode LED may be absorbed by the tunnel junction layer 84, the metallic electrically conductive group III-V compound layer, the voltage reducing layer 89, etc. to thereby lower the quantity of the emitted light. Even in this case, the light emitting chip C can be used in an application in which the light quantity is allowed to be small.

(Modification 3-2 of Light Emitting Chip C according to Third Exemplary Embodiment)

Figure 27:
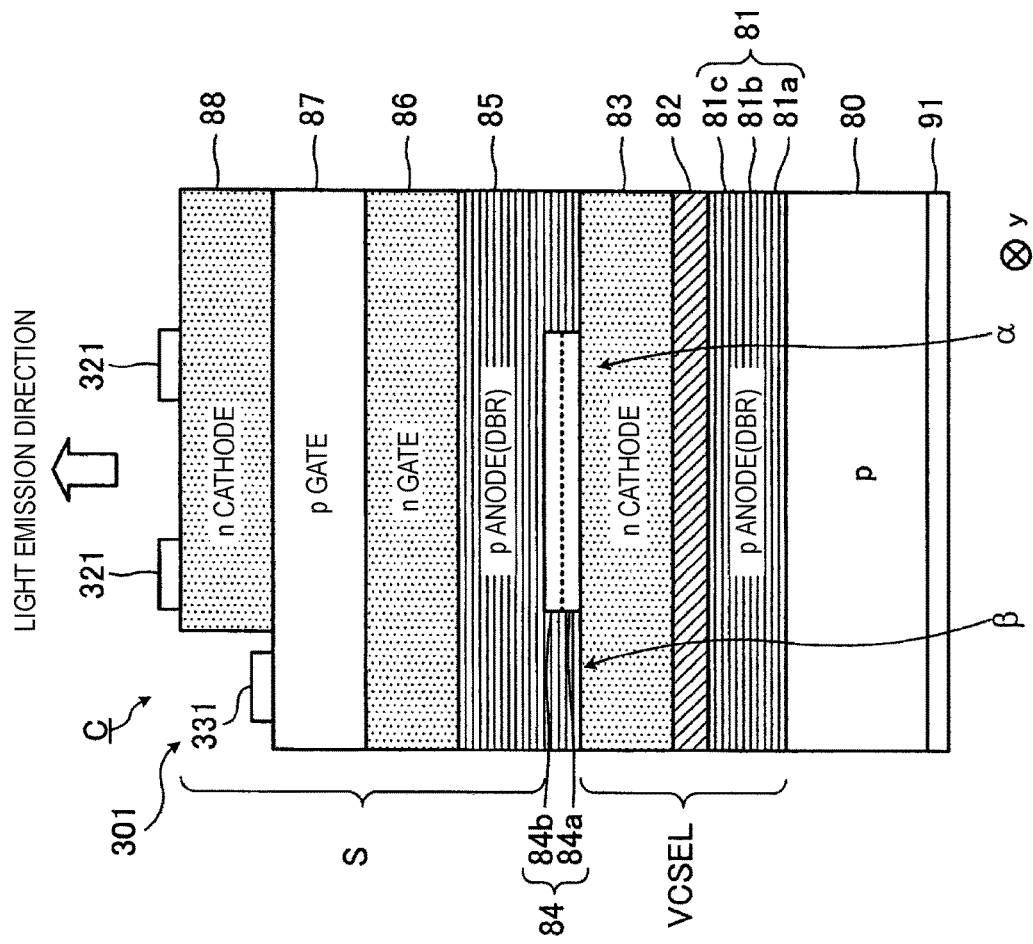
FIG. 27 An enlarged sectional view of an island in which a vertical cavity surface emitting laser and a setting thyristor are laminated on each other, in order to explain a modification 3-2.

FIG. 27 is an enlarged sectional view of an island 301 in which a vertical cavity surface emitting laser VCSEL and a setting thyristor S are laminated on each other, in order to explain a modification 3-2.

A basic configuration of the modification 3-2 is the same as that of the modification 1-2 of the light emitting chip C according to the first exemplary embodiment shown in FIG. 18, except that a p anode layer 81 and a p anode layer 85 are formed as DBR layers. The remaining configuration is the same as that of the modification 1-2. Accordingly, description about the remaining configuration will be omitted.

The vertical cavity surface emitting laser VCSEL resonates light to oscillate laser light in the two DBR layers (the p anode (DBR) layer 81 and the p anode (DBR) layer 85) between which a light emitting layer 82 and an n cathode layer 83 are interposed.

In addition, a current narrowing layer 81$b$ is not used in the modification 3-2. Accordingly, the modification 3-2 is easily applied to a semiconductor material on a substrate of InP, GaN, sapphire, etc. to which steam oxidation is difficult to be applied.

Incidentally, a tunnel junction layer 84 is used for current narrowing. Accordingly, consumption of electric power for non-radiative recombination can be suppressed so that reduction in power consumption and an improvement in light extraction efficiency can be attained.

In addition, a metallic electrically conductive group III-V compound layer may be used in place of the tunnel junction layer 84. Further, a voltage reducing layer 89 may be provided in the thyristor (the setting thyristor S or a transfer thyristor T).

Incidentally, in some cases, light emitted from the light emitting diode LED may be absorbed by the tunnel junction layer 84, the metallic electrically conductive group III-V compound layer, the voltage reducing layer 89, etc. to thereby lower the quantity of the emitted light. Even in this case, the light emitting chip C can be used in an application in which the light quantity is allowed to be small.

Fourth Exemplary Embodiment

In the first to third exemplary embodiments, the transfer thyristors T are formed on the lower diodes UD, and the lower diodes UD and the transfer thyristors T are connected in series. Therefore, the potential of "L" for the first transfer signal ϕ1 and the second transfer signal ϕ2 supplied to the transfer thyristors T is applied to the lower diodes UD and the transfer thyristors T which are connected in series. For this reason, the potential is, for example, "L" (−5 V).

A fourth exemplary embodiment has a configuration in which transfer thyristors T are not connected in series with lower diodes UD. Thus, a potential of "L" for a first transfer signal ϕ1 and a second transfer signal ϕ2 supplied to the transfer thyristors T may be lower and applied to anodes and cathodes of the transfer thyristors T. The potential may be, for example, "L" (−3.3 V).

Incidentally, the fourth exemplary embodiment is the same as the first exemplary embodiment except the structure of each of light emitting chips C. Accordingly, description about the same portions will be omitted and the different portion will be described.

Figure 28:
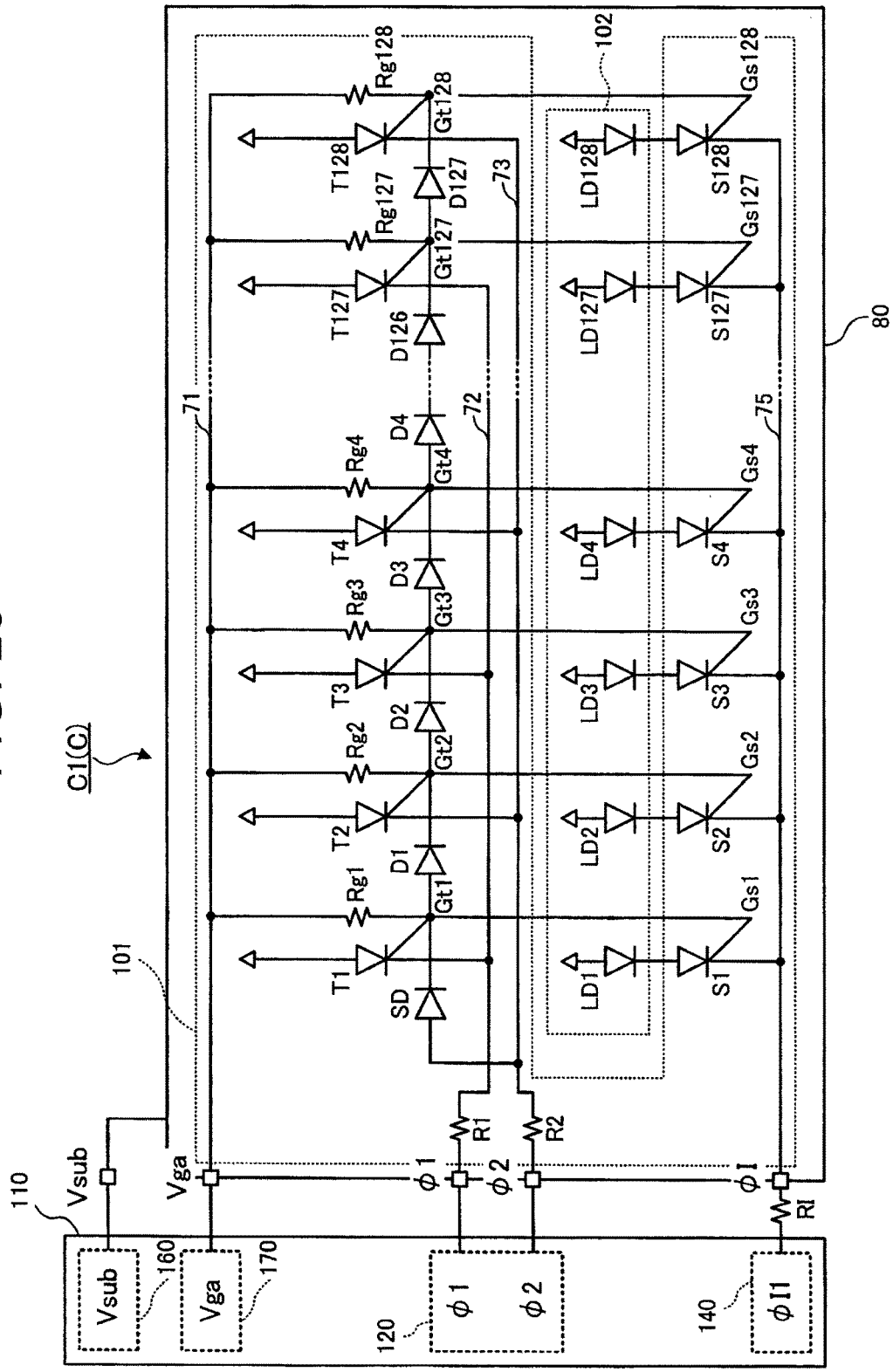
FIG. 28 An equivalent circuit diagram for explaining a circuit configuration of a light emitting chip on which a self-scanning light emitting device (SLED) according to a fourth exemplary embodiment is mounted.

FIG. 28 is an equivalent circuit diagram for explaining a circuit configuration of the light emitting chip C on which a self-scanning light emitting device (SLED) according to the fourth exemplary embodiment is mounted.

A light emitting chip C1 (C) is provided with a light emitting portion 102 (see FIG. 4A) constituted by laser diodes LD1 to LD128. In addition, the light emitting chip C1 (C) is provided with a driving portion 101 constituted by setting thyristors Si to S128, transfer thyristors T1 to T128, junction diodes D1 to D127, power supply line resistors R1 to R128, a start diode SD, and current limiting resistors R1 and R2.

That is, the light emitting chip C according to the fourth exemplary embodiment is not provided with lower diodes UD1 to UD128 that are provided in the light emitting chip C according to the first exemplary embodiment shown in FIG. 5.

Figure 29:
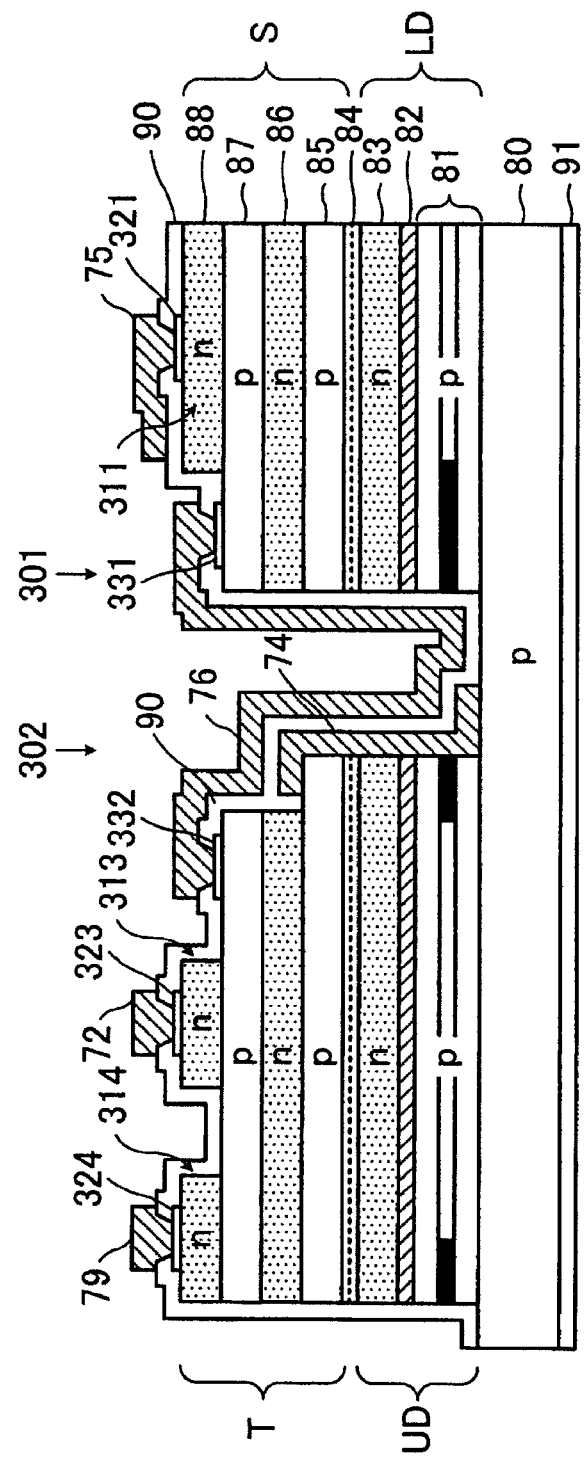
FIG. 29 A sectional view of islands of the light emitting chip according to the fourth exemplary embodiment.

FIG. 29 is a sectional view of islands 301 and 302 of the light emitting chip C according to the fourth exemplary embodiment.

A planar layout of the light emitting chip C according to the fourth exemplary embodiment is the same as the planar layout of the light emitting chip C according to the first exemplary embodiment shown in FIG. 6A. Therefore, description thereof will be omitted.

The sectional view of the islands 301 and 302 of the light emitting chip C according to the fourth exemplary embodiment shown in FIG. 29 shows a section taken along a line VIB-VIB of FIG. 6A. The sectional view of the islands 301 and 302 is a view seen from an opposite side to FIG. 6B, in the same manner as FIG. 10A to 12I. The sectional view shown in FIG. 29 corresponds to the sectional view of the light emitting chip C shown in FIG. 12I according to the first exemplary embodiment.

In the light emitting chip C according to the fourth exemplary embodiment, as shown in FIG. 29, a p anode layer 85 of a transfer thyristor T and a p-type substrate 80 are connected to each other through a connection wiring 74 at the island 302. The connection wiring 74 is made of Au containing Zn (AuZn) etc. which can easily make ohmic contact with a p-type semiconductor layer.

Thus, the p anode layer 85 of the transfer thyristor T is set at a reference potential Vsub ("H" (0 V)) supplied to a back electrode 91 of the substrate 80.

A lower diode UD provided below the transfer thyristor T is short-circuited at side surfaces of a p anode layer 81, a light emitting layer 82, and an n cathode layer 83 due to the connection wiring 74. Thus, the lower diode UD is present but does not function. Incidentally, side surfaces of the island 302 may be entirely covered with a protective layer 90.

Figure 30:
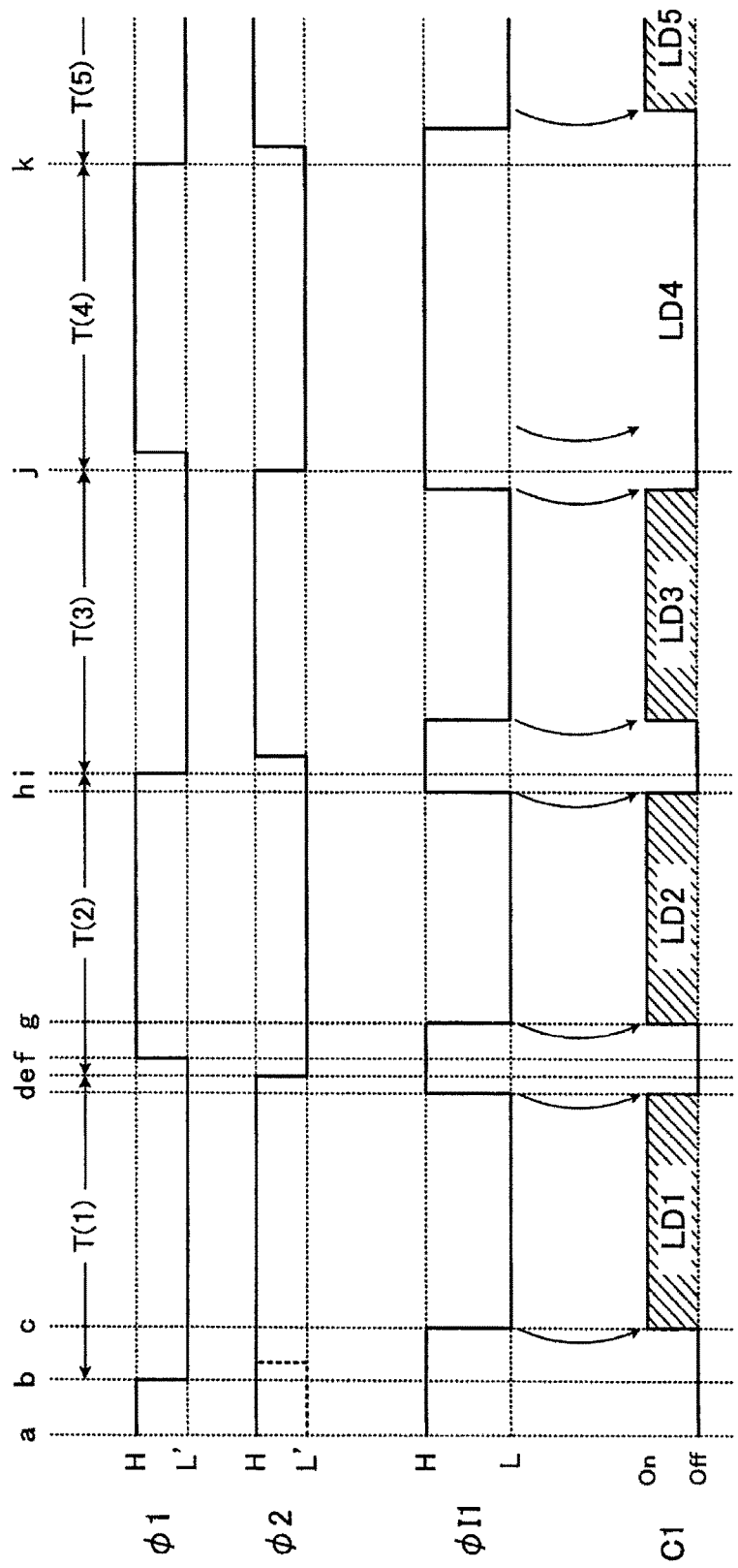
FIG. 30 A timing chart for explaining operation of the light emitting chip according to the fourth exemplary embodiment.

FIG. 30 is a timing chart for explaining operation of the light emitting chip C according to the fourth exemplary embodiment.

"L" for the first transfer signal φ1 and the second transfer signal φ2 in the timing chart for explaining the operation of the light emitting chip C according to the first exemplary embodiment shown in FIG. 9 is changed to "L'". As described above, the first transfer signal φ1 and the second transfer signal φ2 are applied between the anodes and the cathodes of the transfer thyristors T. Accordingly, a voltage whose absolute value is smaller than that for the first transfer signal φ1 and the second transfer signal φ2 of the light emitting chip C according to the first exemplary embodiment may be used. That is, a voltage (which is set at 1.7 V here) to be applied to the lower diodes UD is unnecessary. In this example, the voltage is "L" (−3.3 V). Incidentally, in order to operate the light emitting chip C, "L" (−5 V) for the first transfer signal φ1 and the second transfer signal φ2 may be replaced by "L" (−3.3 V), while operations of the lower diodes UD is ignored.

The voltage for the first transfer signal φ1 and the second transfer signal φ2 for operating can be reduced so that power consumption can be reduced.

The configuration of the light emitting chip C according to the fourth exemplary embodiment may be applied to any of the light emitting chips C according to the first to third exemplary embodiments.

In the first to fourth exemplary embodiments, the laser diode LD, the light emitting diode LED and the vertical cavity surface emitting laser VCSEL have been described as the light emitting elements. For example, any other light emitting element such as a laser transistor may be used.

The self-scanning light emitting device SLED in each of the first to fourth exemplary embodiments is provided with the light emitting portion 102 and the driving portion 101. The light emitting portion 102 is provided with the light emitting elements (the laser diodes LD, the light emitting diodes LED or the vertical cavity surface emitting lasers VCSEL). The driving portion 101 is provided with the setting thyristors S, the lower diodes UD, the transfer diodes T, etc. In the driving portion 101, control thyristors etc. may be provided between the setting thyristors S and the transfer thyristors T etc. Further, other members such as diodes, resistors, etc. may be included.

Although adjacent ones of the transfer diodes T are connected to each other through a corresponding one of the junction diodes D, the adjacent ones of the transfer diodes T may be connected to each other through a corresponding one of members such as resistors which can transmit a change in potential.

In addition, the light emitting elements (the laser diodes LD, the light emitting diodes LED or the vertical cavity surface emitting lasers VCSEL) and the setting thyristors S may not be used but the lower diodes UD may be used as the light emitting elements (the laser diodes LD, the light emitting diodes LED or the vertical cavity surface emitting lasers VCSEL) so that a lighting signal φ1 can be superimposed on the first transfer signal φ1 and the second transfer signal φ2 supplied to the transfer thyristors T. With the configuration made thus, the number of elements to be used can be reduced and the size of the light emitting chip C can be reduced. In this case, the transfer thyristors T etc. except the light emitting elements constitute the driving portion 101.

In the first to fourth exemplary embodiments, the electrically conductive types of the light emitting elements (the laser diodes LD, the light emitting diodes LED, or the vertical cavity surface emitting lasers VCSEL), the setting thyristors S, the lower diodes UD and the transfer thyristors T may be reversed while the polarities in the circuit are changed. That is, the anode common configuration may be changed to a cathode common configuration while the cathode common configuration is changed to an anode common configuration.

Incidentally, in order to suppress light emission delay or relaxation oscillation when each of the light emitting elements (the laser diodes LD, the light emitting diodes LED, or the vertical cavity surface emitting lasers VCSEL) turns ON, a fine current not lower than a threshold current may be injected into the light emitting element in advance so that the light emitting element may be brought into a slight light emission state or a slight oscillation state in advance. That is, a configuration may be made in such a manner that each of the light emitting elements is made to emit light slightly before each of the setting thyristors S turns ON, and the quantity of emitted light of the light emitting element is increased to a predetermined light quantity when the setting thyristor S turns ON. As such a configuration, for example, electrodes may be formed on anode layers of the light emitting elements (the laser diodes LD, the light emitting diodes LED or the vertical cavity surface emitting lasers VCSEL), a voltage supply or a current supply may be connected to the electrodes in advance, and a weak current may be injected into the light emitting elements from the voltage supply or the current supply.

In addition, any other structure than the pnpn four-layer structure may be used as the structure of each of the transfer thyristors T and the setting thyristors S as long as the structure has the function of the transfer thyristor T or the setting thyristor S in each of the exemplary embodiments. For example, a pinin structure, a pipin structure, an npip structure, or a pnin structure having a thyristor characteristic may be used. In this case, one of an i layer, an n layer and an i layer interposed between p and n of the pinin structure, or one of an n layer and an i layer interposed between p and n of the the pnin structure may serve as a gate layer, and an n ohmic electrode provided on the gate layer may serve as a terminal of the gate Gt (gate Gs). Alternatively, one of an i layer, a p layer and an i layer interposed between n and p of the npip structure, or one of a p layer and an i layer interposed between n and p of the npip structure may serve as a gate layer, and a p ohmic electrode 332 provided on the gate layer may serve as a terminal of the gate Gt (gate Gs).

Further, the semiconductor structure in which the semiconductor layers constituting the thyristor and the semiconductor layers constituting the light emitting element are laminated through the semiconductor layer forming the tunnel junction can be also used for another application than the self-scanning light emitting device (SLED). For example, the semiconductor structure can be used as a single light emitting component that is constituted by one light emitting element (one laser diode LD, one light emitting diode LED, one vertical cavity surface emitting laser VCSEL, etc.) and a setting thyristor S laminated on the light emitting element and that is lit in accordance with an electrical signal, an optical signal etc. inputted from the outside. In this case, the light emitting element constitutes the light emitting portion 102, and the setting thyristor S constitutes the driving portion 101.

Description has been made above mainly using p-type GaAs as an example of the substrate 80. Examples of respective semiconductor layers (a semiconductor laminate formed by the step of forming the semiconductor laminate in FIG. 10A) in a case where other substrates are used will be described.

First, an example of the semiconductor laminate in a case where a GaN substrate is used will be described as follows.

A p anode layer 81 has a configuration in which a lower p anode layer 81a, a current narrowing layer 81b and an upper p anode layer 81c are laminated sequentially (see FIG. 10C).

The lower p anode layer 81a and the upper p anode layer 81c are, for example, made of p-type $Al_{0.9}GaN$ doped with an impurity concentration of $1\times10^{18}/cm^3$. The Al composition may be changed in a range of 0 to 1.

It is difficult to use an oxide narrowing layer as the current narrowing layer on the GaN substrate. Accordingly, the structures shown in FIG. 12I, FIG. 18, FIG. 20, FIG. 21, FIG. 25, etc. in each of which a tunnel junction, a ridge type structure or an embedded type structure is used as the current narrowing layer are preferable. Alternatively, it is also effective to use ion injection as a current narrowing method.

A light emitting layer 82 has a quantum well structure in which well (well) layers and barrier (barrier) layers are laminated alternately. Each of the well layers is, for example, GaN, InGaN, AlGaN, etc. Each of the barrier layers is AlGaN, GaN, etc. Incidentally, the light emitting layer 82 may be formed as a quantum line (quantum wire) or a quantum box (quantum dot).

An n cathode layer 83 is, for example, made of n-type $Al_{0.9}GaN$ doped with an impurity concentration of $1\times10^{18}/cm^3$. The Al composition may be changed in a range of 0 to 1.

A tunnel junction layer 84 is constituted by a junction between an $n^{++}$ layer 84a doped with a high concentration of n-type impurities, and a $p^{++}$ layer 84b doped with a high concentration of n-type impurities (see FIG. 10B). Each of the $n^{++}$ layer 84a and the $p^{++}$ layer 84b has, for example, an impurity concentration as high as $1\times10^{20}/cm^3$. Incidentally, an impurity concentration of an ordinary junction ranges from the order of $10^{17}/cm^3$ to the order of $10^{18}/cm^3$. Combinations of the $n^{++}$ layer 84a and the $p^{++}$ layer 84b (hereinafter denoted as $n^{++}$ layer 84a/$p^{++}$ layer 84b) are, for example, made of $n^{++}$GaN/$p^{++}$GaN, $n^{++}$GaInN/$p^{++}$GaInN, and $n^{++}$AlGaN/$p^{++}$AlGaN. Incidentally, the combinations may be changed from one to another.

A p anode layer 85 is, for example, made of p-type $Al_{0.9}GaN$ doped with an impurity concentration of $1\times10^{18}/cm^3$. The Al composition may be changed in a range of 0 to 1.

An n gate layer 86 is, for example, made of n-type $Al_{0.9}GaN$ doped with an impurity concentration of $1\times10^{17}/cm^3$. The Al composition may be changed in a range of 0 to 1.

A p gate layer 87 is, for example, made of p-type $Al_{0.9}GaN$ doped with an impurity concentration of $1\times10^{17}/cm^3$. The Al composition may be changed in a range of 0 to 1.

An n cathode layer 88 is, for example, made of n-type $Al_{0.9}GaN$ doped with an impurity concentration of $1\times10^{18}/cm^3$. The Al composition may be changed in a range of 0 to 1.

Next, an example of the semiconductor laminate in a case where an InP substrate is used will be described as follows.

A p anode layer 81 has a configuration in which a lower p anode layer 81a, a current narrowing layer 81b and an upper p anode layer 81c are laminated sequentially (see FIG. 10C).

The lower p anode layer 81a and the upper p anode layer 81c are, for example, made of p-type InGaAsP doped with an impurity concentration of $1\times10^{18}/cm^3$. The Ga composition or the Al composition may be changed in a range of 0 to 1.

It is difficult to use an oxide narrowing layer as the current narrowing layer on the InP substrate. Accordingly, the structures shown in FIG. 12I, FIG. 18, FIG. 20, FIG. 21, FIG. 25, etc. in each of which a tunnel junction, a ridge type structure or an embedded type structure is used as the current narrowing layer are preferable. Alternatively, it is also effective to use ion injection as a current narrowing method.

A light emitting layer 82 has a quantum well structure in which well (well) layers and barrier (barrier) layers are laminated alternately. Each of the well layers is, for example, InAs, InGaAsP, AlGaInAs, GaInAsPSb, etc. Each of the barrier layers is InP, InAsP, InGaAsP, AlGaInAsP, etc.

Incidentally, the light emitting layer 82 may be formed as a quantum line (quantum wire) or a quantum box (quantum dot).

An n cathode (clad) layer 83 is, for example, made of n-type InGaAsP doped with an impurity concentration of $1 \times 10^{18}/cm^3$. The Ga composition or the Al composition may be changed in a range of 0 to 1.

A tunnel junction layer 84 is constituted by a junction between an $n^{++}$ layer 84a doped with a high concentration of n-type impurities, and a $p^{++}$ layer 84b doped with a high concentration of n-type impurities (see FIG. 10B). Each of the $n^{++}$ layer 84a and the $p^{++}$ layer 84b has, for example, an impurity concentration as high as $1 \times 10^{20}/cm^3$. Incidentally, an impurity concentration of an ordinary junction ranges from the order of $10^{17}/cm^3$ to the order of $10^{18}/cm^3$. Combinations of the $n^{++}$ layer 84a and the $p^{++}$ layer 84b (hereinafter denoted as $n^{++}$ layer 84a/$p^{++}$ layer 84b) are, for example, made of $n^{++}$InP/$p^{++}$InP, $n^{++}$InAsP/$p^{++}$InAsP, $n^{++}$InGaAsP/$p^{++}$InGaAsP, and $n^{++}$ InGaAsPSb/$p^{++}$InGaAsPSb. Incidentally, the combinations may be changed from one to another.

A p anode layer 85 is, for example, made of p-type InGaAsP doped with an impurity concentration of $1 \times 10^{18}/cm^3$. The Ga composition or the Al composition may be changed in a range of 0 to 1.

An n gate layer 86 is, for example, made of n-type InGaAsP doped with an impurity concentration of $1 \times 10^{17}/cm^3$. The Ga composition or the Al composition may be changed in a range of 0 to 1.

A p gate layer 87 is, for example, made of p-type InGaAsP doped with an impurity concentration of $1 \times 10^{17}/cm^3$. The Ga composition or the Al composition may be changed in a range of 0 to 1.

An n cathode layer 88 is, for example, made of n-type InGaAsP doped with an impurity concentration of $1 \times 10^{18}/cm^3$. The Ga composition or the Al composition may be changed in a range of 0 to 1.

These semiconductor layers are laminated, for example, by metal organic chemical vapor deposition (MOCVD), molecular beam epitaxy (MBE), etc. so that the semiconductor laminate is formed.

In addition, the aforementioned exemplary embodiments may be applied to the p-type, the n-type or the i-type made of an organic material.

Further, each of the exemplary embodiments may be used in combination with another exemplary embodiment.

Although the present invention has been described in detail with reference to specific exemplary embodiments, it is obvious to those skilled in the art that the present invention can be changed or modified variously without departing from the spirit and scope of the present invention.

The present application is based on a Japanese patent application (Patent Application No. 2016-129757) which was filed on Jun. 30, 2016, and the contents of which are incorporated herein by reference.

REFERENCE SIGNS LIST

1 . . . image forming apparatus, 10 . . . image forming process portion, 11 . . . image forming unit, 12 . . . photosensitive drum, 14 . . . print head, 30 . . . image output control portion, 40 . . . image processing portion, 62 . . . circuit substrate, 63 . . . light source portion, 64 . . . rod lens array, 65 . . . light emitting device, 80 . . . substrate, 81 . . . p anode layer, p anode (clad) layer, p anode (DBR) layer, 81b, 85b . . . current narrowing layer, 82 . . . light emitting layer, 83 . . . n cathode layer, n cathode (clad) layer, n cathode (DBR) layer, 84 . . . tunnel junction layer, 84a . . . $n^{++}$ layer, 84b . . . $p^{++}$ layer, 85 . . . p anode layer, 86 . . . n gate layer, 87 . . . p gate layer, 88 . . . n cathode layer, 89 . . . voltage reducing layer, 90 . . . protective layer, 91 . . . back electrode, 100 . . . transfer substrate, 101 . . . driving portion, 102 . . . light emitting portion, 110 . . . signal generating circuit, 120 . . . transfer signal generating portion, 140 . . . lighting signal generating portion, 160 . . . reference potential supplying portion, 170 . . . power supply potential supplying portion, 301 to 306 . . . island, φ1 . . . first transfer signal, φ2 . . . second transfer signal, φI (φI1 to φI40) . . . lighting signal, a . . . current passing portion (region), n . . . current blocking portion (region), C (C1 to C40) . . . light emitting chip, D (D1 to D127) . . . junction diode, LED (LED1 to LED128) . . . light emitting diode, LD (LD1 to LD128) . . . laser diode, SD . . . start diode, T (T1 to T128) . . . transfer thyristor, VCSEL (VCSEL1 to VCSEL128) . . . vertical cavity surface emitting laser, Vga . . . power supply potential, Vsub . . . reference potential

The invention claimed is:

1. A light emitting component comprising:
   a first semiconductor laminate part that comprises light emitting elements;
   a tunnel junction layer or a metallic electrically conductive group III-V compound layer that is provided on the first semiconductor laminate part; and
   a second semiconductor laminate part that is provided on the tunnel junction layer or the group III-V compound layer, and that comprises a driving portion comprising thyristors and driving the light emitting elements to make the light emitting elements be able to shift to an ON state sequentially, wherein
   the second semiconductor laminate part further comprises a voltage reducing layer whose band gap energy is smaller than band gap energy of a semiconductor layer constituting the first semiconductor laminate part.

2. The light emitting component according to claim 1, wherein:
   each of current paths of the light emitting elements is narrowed.

3. A print head comprising:
   the light emitting component according to claim 1; and
   an optical portion that forms an image of light emitted from the light emitting component.

4. An image forming apparatus comprising:
   an image carrier;
   a charging portion that charges the image carrier with electricity;
   the light emitting component according to claim 1;
   an optical portion that forms an image of light emitted from the light emitting component;
   a light exposing portion that exposes the image carrier to light through the optical portion;
   a developing portion that develops an electrostatic latent image formed on the image carrier exposed to the light by the light exposing portion; and
   a transfer portion that transfers the image developed on the image carrier onto a subject to be transferred.

5. A light emitting component comprising:
   a first semiconductor laminate part that comprises a light emitting element;
   a tunnel junction layer or a metallic electrically conductive group III-V compound layer that is provided on the first semiconductor laminate part; and
   a second semiconductor laminate part that is provided on the tunnel junction layer or the group III-V compound layer and that comprises a thyristor, wherein the second semiconductor laminate part further comprises a voltage reducing layer whose band gap energy is smaller than band gap energy of a semiconductor layer constituting the first semiconductor laminate part.

6. The light emitting component according to claim 5, wherein:
a current path of the light emitting element is narrowed.

7. A semiconductor laminate substrate comprising:
a substrate;
a first semiconductor laminate part that is provided on the substrate and is to be processed into a light emitting element;
a tunnel junction layer or a metallic electrically conductive group III-V compound layer that is provided on the first semiconductor laminate part; and
a second semiconductor laminate part that is provided on the tunnel junction layer or the metallic electrically conductive group III-V compound layer and is to be processed into a driving portion, the driving portion comprising a thyristor and driving the light emitting portion, wherein
the second semiconductor laminate part further comprises a voltage reducing layer whose band gap energy is smaller than band gap energy of a semiconductor layer constituting the first semiconductor laminate part.

8. The light emitting component according to claim 1, wherein:
the band gap energy of the voltage reducing layer is smaller than a band gap energy of a light emitting layer constituting the light emitting elements.

9. The light emitting component according to claim 5, wherein:
the band gap energy of the voltage reducing layer is smaller than a band gap energy of a light emitting layer constituting the light emitting element.

10. The semiconductor laminate substrate according to claim 7, wherein:
the band gap energy of the voltage reducing layer is smaller than a band gap energy of a light emitting layer constituting the light emitting element.

* * * * *